US012635331B2

(12) United States Patent
Koch et al.

(10) Patent No.: US 12,635,331 B2
(45) Date of Patent: May 19, 2026

(54) ORGANIC ELECTROLUMINESCENT DEVICE EMITTING LIGHT

(71) Applicant: SAMSUNG DISPLAY CO., LTD., Yongin-si (KR)

(72) Inventors: Federico Koch, Heidelberg (DE); Christian Kasparek, Heidelberg (DE)

(73) Assignee: Samsung Display Co., Ltd., Yongin-si (KR)

(*) Notice: Subject to any disclaimer, the term of this patent is extended or adjusted under 35 U.S.C. 154(b) by 1072 days.

(21) Appl. No.: 17/766,881

(22) PCT Filed: Oct. 13, 2020

(86) PCT No.: PCT/EP2020/078679
§ 371 (c)(1),
(2) Date: Apr. 6, 2022

(87) PCT Pub. No.: WO2021/074096
PCT Pub. Date: Apr. 22, 2021

(65) Prior Publication Data

US 2023/0115932 A1 Apr. 13, 2023

(30) Foreign Application Priority Data

Oct. 14, 2019 (EP) ..................................... 19203056
Dec. 20, 2019 (EP) ..................................... 19218745

(51) Int. Cl.

| | |
|---|---|
| ***H10K 50/12*** | (2023.01) |
| ***C09K 11/06*** | (2006.01) |
| ***H10K 50/11*** | (2023.01) |
| ***H10K 50/135*** | (2023.01) |
| ***H10K 50/30*** | (2023.01) |
| ***H10K 85/60*** | (2023.01) |
| ***H10K 101/10*** | (2023.01) |
| ***H10K 101/20*** | (2023.01) |
| ***H10K 101/30*** | (2023.01) |
| ***H10K 102/00*** | (2023.01) |

(52) U.S. Cl.
CPC ............ *H10K 50/121* (2023.02); *C09K 11/06* (2013.01); *H10K 85/654* (2023.02); *H10K 85/6572* (2023.02); *H10K 85/658* (2023.02); *C09K 2211/1014* (2013.01); *C09K 2211/1018* (2013.01); *C09K 2211/1022* (2013.01); *H10K 50/11* (2023.02); *H10K 50/135* (2023.02); *H10K 50/30* (2023.02); *H10K 2101/10* (2023.02); *H10K 2101/20* (2023.02); *H10K 2101/30* (2023.02); *H10K 2102/351* (2023.02)

(58) Field of Classification Search
CPC ............... H10K 50/121; H10K 85/322; H10K 85/658; H10K 2101/20; H10K 2101/30; C09K 2211/1014; C09K 2211/1022
See application file for complete search history.

(56) References Cited

U.S. PATENT DOCUMENTS

| | | | |
|---|---|---|---|
| 2015/0236274 | A1 | 8/2015 | Hatakeyama |
| 2016/0093813 | A1 | 3/2016 | Stoessel et al. |
| 2016/0093823 | A1 | 3/2016 | Seo |
| 2018/0323394 | A1 | 11/2018 | Haldi et al. |
| 2019/0157570 | A1 | 5/2019 | Sim et al. |

FOREIGN PATENT DOCUMENTS

| | | | |
|---|---|---|---|
| CN | 105102582 | A | 11/2015 |
| CN | 109651405 | A | 4/2019 |
| EP | 2 958 158 | A1 | 12/2015 |
| EP | 3 144 997 | A1 | 3/2017 |
| EP | 3 399 566 | A1 | 11/2018 |
| EP | 3 421 461 | A1 | 2/2019 |
| EP | 3 490 023 | A1 | 5/2019 |
| KR | 10-2018-0109193 | A | 10/2018 |
| KR | 10-2019-0059224 | A | 5/2019 |
| WO | 20150135624 | A1 | 9/2015 |
| WO | 2017005699 | A1 | 1/2017 |
| WO | 2019052939 | A1 | 3/2019 |
| WO | WO 2019/151204 | A1 | 8/2019 |

OTHER PUBLICATIONS

Hatakeyama et al., Ultrapure Blue Thermally Activated Delayed Fluorescence Molecules: Efficient HOMO-LUMO Separation by the Multiple Resonance Effect, Advanced Materials, vol. 28, No. 14, Apr. 1, 2016.
Okinaka et al., "New Fluorescent Blue Host Materials for Achieving Low Voltage in OLEDs", Invited Paper, 22, 1, SID 2015 Digest, pp. 312-315.
Chinese Office Action for CN Application 202080081410.7, dated Feb. 19, 2025, 8 pages.
Korean Notice of Allowance for KR Application No. 10-2022-7015857, dated Apr. 9, 2025, 3 pages.
International Preliminary Report on Patentability in International Application No. PCT/EP2020/078679, dated Apr. 19, 2022.

*Primary Examiner* — Jenna N Chandhok
(74) *Attorney, Agent, or Firm* — Womble Bond Dickinson (US) LLP

(57) ABSTRACT

The invention relates to a an organic electroluminescent device comprising a light-emitting layer B comprising a host material $H^B$, a first thermally activated delayed fluorescence (TADF) material EB, and an emitter material $S^B$.

15 Claims, No Drawings

ORGANIC ELECTROLUMINESCENT DEVICE EMITTING LIGHT

The present invention relates to organic electroluminescent devices comprising a light-emitting layer B comprising a host material $H^B$, a first thermally activated delayed fluorescence (TADF) material $E^B$, and an emitter material $S^B$.

DESCRIPTION

Organic electroluminescent devices containing one or more light-emitting layers based on organics such as, e.g., organic light emitting diodes (OLEDs), light emitting electrochemical cells (LECs) and light-emitting transistors gain increasing importance. In particular, OLEDs are promising devices for electronic products such as e.g. screens, displays and illumination devices. In contrast to most electroluminescent devices essentially based on inorganics, organic electroluminescent devices based on organics are often rather flexible and producible in particularly thin layers. The OLED-based screens and displays already available today bear particularly beneficial brilliant colors, contrasts and are comparably efficient with respect to their energy consumption.

A central element of an organic electroluminescent device for generating light is a light-emitting layer placed between an anode and a cathode. When a voltage (and current) is applied to an organic electroluminescent device, holes and electrons are injected from an anode and a cathode, respectively, to the light-emitting layer. Typically, a hole transport layer is located between light-emitting layer and the anode, and an electron transport layer is located between light-emitting layer and the cathode. The different layers are sequentially disposed. Excitons of high energy are then generated by recombination of the holes and the electrons. The decay of such excited states (e.g., singlet states such as S1 and/or triplet states such as T1) to the ground state (S0) desirably leads to light emission.

In order to enable efficient energy transport and emission, an organic electroluminescent device comprises one or more host compounds and one or more emitter compounds as dopants.

Challenges when generating organic electroluminescent devices are thus the improvement of the illumination level of the devices (i.e., brightness per current), obtaining a desired light spectrum and achieving suitable (long) lifespans.

There is still a lack of efficient and stable OLEDs that emit in the visible light spectrum. Accordingly, there is still the unmet technical need for organic electroluminescent devices which have a long lifetime and high quantum yields.

Surprisingly, it has been found that an organic electroluminescent device's light-emitting layer comprising one thermally activated delayed fluorescence (TADF) material, an emitter material and a host material provides an organic electroluminescent device having good lifetime and quantum yields and exhibiting emission in the visible.

Accordingly, one aspect of the present invention relates to an organic electroluminescent device which comprises a light-emitting layer B comprising:

(i) a host material $H^B$, which has a lowermost excited singlet state energy level $S1^H$, a lowermost excited triplet state energy level $T1^H$, and a highest occupied molecular orbital HOMO($H^B$) having an energy $E^{HOMO}(H^B)$;

(ii) a first thermally activated delayed fluorescence (TADF) material $E^B$, which has a lowermost excited singlet state energy level $S1^E$, a lowermost excited triplet state energy level $T1^E$, and a highest occupied molecular orbital HOMO($E^B$) having an energy $E^{HOMO}(E^B)$; and (iii) an emitter material $S^B$, which has a lowermost excited singlet state energy level $S1^S$ and a highest occupied molecular orbital HOMO($S^B$) having an energy $E^{HOMO}(S^B)$;

wherein the relations expressed by the following formulas (1) to (5) apply:

$$S1^H > S1^E \quad (1)$$

$$S1^H > S1^S \quad (2)$$

$$S1^E > S1^S \quad (3)$$

$$E^{HOMO}(E^B) > E^{HOMO}(S^B) \quad (4)$$

$$E^{HOMO}(E^B) > E^{HOMO}(H^B) \quad (5).$$

According to the invention, the lowermost excited singlet state of the host material $H^B$ is higher in energy than the lowermost excited singlet state of the first thermally activated delayed fluorescence (TADF) material $E^B$.

The lowermost excited singlet state of the host material $H^B$ is higher in energy than the lowermost excited singlet state of the emitter material $S^B$. The lowermost excited singlet state of the first TADF material $E^B$ is higher in energy than the lowermost excited singlet state of the emitter material $S^B$.

In one embodiment of the invention, the relations expressed by formulas (3a) applies:

$$S1^E - S1^S \leq 0.4 \text{ eV} \quad (3a).$$

In one embodiment of the invention, the relations expressed by formulas (3a) applies:

$$S1^E - S1^S 0.3 \text{ eV} \quad (3b).$$

In one embodiment of the invention, the relations expressed by formulas (3a) applies:

$$S1^E - S1^S 0.2 \text{ eV} \quad (3c).$$

In one embodiment of the invention, the relations expressed by one of the following formulas (6) and (7) applies:

$$0.2 \text{ eV} \leq E^{HOMO}(E^B) - E^{HOMO}(S^B) \leq 0.8 \text{ eV} \quad (6).$$

$$0.2 \text{ eV} \leq E^{HOMO}(E^B) - E^{HOMO}(H^B) \leq 0.8 \text{ eV} \quad (7).$$

In this embodiment, the highest occupied molecular orbital of the TADF material $E^B$ is higher in energy than the highest occupied molecular orbital of the emitter material $S^B$ by at least 0.2 eV and by 0.8 eV at the maximum, preferably by at least 0.3 eV and by 0.7 eV at the maximum, in particular by at least 0.4 eV and by 0.6 eV at the maximum.

In an alternative embodiment of the invention, the highest occupied molecular orbital of the TADF material $E^B$ is higher in energy than the highest occupied molecular orbital of the host material $H^B$ by at least 0.2 eV and by 0.8 eV at the maximum, preferably by at least 0.3 eV and by 0.7 eV at the maximum, in particular by at least 0.4 eV and by 0.6 eV at the maximum.

As used herein, the terms "TADF material" and "TADF emitter" may be understood interchangeably. When one of the terms "emitter" "emitter compound" or the like is used, this may be understood in that preferably a TADF material of the present invention is meant, in particular one or those designated as $E^B$.

According to the present invention, a TADF material is characterized in that it exhibits a $\Delta E_{ST}$ value, which corresponds to the energy difference between the lowermost excited singlet state (S1) and the lowermost excited triplet state (T1), of less than 0.4 eV, preferably less than 0.3 eV, more preferably less than 0.2 eV.

Accordingly in an embodiment of the present invention, the TADF material $E^B$ is characterized in that it has a $\Delta E_{ST}$ value, which corresponds to the energy difference between $S1^E$ and $T1^E$, of less than 0.4 eV. In a preferred embodiment of the present invention, the TADF material $E^B$ is characterized in that it has a $\Delta E_{ST}$ value of less than 0.3 eV, less than 0.2 eV.

In one embodiment of the invention, the relations expressed by formula (8) applies:

$$S1^S > T1^E \quad (8),$$

wherein the lowermost excited singlet state energy level $S1^S$ is higher in energy than the lowermost excited triplet state energy level $T1^E$.

In a preferred embodiment, the lowermost excited triplet state of the host material $H^B$ ($T1^H$) is higher in energy than the lowermost excited triplet state of the TADF material $E^B$ ($T1^E$): $T1^H > T1^E$.

In a preferred embodiment, the lowermost excited triplet state of the host material $H^B$ ($T1^H$) is higher in energy than the lowermost excited triplet state of the emitter material $S^B$ ($T1^S$): $T1^H > T1^S$.

In one embodiment of the invention, mass ratio of TADF material $E^B$ to the emitter material $S^B$ ($S^B$:$B^B$) is >1. In one embodiment of the invention, the mass ratio $S^B$:$E^B$ is in the range of 1.5:1 to 30:1, in the range of 2:1 to 25:1, or in the range of 3:1 to 20:1. For example, the mass ratio $S^B$:$E^B$ is in the range of (approximately) 15:1, 12:1, 10:1 or 8:1.

As used herein, the terms organic electroluminescent device and opto-electronic light-emitting devices may be understood in the broadest sense as any device comprising a light-emitting layer B comprising a host material $H^B$, a TADF material $E^B$ and an emitter material $S^B$.

It will be understood that the light-emitting layer B may also comprise more than one TADF materials $E^B$ and/or more than one emitter material $S^B$ each having the properties as described herein. According to the present invention, the light-emitting layer B comprises at least one TADF material $E^B$ and at least one emitter material $S^B$ each having the properties as described herein. According to one embodiment of the present invention, the light-emitting layer B comprises one TADF material $E^B$ and one emitter material $S^B$ each having the properties as described herein.

As used herein, the terms organic electroluminescent device and opto-electronic light-emitting devices may be understood in the broadest sense as any device comprising a light-emitting layer B comprising a host material $H^B$, a TADF material $E^B$ and an emitter material $S^B$.

The organic electroluminescent device may be understood in the broadest sense as any device based on organic materials that is suitable for emitting light in the visible or nearest ultraviolet (UV) range, i.e., in the range of a wavelength of from 380 to 800 nm. More preferably, organic electroluminescent device may be able to emit light in the visible range, i.e., of from 400 to 800 nm.

In a preferred embodiment, the organic electroluminescent device is a device selected from the group consisting of an organic light emitting diode (OLED), a light emitting electrochemical cell (LEC), and a light-emitting transistor.

Particularly preferably, the organic electroluminescent device is an organic light emitting diode (OLED). Optionally, the organic electroluminescent device as a whole may be intransparent, semi-transparent or (essentially) transparent.

The term "layer" as used in the context of the present invention preferably is a body that bears an extensively planar geometry.

The light-emitting layer B preferably bears a thickness of not more than 1 mm, more preferably not more than 0.1 mm, even more preferably not more than 10 μm, even more preferably not more than 1 μm, in particular not more than 0.1 μm.

The person skilled in the art will notice that the light-emitting layer B will typically be incorporated in the organic electroluminescent device of the present invention. Preferably, such organic electroluminescent device comprises at least the following layers: at least one light-emitting layer B, at least one anode layer A and at least one cathode layer C.

Preferably, the anode layer A contains at least one component selected from the group consisting of indium tin oxide, indium zinc oxide, PbO, SnO, graphite, doped silicium, doped germanium, doped GaAs, doped polyaniline, doped polypyrrole, doped polythiophene, and mixtures of two or more thereof.

Preferably, the cathode layer C contains at least one component selected from the group consisting of Al, Au, Ag, Pt, Cu, Zn, Ni, Fe, Pb, In, W, Pd, LiF, Ca, Ba, Mg, and mixtures or alloys of two or more thereof.

Preferably, the light-emitting layer B is located between an anode layer A and a cathode layer C. Accordingly, the general set-up is preferably A-B-C. This does of course not exclude the presence of one or more optional further layers. These can be present at each side of A, of B and/or of C.

In a preferred embodiment, the organic electroluminescent device comprises at least the following layers:

A) an anode layer A containing at least one component selected from the group consisting of indium tin oxide, indium zinc oxide, PbO, SnO, graphite, doped silicium, doped germanium, doped GaAs, doped polyaniline, doped polypyrrole, doped polythiophene, and mixtures of two or more thereof;

B) the light-emitting layer B; and

C) a cathode layer C containing at least one component selected from the group consisting of Al, Au, Ag, Pt, Cu, Zn, Ni, Fe, Pb, In, W, Pd, LiF, Ca, Ba, Mg, and mixtures or alloys of two or more thereof, wherein the light-emitting layer B is located between the anode layer A and the a cathode layer C.

In one embodiment, when the organic electroluminescent device is an OLED, it may optionally comprise the following layer structure:

A) an anode layer A, exemplarily comprising indium tin oxide (ITO); HTL) a hole transport layer HTL;

B) a light-emitting layer B according to present invention as described herein; ETL) an electron transport layer ETL; and C) a cathode layer, exemplarily comprising Al, Ca and/or Mg.

Preferably, the order of the layers herein is A-HTL-B-ETL-C.

Furthermore, the organic electroluminescent device may optionally comprise one or more protective layers protecting the device from damaging exposure to harmful species in the environment including, exemplarily moisture, vapor and/or gases.

Preferably, the anode layer A is located on the surface of a substrate. The substrate may be formed by any material or composition of materials. Most frequently, glass slides are used as substrates. Alternatively, thin metal layers (e.g., copper, gold, silver or aluminum films) or plastic films or slides may be used. This may allow a higher degree of flexibility. The anode layer A is mostly composed of materials allowing to obtain an (essentially) transparent film. As at least one of both electrodes should be (essentially) transparent in order to allow light emission from the OLED, either the anode layer A or the cathode layer C transparent. Preferably, the anode layer A comprises a large content or even consists of transparent conductive oxides (TCOs).

Such anode layer A may exemplarily comprise indium tin oxide, aluminum zinc oxide, fluor tin oxide, indium zinc oxide, PbO, SnO, zirconium oxide, molybdenum oxide, vanadium oxide, wolfram oxide, graphite, doped Si, doped Ge, doped GaAs, doped polyaniline, doped polypyrrol and/or doped polythiophene.

Particularly preferably, the anode layer A (essentially) consists of indium tin oxide (ITO) (e.g., $(InO_3)_{0.9}(SnO_2)_{0.1}$). The roughness of the anode layer A caused by the transparent conductive oxides (TCOs) may be compensated by using a hole injection layer (HIL). Further, the HIL may facilitate the injection of quasi charge carriers (i.e., holes) in that the transport of the quasi charge carriers from the TCO to the hole transport layer (HTL) is facilitated. The hole injection layer (HIL) may comprise poly-3,4-ethylendioxy thiophene (PEDOT), polystyrene sulfonate (PSS), $MoO_2$, $V_2O_5$, CuPC or CuI, in particular a mixture of PEDOT and PSS. The hole injection layer (HIL) may also prevent the diffusion of metals from the anode layer A into the hole transport layer (HTL). The HIL may exemplarily comprise PEDOT:PSS (poly-3,4-ethylendioxy thiophene: polystyrene sulfonate), PEDOT (poly-3,4-ethylendioxy thiophene), mMTDATA (4,4',4"-tris[phenyl(m-tolyl)amino]triphenylamine), Spiro-TAD (2,2',7,7'-tetrakis(n,n-diphenylamino)-9,9'-spirobifluorene), DNTPD (N1,N1'-(biphenyl-4,4'-diyl)bis(N1-phenyl-N4,N4-di-m-tolylbenzene-1,4-diamine), NPB (N,N'-nis-(1-naphthalenyl)-N,N'-bis-phenyl-(1,1'-biphenyl)-4,4'-diamine), NPNPB (N,N'-diphenyl-N,N'-di-[4-(N,N-diphenyl-amino)-phenyl]benzidine), MeO-TPD (N,N,N',N'-tetrakis(4-methoxyphenyl)-benzi-dine), HAT-CN (1,4,5,8,9,11-hexaazatriphenylen-hexacarbonitrile) and/or Spiro-NPD (N,N'-diphenyl-N,N'-bis-(1-naphthyl)-9,9'-spirobifluorene-2,7-diamine).

Adjacent to the anode layer A or hole injection layer (HIL) typically a hole transport layer (HTL) is located. Herein, any hole transport compound may be used. Exemplarily, electron-rich heteroaromatic compounds such as triarylamines and/or carbazoles may be used as hole transport compound. The HTL may decrease the energy barrier between the anode layer A and the light-emitting layer B (serving as emitting layer (EML)). The hole transport layer (HTL) may also be an electron blocking layer (EBL). Preferably, hole transport compounds bear comparably high energy levels of their triplet states T1. Exemplarily the hole transport layer (HTL) may comprise a star-shaped heterocycle such as tris(4-carbazoyl-9-ylphenyl)amine (TCTA), poly-TPD (poly(4-butylphenyl-diphenyl-amine)), [alpha]-NPD (poly(4-butylphenyl-diphenyl-amine)), TAPC (4,4'-cyclohexyliden-bis[N,N-bis(4-methylphenyl)benzenamine]), 2-TNATA (4,4',4"-tris[2-naphthyl(phenyl)-amino]triphenylamine), Spiro-TAD, DNTPD, NPB, NPNPB, MeO-TPD, HAT-CN and/or TrisPcz (9,9'-diphenyl-6-(9-phenyl-9H-carbazol-3-yl)-9H,9'H-3,3'-bicarbazole). In addition, the HTL may comprise a p-doped layer, which may be composed of an inorganic or organic dopant in an organic hole-transporting matrix. Transition metal oxides such as vanadium oxide, molybdenum oxide or tungsten oxide may exemplarily be used as inorganic dopant.

Tetrafluorotetracyanoquinodimethane (F4-TCNQ), copper-pentafluorobenzoate (Cu(I)pFBz) or transition metal complexes may exemplarily be used as organic dopant.

The EBL may exemplarily comprise mCP (1,3-bis(carbazol-9-yl)benzene), TCTA, 2-TNATA, mCBP (3,3-di(9H-carbazol-9-yl)biphenyl), 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole, 9-[3,5-bis(2-dibenzothiophenyl)phenyl]-9H-carbazole, tris-Pcz, CzSi (9-(4-tert-butylphenyl)-3,6-bis(triphenylsilyl)-9H-carbazole), and/or DCB (N,N'-dicarbazolyl-1,4-dimethylbenzene).

In one embodiment of the invention, the emitter material $S^B$ is selected from the group consisting of a fluorescence emitter and an organic TADF emitter, whereas the organic TADF emitter is characterized in that it has a $\Delta E_{ST}$ value, which corresponds to the energy difference between $S1^S$ and $T1^S$, of less than 0.4 eV.

In a preferred embodiment, the emitter material $S^B$ is an organic TADF emitter.

In one embodiment of the invention, the relation between the lowermost excited triplet state energy level $T1^S$ of $S^B$ and the lowermost excited triplet state energy level $T1^E$ of $E^B$ expressed by formula (9) applies:

$$T1^S > T1^E \quad (9).$$

In one embodiment of the invention, the relations expressed by $T1^S - T1^E \leq 0.4$ eV applies.

In one embodiment of the invention, the relations expressed by $T1^S - T1^E \leq 0.3$ eV applies.

In one embodiment of the invention, the relations expressed by $T1^S - T1^E \leq 0.2$ eV applies.

In a preferred embodiment, the following relation apply $S1^E > S1^S$, $T1^S > T1^E$ and $S1^E - T1^S \leq 0.4$ eV. In other words, the lowermost excited singlet state of the TADF material $E^B$ is higher in energy than lowermost excited singlet state of the emitter material $S^B$, and the lowermost excited triplet state of the emitter material $S^B$ is higher in energy than the lowermost excited triplet state of the TADF material $E^B$. In a preferred embodiment, all four states are within a range (i.e., difference in energy) of 0.4 eV or less, preferably in a range of 0.3 eV or less, particular in a range of 0.2 eV or less.

Due to the low energy difference between the lowermost excited singlet and triplet states of the TADF materials $E^B$ and $S^B$ exciton transfer between different states of $E^B$ and $S^B$ is sufficiently enabled. In addition, transfers between states of different multiplicities may be enabled due to the low energy difference.

This may include energy transfer (a) from a singlet state of the TADF material to the singlet state of the emitter material, (b) from a triplet state of the TADF material to the triplet state to the emitter material, (c) from a singlet state of the TADF material to the triplet state of the emitter material, and/or (d) from a triplet state of the TADF material to the singlet state of the other emitter material.

(e) from a singlet state of the emitter material to the singlet state of the TADF material, (f) from a triplet state of the emitter material to the triplet state to the TADF material, (g) from a singlet state of the emitter material to the triplet state of the TADF material, and/or (h) from a triplet state of the emitter material to the singlet state of the other TADF material.

Surprisingly it was found, that the main contribution to the emission band of the optoelectronic device according to the invention can be attributed to the emission of emitter material $S^B$, indicating a sufficient transfer of energy from $E^B$ to $S^B$.

In another embodiment of the invention, the relation expressed by formula (10a), (10b) or (10c) applies:

$$E^{HOMO}(H^B)>E^{HOMO}(S^B) \quad (10a)$$

$$E^{HOMO}(S^B)>E^{HOMO}(H^B) \quad (10b)$$

$$-0.1\ eV \leq E^{HOMO}(H^B)-E^{HOMO}(S^B) \leq 0.1\ eV \quad (10c).$$

In a preferred embodiment, the emitter material $S^B$ has a highest occupied molecular orbital HOMO($S^B$) having an energy $E^{HOMO}(S^B)$ and the host compound $H^B$ has a highest occupied molecular orbital HOMO($H^B$) having an energy $E^{HOMO}(H^B)$, wherein $E^{HOMO}(E^B)-E^{HOMO}(H^B) \leq 0.3$ eV and $E^{HOMO}(E^B)-E^{HOMO}(H^B) \geq -0.3$ eV. In other words, the HOMO($H^B$) of the host $H^B$ can be higher or lower in energy compared to the HOMO($S^B$) of the emitter material $S^B$, but the difference does not exceed 0.3 eV, more preferably does not exceed 0.2 eV.

In another embodiment of the invention, the relation between the lowest unoccupied molecular orbital LUMO ($E^B$) of $E^B$ having an energy $E^{LUMO}(E^B)$ and the lowest unoccupied molecular orbital LUMO($S^B$) of $S^B$ having an energy $E^{LUMO}(S^B)$ expressed by formula (11) applies:

$$E^{LUMO}(E^B)>E^{LUMO}(S^B) \quad (11).$$

In one embodiment of the invention, the lowest unoccupied molecular orbital LUMO($S^B$) of $S^B$ having an energy $E^{LUMO}(S^B)$ is higher in energy than the lowest unoccupied molecular orbital LUMO($S^B$) of $S^B$ having an energy $E^{LUMO}(S^B)$ and the lowest unoccupied molecular orbital LUMO ($H^B$) of $H^B$ having an energy $E^{LUMO}(H^B)$ is higher in energy than the lowest unoccupied molecular orbital LUMO($S^B$) of $S^B$ having an energy $E^{LUMO}(S^B)$, expressed the formulas (11) and (11a):

$$E^{LUMO}(E^B)>E^{LUMO}(S^B) \quad (11)$$

$$E^{LUMO}(H^B)>E^{LUMO}(S^B) \quad (11a).$$

In one embodiment of the invention, the relations expressed by one of the following formulas (11 b) and (11c) applies:

$$0.2\ eV \leq E^{LUMO}(H^B)-E^{LUMO}(E^B) \leq 0.8\ eV \quad (11b).$$

$$0.2\ eV \leq E^{LUMO}(E^B)-E^{LUMO}(S^B) \leq 0.8\ eV \quad (11c).$$

In one embodiment of the present invention, the emitter material $S^B$ is a TADF material, i.e., one or more TADF emitter. Accordingly in an embodiment of the present invention, the emitter $S^B$ is characterized in that it has a $\Delta E_{ST}$ value, which corresponds to the energy difference between $S1^S$ and $T1^S$, of less than 0.4 eV. In a preferred embodiment of the present invention, the emitter material $S^B$ is characterized in that it has a $\Delta E_{ST}$ value of less than 0.3 eV, less than 0.2 eV, less than 0.1 eV, or even less than 0.05 eV.

In one embodiment of the present invention, the TADF material $E^B$ and the emitter material $S^B$ are both organic TADF emitters.

In one embodiment of the invention, the lowermost excited triplet state energy level $T1^S$ of the TADF material $E^B$ is between 2.2 eV and 3.5 eV, preferably between 2.3 eV and 3.2 eV, more preferably between 2.4 eV and 3.1 eV or even between 2.5 eV and 3.0 eV.

In one embodiment of the invention, the relations of the lowest unoccupied molecular orbital of the host material LUMO($H^B$), the lowest unoccupied molecular orbital of the TADF material LUMO($E^B$), and the lowest unoccupied molecular orbital of the emitter material LUMO($S^B$) expressed by the following formulas (10a) and (10b) apply:

$$E^{LUMO}(E^B)>E^{LUMO}(S^B) \quad (10a)$$

$$E^{LUMO}(H^B)>E^{LUMO}(S^B) \quad (10b).$$

In one embodiment of the invention, the relation expressed by the following formula (10c) applies:

$$E^{LUMO}(H^B)>E^{LUMO}(S^B) \quad (10c).$$

In one embodiment of the present invention, the relations expressed by the following formula applies:

$$E^{LUMO}(H^B)>E^{LUMO}(E^B)>E^{LUMO}(S^B) \quad (10d).$$

According to the invention, the emission layer B comprises at least one host material $H^B$, the TADF material $E^B$ and the emitter material $S^B$.

In a preferred embodiment of the invention, the light-emitting layer B comprises 39.8-98%, more preferably 57-93%, even more preferably 74-87% by weight of the host compound $H^B$.

In a preferred embodiment of the invention, the light-emitting layer B comprises 0.1-50%, more preferably 0.5-40%, even more preferably 1-30% by weight of the TADF material $E^B$.

In a preferred embodiment of the invention, the light-emitting layer B comprises 0.1-50%, more preferably 0.5-40%, even more preferably 1-30% by weight of the emitter material $S^B$.

In a preferred embodiment of the invention, the emitter material $S^B$ is an organic TADF emitter, wherein the light-emitting layer B comprises 1-50%, more preferably 5-40%, even more preferably 10-30% by weight of the emitter material $S^B$.

In a preferred embodiment of the invention, the emitter material $S^B$ is a NRCT emitter, wherein the light-emitting layer B comprises 0.1-10%, more preferably 0.5-5%, even more preferably 1-3% by weight of the emitter material $S^B$.

In one embodiment of the invention, the emitter material $S^B$ is a fluorescence emitter, wherein the light-emitting layer B comprises 0.1-10%, more preferably 0.5-5%, even more preferably 1-3% by weight of the emitter material $S^B$.

In a preferred embodiment of the invention, the TADF material $E^B$ is an organic TADF emitter, wherein the light-emitting layer B comprises 1-50%, more preferably 5-40%, even more preferably 10-30% by weight of the emitter material $E^B$.

In a preferred embodiment of the invention, the TADF material $E^B$ is a NRCT emitter, wherein the light-emitting layer B comprises 0.1-10%, more preferably 0.5-5%, even more preferably 1-3% by weight of the emitter material $E^B$.

In a preferred embodiment of the invention, the light-emitting layer B comprises up to 93% by weight of one or more further host compounds $H^{B2}$ differing from $H^B$.

In a preferred embodiment of the invention, the light-emitting layer B comprises up to 93% by weight of one or more solvents.

In a preferred embodiment of the invention, the light-emitting layer B comprises (or consists of):

(i) 39.8-98%, more preferably 57-93%, even more preferably 74-87% by weight of the host compound $H^B$;

(ii) 0.1-50%, more preferably 0.5-40%, even more preferably 1-30% by weight of the TADF material $E^B$; and
(iii) 0.1-50%, more preferably 0.5-40%, even more preferably 1-30% by weight of the emitter material $S^B$; and optionally
(iv) 0-60% by weight of one or more further host compounds $H^{B2}$ differing from $H^B$; and optionally
(v) 0-60% by weight of one or more solvents.

Preferably, the contents of (i) to (v) sum up to 100% by weight.

In a preferred embodiment, the emitter material $S^B$ and the TADF material $E^B$ are each independently from each other a NRCT emitter, wherein the light-emitting layer B comprises (or consists of):

(i) 39.8-98%, more preferably 57-93%, even more preferably 74-87% by weight of the host compound $H^B$;
(ii) 0.1-10%, more preferably 0.5-5%, even more preferably 1-3% by weight of the TADF material $E^B$; and
(iii) 0.1-10%, more preferably 0.5-5%, even more preferably 1-3% by weight of the emitter material $S^B$; and optionally
(iv) 0-60% by weight of one or more further host compounds $H^{B2}$ differing from $H^B$; and optionally
(v) 0-60% by weight of one or more solvents.

In a preferred embodiment, the emitter material $S^B$ is an organic TADF emitter and the TADF material $E^B$ is a NRCT emitter, wherein the light-emitting layer B comprises (or consists of):

(i) 39.8-98%, more preferably 57-93%, even more preferably 74-87% by weight of the host compound $H^B$;
(ii) 0.1-10%, more preferably 0.5-5%, even more preferably 1-3% by weight of the TADF material $E^B$; and
(iii) 1-50%, more preferably 5-40%, even more preferably 10-30% by weight of the emitter material $S^B$; and optionally
(iv) 0-59.9% by weight of one or more further host compounds $H^{B2}$ differing from $H^B$; and optionally
(v) 0-59.9% by weight of one or more solvents.

In a preferred embodiment, the emitter material $S^B$ is a NRCT emitter and the TADF material $E^B$ is an organic TADF emitter, wherein the light-emitting layer B comprises (or consists of):

(i) 39.8-98%, more preferably 57-93%, even more preferably 74-87% by weight of the host compound $H^B$;
(ii) 1-50%, more preferably 5-40%, even more preferably 10-30% by weight of the TADF material $E^B$; and
(iii) 0.1-10%, more preferably 0.5-5%, even more preferably 1-3% by weight of the emitter material $S^B$; and optionally
(iv) 0-59.1% by weight of one or more further host compounds $H^{B2}$ differing from $H^B$; and optionally
(v) 0-59.1% by weight of one or more solvents.

In a preferred embodiment, the emitter material $S^B$ is a fluorescence emitter and the TADF material $E^B$ is a NRCT emitter, wherein the light-emitting layer B comprises (or consists of):

(i) 39.8-98%, more preferably 57-93%, even more preferably 74-87% by weight of the host compound $H^B$;
(ii) 0.1-10%, more preferably 0.5-5%, even more preferably 1-3% by weight of the TADF material $E^B$; and
(iii) 0.1-10%, more preferably 0.5-5%, even more preferably 1-3% by weight of the emitter material $S^B$; and optionally
(iv) 0-60% by weight of one or more further host compounds $H^{B2}$ differing from $H^B$; and optionally
(v) 0-60% by weight of one or more solvents.

In a preferred embodiment, the emitter material $S^B$ is a fluorescence emitter and the TADF material $E^B$ is an organic TADF emitter, wherein the light-emitting layer B comprises (or consists of):

(i) 39.8-98%, more preferably 57-93%, even more preferably 74-87% by weight of the host compound $H^B$;
(ii) 1-50%, more preferably 5-40%, even more preferably 10-30% by weight of the TADF material $E^B$; and
(iii) 0.1-10%, more preferably 0.5-5%, even more preferably 1-3% by weight of the emitter material $S^B$; and optionally
(iv) 0-59.1% by weight of one or more further host compounds $H^{B2}$ differing from $H^B$; and optionally
(v) 0-59.1% by weight of one or more solvents.

Exemplarily, the host material $H^B$ and/or the optionally present further host compound $H^{B2}$ may be selected from the group consisting of CBP (4,4'-Bis-(N-carbazolyl)-biphenyl), mCP, mCBP Sif87 (dibenzo[b,d]thiophen-2-yltriphenylsilane), CzSi, Sif88 (dibenzo[b,d]thiophen-2-yl)diphenylsilane), DPEPO (bis[2-(diphenylphosphino)phenyl]ether oxide), 9-[3-(dibenzofuran-2-yl)phenyl]-9H-carbazole, 9-[3-(dibenzofuran-2-yl)phenyl]-9H-carbazole, 9-[3-(dibenzothio-phen-2-yl)phenyl]-9H-carbazole, 9-[3,5-bis(2-dibenzofuranyl)phenyl]-9H-carbazole, 9-[3,5-bis(2-dibenzothiophenyl)phenyl]-9H-carbazole, T2T (2,4,6-tris(biphenyl-3-yl)-1,3,5-triazine), T3T (2,4,6-tris(triphenyl-3-yl)-1,3,5-triazine) and/or TST (2,4,6-tris(9,9'-spirobifluorene-2-yl)-1,3,5-triazine). In one embodiment of the invention, the emission layer B comprises a so-called mixed-host system with at least one hole-dominant (n-type) host and one electron-dominant (p-type) host.

In one embodiment, the emission layer B comprises the first TADF material $E^B$ and the second TADF material $S^B$, and hole-dominant host $H^B$ selected from the group consisting of CBP, mCP, mCBP, 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole.

As used herein, if not defined more specifically in a particular context, the designation of the colors of emitted and/or absorbed light is as follows:

violet: wavelength range of >380-420 nm;
deep blue: wavelength range of >420-470 nm;
sky blue: wavelength range of >470-500 nm;
green: wavelength range of >500-560 nm;
yellow: wavelength range of >560-580 nm;
orange: wavelength range of >580-620 nm;
red: wavelength range of >620-800 nm.

With respect to emitter compounds, such colors refer to the emission maximum $\lambda_{max}^{PMMA}$ of a poly(methyl methacrylate) (PMMA) film with typically 1-10% by weight of the emitter. Therefore, exemplarily, a deep blue emitter has an emission maximum $\lambda_{max}^{PMMA}$ in the range of from 420 to 470 nm, a sky blue emitter has an emission maximum $\lambda_{max}^{PMMA}$ in the range of from 470 to 500 nm, a green emitter has an emission maximum $\lambda_{max}^{PMMA}$ in a range of from 500 to 560 nm, a red emitter has an emission maximum $\lambda_{max}^{PMMA}$ in a range of from 620 to 800 nm.

In one embodiment, the TADF material $E^B$ exhibits a photoluminescence quantum yield PLQY($E^B$) and the emitter material $S^B$ exhibits a photoluminescence quantum yield PLQY($S^B$), wherein PLQY($E^B$) and PLQY($S^B$) are determined in PMMA and the following formula (12) applies $$PLQY(E^B) > PLQY(S^B) \qquad (12).$$

In a preferred embodiment of the invention, The organic electroluminescent device exhibits an emission maximum $\lambda_{max}$(D) of 440 to 560 nm.

In a preferred embodiment of the invention, The organic electroluminescent device exhibits an emission maximum $\lambda_{max}$(D) of 440 to 470 nm.

In a preferred embodiment of the invention, The organic electroluminescent device exhibits an emission maximum $\lambda_{max}$(D) of 510 to 550 nm.

Near-Range-Charge-Transfer (NRCT) Emitters

A Near-range-charge-transfer (NRCT) emitter in the context of the present invention is any emitter that has an emission spectrum, which exhibits a full width at half maximum (FWHM) of less than or equal to 0.25 eV (≤0.25 eV), measured with 1 by weight of NRCT emitter in PMMA at room temperature (RT).

As used herein and not otherwise specified, the each spectral property determined herein is determined at a content of 1% by weight of the respective emitter in PMMA at room temperature (RT). As used herein and not otherwise specified, the FWHM is determined at a content of 1% by weight of the respective emitter in PMMA at room temperature (RT).

In a preferred embodiment of the present invention, a NRCT emitter in the context of the present invention is any emitter that has an emission spectrum, which exhibits a FWHM of ≤0.24 eV, more preferably ≤0.23 eV, even more preferably ≤0.22 eV, ≤0.21 eV or ≤0.20 eV, measured with 1% by weight of NRCT emitter in PMMA at room temperature (RT). In other embodiments of the present invention, an emitter exhibits a FWHM of ≤0.19 eV, ≤0.19 eV, ≤0.18 eV, ≤0.17 eV, ≤0.16 eV, ≤0.15 eV, ≤0.14 eV, ≤0.13 eV, ≤0.12 eV, or ≤0.11 eV.

Typical NRCT emitters are described in literature by Hatakeyama et al. (Advanced Materials, 2016, 28(14):2777-2781, DOI: 10.1002/adma.201505491) to show a delayed component in the time-resolved photoluminescence spectrum and exhibits a near-range HOMO-LUMO separation as described.

Typical NRCT emitters only show one emission band in the emission spectrum, wherein typical fluorescence emitters display several distinct emission bands due to vibrational progression.

In one embodiment of the invention, the TADF material $E^B$ and/or the emitter material $S^B$ is a NRCT emitter. In one embodiment of the invention, the TADF material $E^B$ and the emitter material $S^B$ are both each a NRCT emitter. In another embodiment of the invention, the TADF material $E^B$ is no NRCT emitter. In this case, the TADF material $E^B$ is an emitter which shows TADF properties, but not the properties of a NRCT emitter as defined herein. In further embodiment of the invention, the emitter material $S^B$ is no NRCT emitter. In this case, the emitter material $S^B$ is an emitter which does not have the properties of a NRCT emitter as defined herein. In one embodiment of the invention, the emitter material $S^B$ is a fluorescent emitter. In one embodiment of the invention, the emitter material $S^B$ is a fluorescent emitter which is no NRCT emitter. In further embodiment of the invention, neither the TADF material $E^B$ nor the emitter material $S^B$ are NRCT emitters.

An NRCT emitter may, in each context of the present invention, optionally each be a boron containing NRCT emitter, in particular a blue boron containing NRCT emitter.

In a preferred embodiment, the TADF material $E^B$ is a NRCT emitter.

In one embodiment, the TADF material $E^B$ and/or the emitter material $S^B$ is a boron containing NRCT emitter.

In one embodiment, the TADF material $E^B$ and the emitter material $S^B$ is a boron containing NRCT emitter.

In a preferred embodiment, the TADF material $E^B$ is a boron containing NRCT emitter.

In one embodiment, the TADF material $E^B$ is a blue boron containing NRCT emitter.

In a preferred embodiment, a NRCT emitter comprises or consists of a polycyclic aromatic compound.

TADF material $E^B$ and/or the emitter material $S^B$ comprises or consists of a polycyclic aromatic compound.

In a preferred embodiment, the emission spectrum of a film with 1% by weight of the TADF material $E^B$ has a full width at half maximum (FWHM), which is smaller than 0.2 eV.

In a preferred embodiment, the TADF material $E^B$ is a boron containing emitter with an emission spectrum of a film with 1% by weight of the TADF material $E^B$, which has a full width at half maximum (FWHM), which is smaller than 0.2 eV.

In a preferred embodiment, the TADF material $E^B$ is a blue boron containing emitter with an emission spectrum of a film with 1% by weight of the TADF material $E^B$, which has a full width at half maximum (FWHM), which is smaller than 0.2 eV.

In a preferred embodiment, the TADF material $E^B$ comprises or consists of a polycyclic aromatic compound with an emission spectrum of a film with 1% by weight of the TADF material $E^B$, which has a full width at half maximum (FWHM), which is smaller than 0.2 eV.

In a preferred embodiment, the TADF material $E^B$ comprises or consists of a polycyclic aromatic compound according to formula (1) or (2) or a specific example described in US-A 2015/236274. US-A 2015/236274 also describes examples for synthesis of such compounds.

In one embodiment, the TADF material $E^B$ comprises or consists of a structure according to Formula I:

Formula I

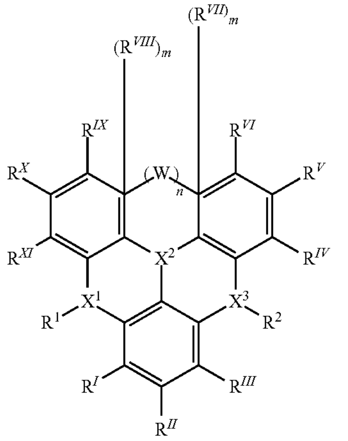

Wherein n is 0 or 1.

m=1-n.

$X^1$ is N or B.

$X^2$ is N or B.

$X^3$ is N or B.

W is selected from the group consisting of $Si(R^3)_2$, $C(R^3)_2$ and $BR^3$.

each of $R^1$, $R^2$ and $R^3$ is independently from each other selected from the group consisting of:

$C_1$-$C_6$-alkyl, which is optionally substituted with one or more substituents $R^6$;

$C_6$-$C_{60}$-aryl, which is optionally substituted with one or more substituents $R^6$; and $C_3$-$C_{57}$-heteroaryl, which is optionally substituted with one or more substituents $R^6$;

each of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ is independently from another selected from the group consisting of: hydrogen, deuterium, $N(R^5)_2$, $OR^5$, $Si(R^5)_3$, $B(OR^5)_2$, $OSO_2R^5$, $CF_3$, CN, halogen, $C_1$-$C_{40}$-alkyl, which is optionally substituted with one or more substituents $R^5$ and wherein one or more non-adjacent $CH_2$-groups are each optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_1$-$C_{40}$-alkoxy, which is optionally substituted with one or more substituents $R^5$ and wherein one or more non-adjacent $CH_2$-groups are each optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_1$-$C_{40}$-thioalkoxy, which is optionally substituted with one or more substituents $R^5$ and wherein one or more non-adjacent $CH_2$-groups are each optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_2$-$C_{40}$-alkenyl, which is optionally substituted with one or more substituents $R^5$ and wherein one or more non-adjacent $CH_2$-groups are each optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_2$-$C_{40}$-alkynyl, which is optionally substituted with one or more substituents $R^5$ and wherein one or more non-adjacent $CH_2$-groups are each optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_6$-$C_{60}$-aryl, which is optionally substituted with one or more substituents $R^5$; and $C_3$-$C_{57}$-heteroaryl, which is optionally substituted with one or more substituents $R^5$.

$R^5$ is at each occurrence independently from another selected from the group consisting of: hydrogen, deuterium, OPh, $CF_3$, CN, F, $C_1$-$C_5$-alkyl, wherein optionally one or more hydrogen atoms are independently from each other substituted by deuterium, CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-aryl$)_2$, $N(C_3$-$C_{17}$-heteroaryl$)_2$; and $N(C_3$-$C_{17}$-heteroaryl)($C_6$-$C_{18}$-aryl).

$R^6$ is at each occurrence independently from another selected from the group consisting of hydrogen, deuterium, OPh, $CF_3$, CN, F, $C_1$-$C_5$-alkyl, wherein optionally one or more hydrogen atoms are independently from each other substituted by deuterium, CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-aryl$)_2$, $N(C_3$-$C_{17}$-heteroaryl$)_2$; and $N(C_3$-$C_{17}$-heteroaryl)($C_6$-$C_{18}$-aryl).

According to a preferred embodiment, two or more of the substituents selected from the group consisting of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ that are positioned adjacent to another may each form a mono- or polycyclic, aliphatic, aromatic and/or benzo-fused ring system with another.

According to a preferred embodiment, at least one of $X^1$, $X^2$ and $X^3$ is B and at least one of $X^1$, $X^2$ and $X^3$ is N.

According to a preferred embodiment of the invention, at least one substituent selected from the group consisting of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ optionally forms a mono- or polycyclic, aliphatic, aromatic and/or benzo-fused ring system with one or more substituents of the same group that is/are positioned adjacent to the at least one substituent.

According to a preferred embodiment of the invention, at least one of $X^1$, $X^2$ and $X^3$ is B and at least one of $X^1$, $X^2$ and $X^3$ is N.

In one embodiment, the TADF material $E^B$ comprises or consists of a structure according to Formula 1 and n=0.

In one embodiment, each of $R^1$ and $R^2$ is each independently from each other selected from the group consisting of $C_1$-$C_6$-alkyl, which is optionally substituted with one or more substituents $R^6$;

$C_6$-$C_{30}$-aryl, which is optionally substituted with one or more substituents $R^6$; and $C_3$-$C_{30}$-heteroaryl, which is optionally substituted with one or more substituents $R^6$.

In one embodiment, $R^1$ and $R^2$ is each independently from each other selected from the group consisting of Me, $^i$Pr, $^t$Bu, CN, $CF_3$, Ph, which is optionally substituted with one or more substituents independently from each other selected from the group consisting of Me, $^i$Pr, $^t$Bu, CN, $CF_3$, and Ph;

pyridinyl, which is optionally substituted with one or more substituents independently from each other selected from the group consisting of Me, $^{i}$Pr, $^{t}$Bu, CN, $CF_3$, and Ph;

pyrimidinyl, which is optionally substituted with one or more substituents independently from each other selected from the group consisting of Me, $^{i}$Pr, $^{t}$Bu, CN, $CF_3$, and Ph; and triazinyl, which is optionally substituted with one or more substituents independently from each other selected from the group consisting of Me, $^{i}$Pr, $^{t}$Bu, CN, $CF_3$, and Ph.

In one embodiment, each of $R^{I}$, $R^{II}$, $R^{III}$, $R^{IV}$, $R^{V}$, $R^{VI}$, $R^{VII}$, $R^{VIII}$, $R^{IX}$, $R^{X}$, and $R^{XI}$ is independently from another selected from the group consisting of: hydrogen, deuterium, halogen, Me, $^{i}$Pr, $^{t}$Bu, CN, $CF_3$, Ph, which is optionally substituted with one or more substituents independently from each other selected from the group consisting of Me, $^{i}$Pr, $^{t}$Bu, CN, $CF_3$, and Ph;

pyridinyl, which is optionally substituted with one or more substituents independently from each other selected from the group consisting of Me, $^{i}$Pr, $^{t}$Bu, CN, $CF_3$, and Ph;

pyrimidinyl, which is optionally substituted with one or more substituents independently from each other selected from the group consisting of Me, $^{i}$Pr, $^{t}$Bu, CN, $CF_3$, and Ph;

carbazolyl, which is optionally substituted with one or more substituents independently from each other selected from the group consisting of Me, $^{i}$Pr, $^{t}$Bu, CN, $CF_3$, and Ph;

triazinyl, which is optionally substituted with one or more substituents independently from each other selected from the group consisting of Me, $^{i}$Pr, $^{t}$Bu, CN, $CF_3$, and Ph;

and $N(Ph)_2$.

In one embodiment, each of $R^{I}$, $R^{II}$, $R^{III}$, $R^{IV}$, $R^{V}$, $R^{VI}$, $R^{VII}$, $R^{VIII}$, $R^{IX}$, $R^{X}$, and $R^{XI}$ is independently from another selected from the group consisting of: hydrogen, deuterium, halogen, Me, $^{i}$Pr, $^{t}$Bu, CN, $CF_3$, Ph, which is optionally substituted with one or more substituents independently from each other selected from the group consisting of Me, $^{i}$Pr, $^{t}$Bu, CN, $CF_3$, and Ph;

pyridinyl, which is optionally substituted with one or more substituents independently from each other selected from the group consisting of Me, $^{i}$Pr, $^{t}$Bu, CN, $CF_3$, and Ph;

pyrimidinyl, which is optionally substituted with one or more substituents independently from each other selected from the group consisting of Me, $^{i}$Pr, $^{t}$Bu, CN, $CF_3$, and Ph;

carbazolyl, which is optionally substituted with one or more substituents independently from each other selected from the group consisting of Me, $^{i}$Pr, $^{t}$Bu, CN, $CF_3$, and Ph;

triazinyl, which is optionally substituted with one or more substituents independently from each other selected from the group consisting of Me, $^{i}$Pr, $^{t}$Bu, CN, $CF_3$, and Ph;

and $N(Ph)_2$; and $R^1$ and $R^2$ is each independently from each other selected from the group consisting of $C_1$-$C_5$-alkyl, which is optionally substituted with one or more substituents $R^6$;

$C_6$-$C_{30}$-aryl, which is optionally substituted with one or more substituents $R^6$; and $C_3$-$C_{30}$-heteroaryl, which is optionally substituted with one or more substituents $R^6$.

In one embodiment of the invention, the emitter material $S^B$ is a near-range-charge-transfer (NRCT) emitter. According to the invention, a NRCT material shows a delayed component in the time-resolved photoluminescence spectrum and exhibits a near-range HOMO-LUMO separation as described by Hatakeyama et al. (Advanced Materials, 2016, 28(14):2777-2781, DOI: 10.1002/adma.201505491).

In one embodiment, the emitter material $S^B$ is a boron containing NRCT emitter.

In one embodiment, the emitter material $S^B$ is a blue boron containing NRCT emitter.

In a preferred embodiment, the emitter material $S^B$ comprises or consists of a polycyclic aromatic compound.

In a preferred embodiment, the emission spectrum of a film with 1% by weight of the emitter material $S^B$ has a full width at half maximum (FWHM), which is smaller than 0.2 eV.

In a preferred embodiment, the emitter material $S^B$ is a boron containing emitter with an emission spectrum of a film with 1% by weight of the emitter material $S^B$, which has a full width at half maximum (FWHM), which is smaller than 0.2 eV.

In a preferred embodiment, the emitter material $S^B$ is a blue boron containing emitter with an emission spectrum of a film with 1% by weight of the emitter material $S^B$, which has a full width at half maximum (FWHM), which is smaller than 0.2 eV.

In a preferred embodiment, the emitter material $S^B$ comprises or consists of a polycyclic aromatic compound with an emission spectrum of a film with 1% by weight of, the emitter material $S^B$, which has a full width at half maximum (FWHM), which is smaller than 0.2 eV.

In a preferred embodiment, the emitter material $S^B$ comprises or consists of a polycyclic aromatic compound according to formula (1) or (2) or a specific example described in US-A 2015/236274. US-A 2015/236274 also describes examples for synthesis of such compounds.

In one embodiment, the emitter material $S^B$ comprises or consists of a structure according to Formula I.

In a one embodiment, the TADF material $E^B$ and/or the emitter material $S^B$ is a blue boron-containing NRCT emitter selected from the following group:

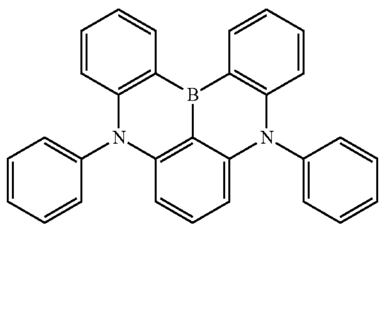

-continued
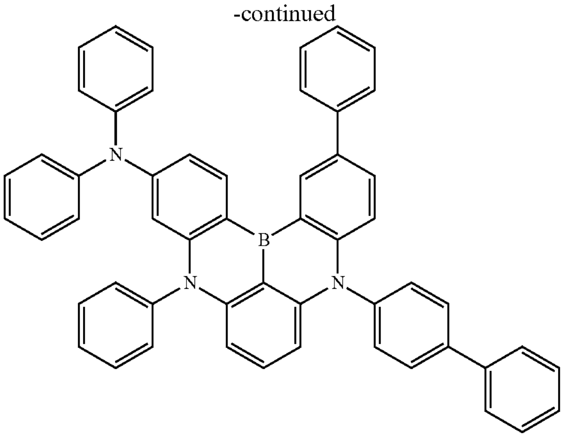
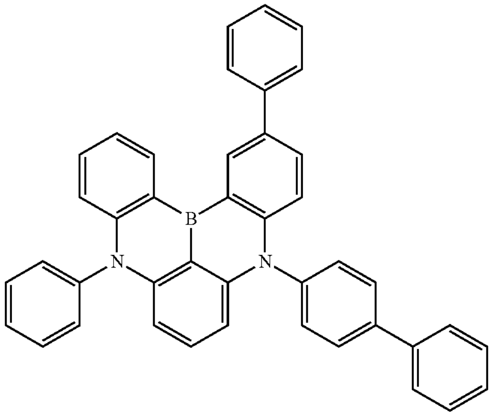
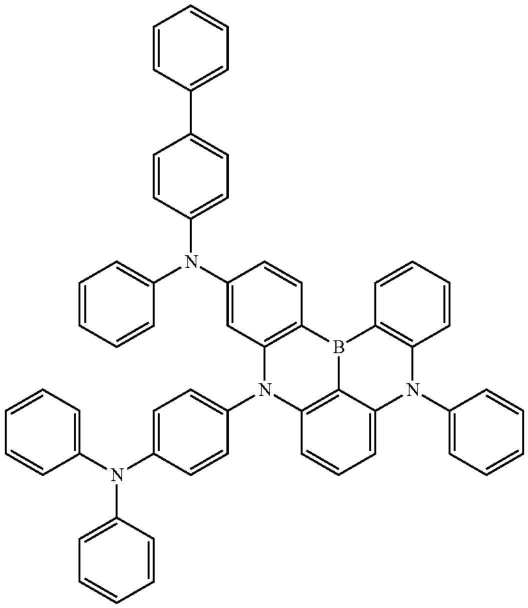
-continued
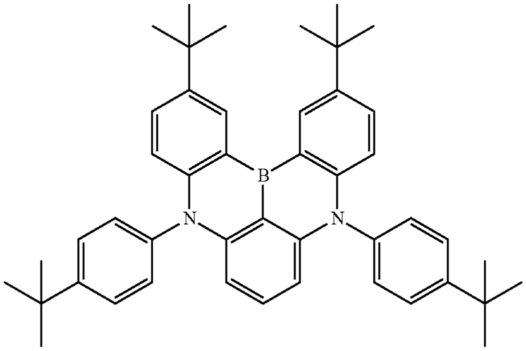
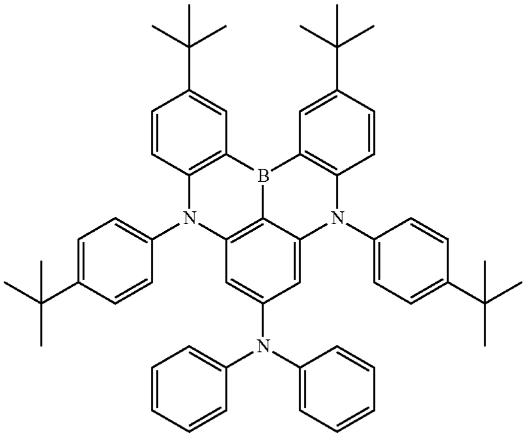
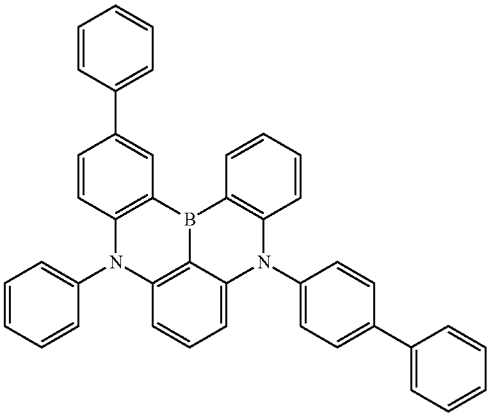
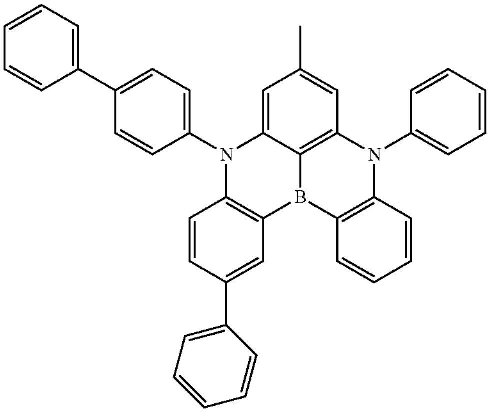

-continued
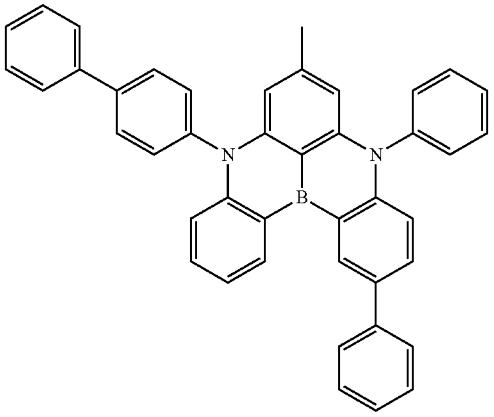
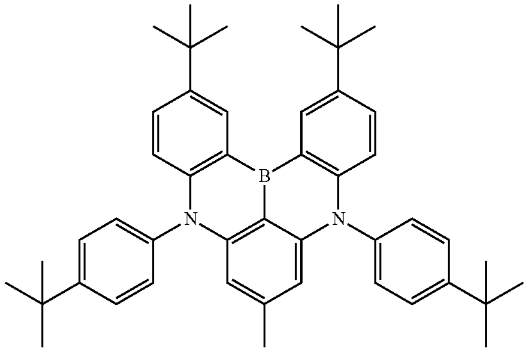
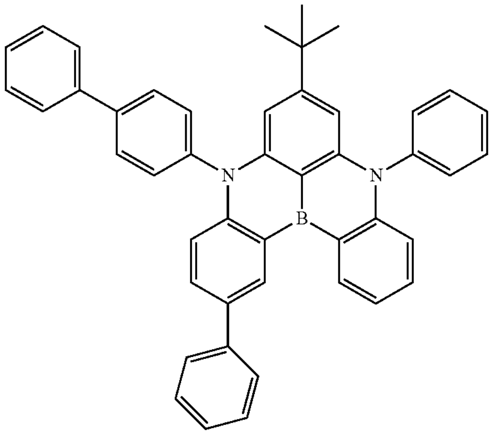
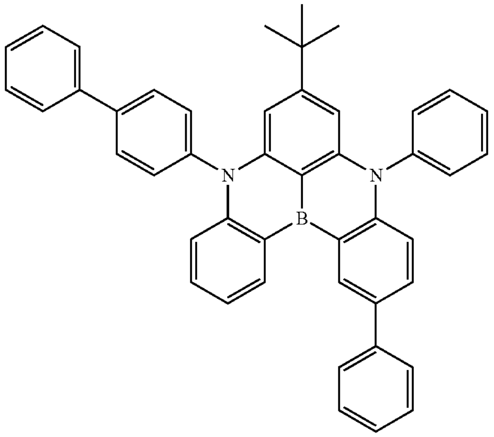
-continued
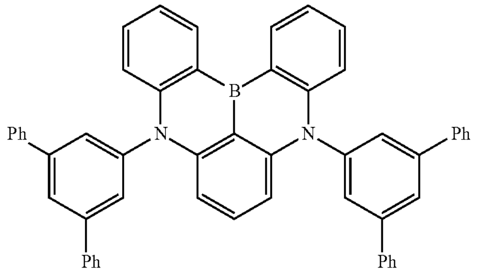
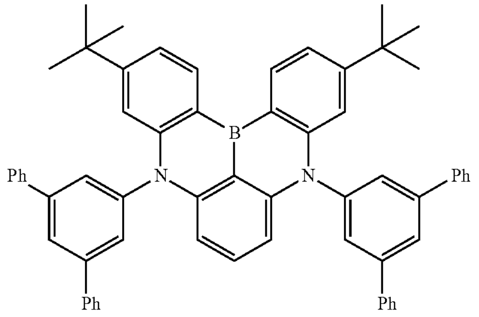
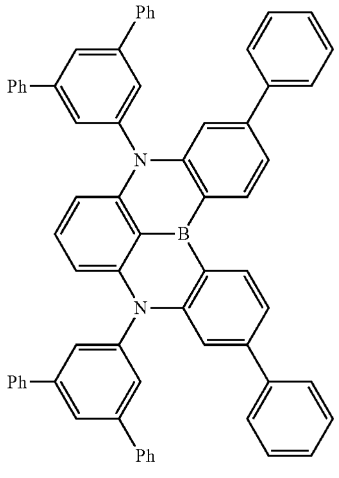
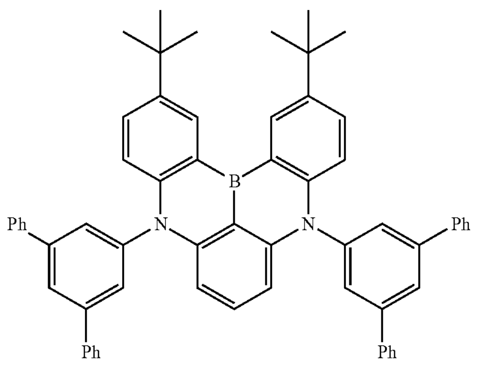

-continued
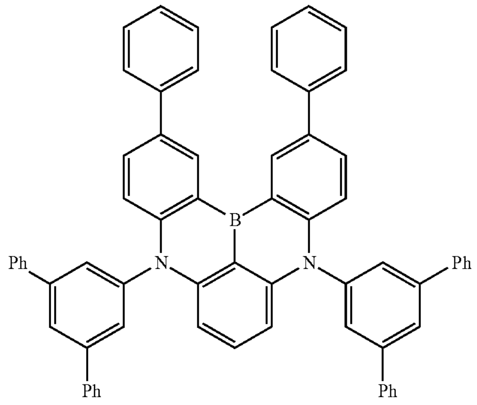
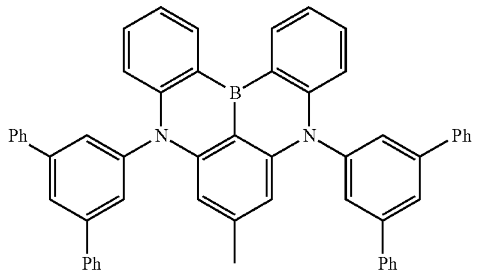
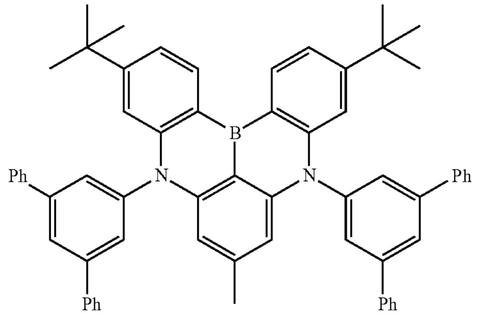
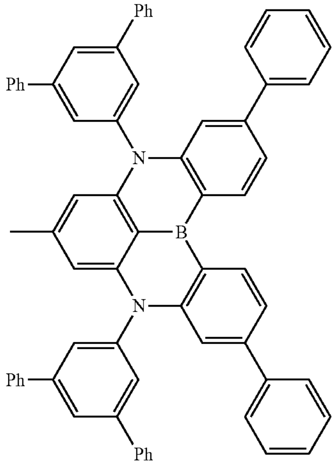
-continued
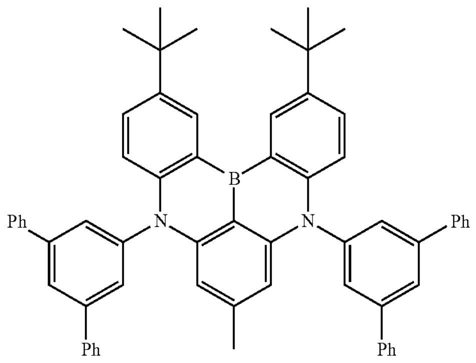
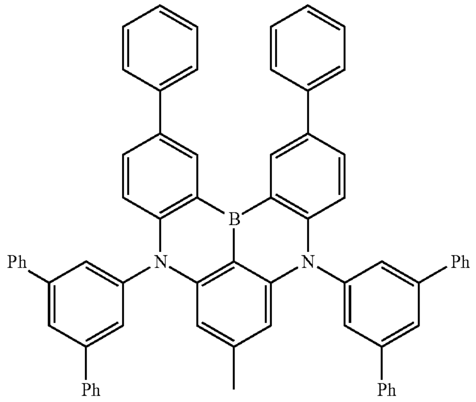
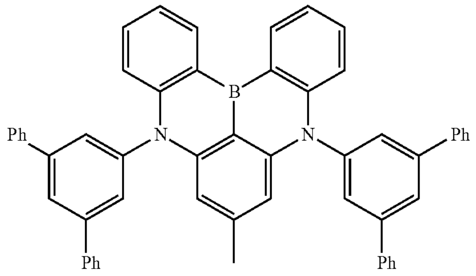
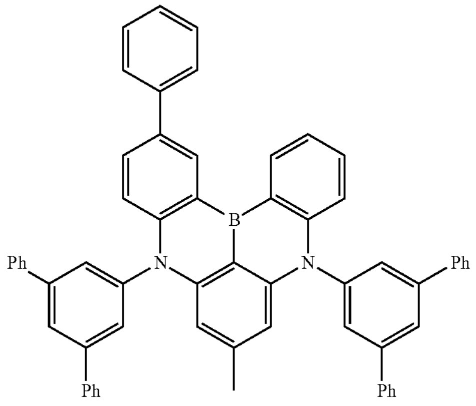

-continued
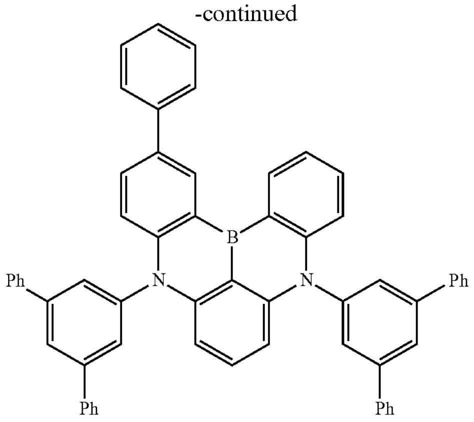
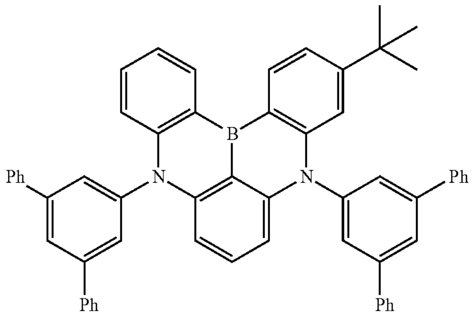
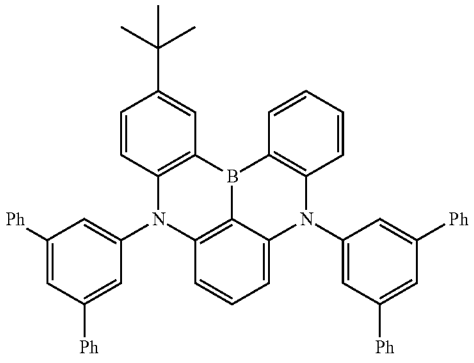
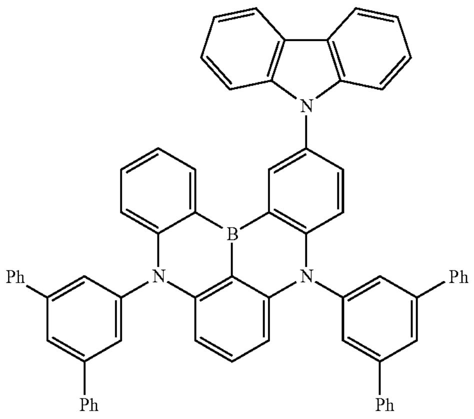
-continued
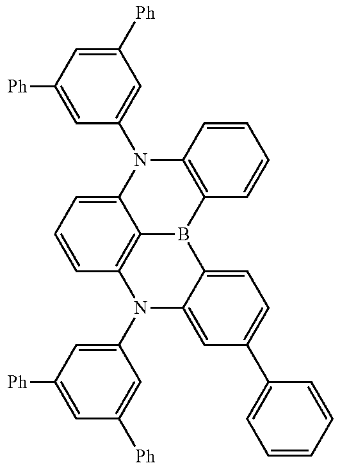
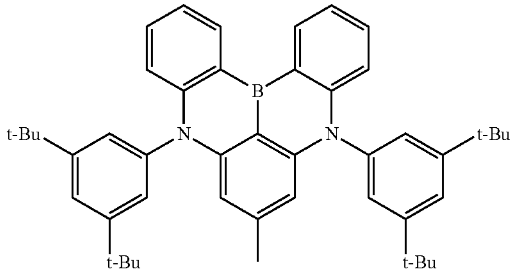
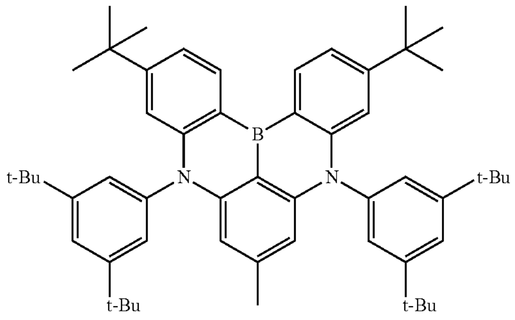
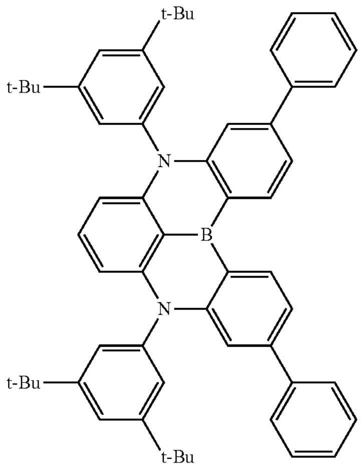

-continued
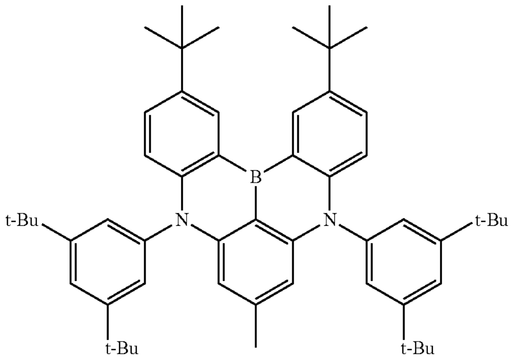
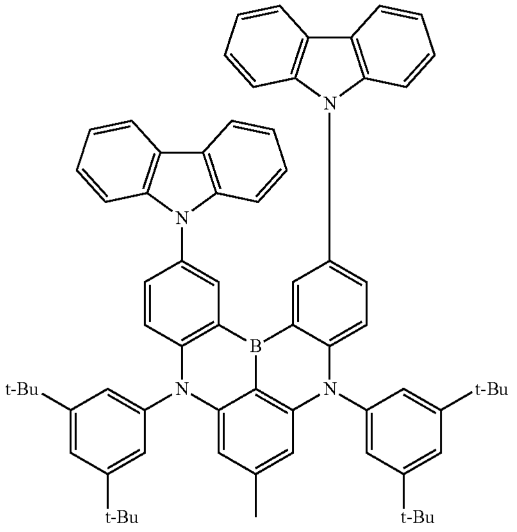
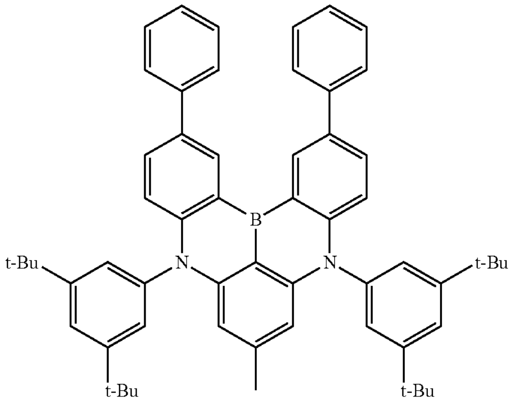
-continued
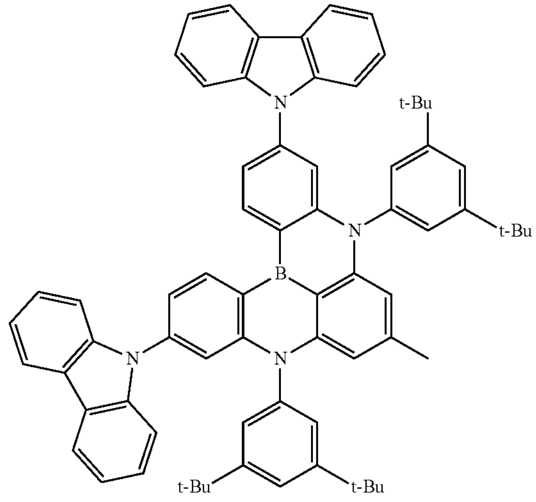
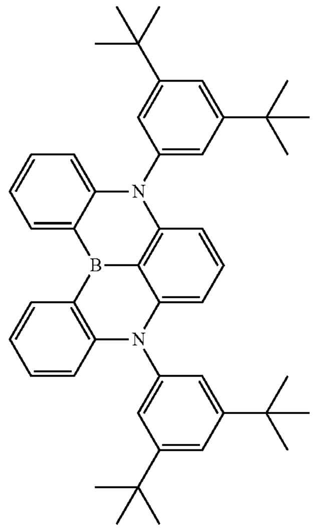
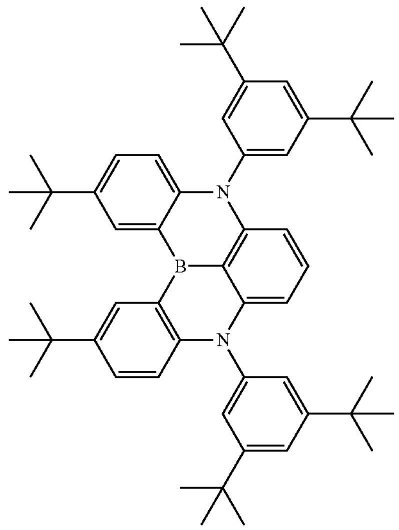

-continued
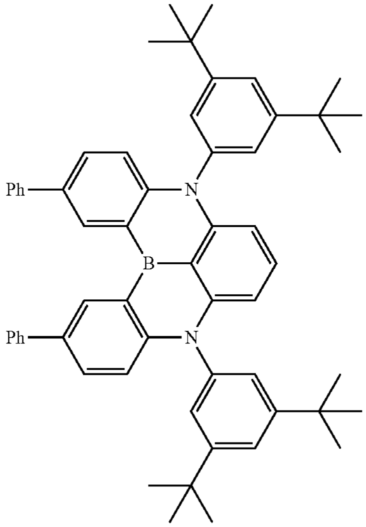
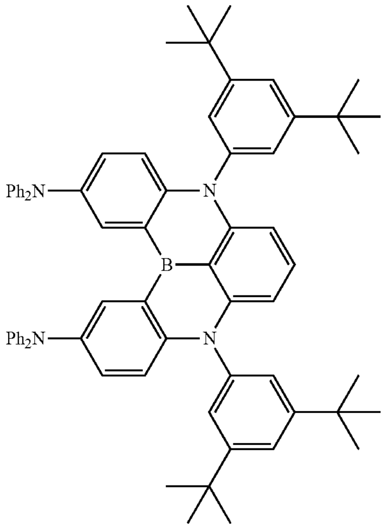
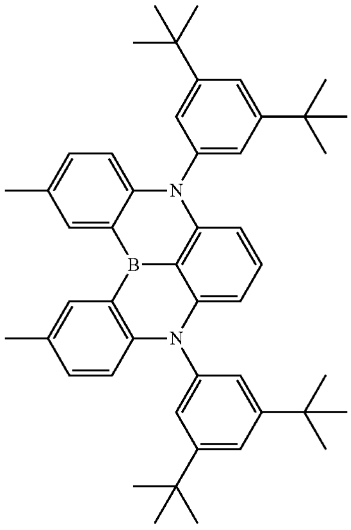
-continued
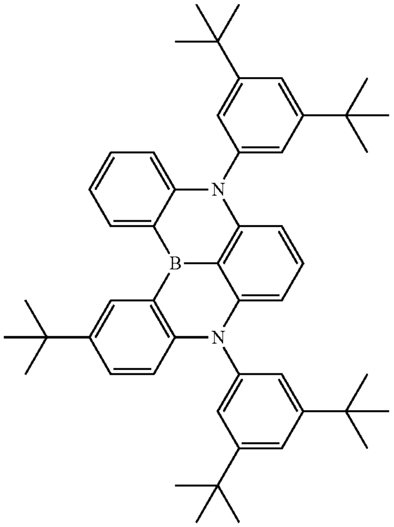
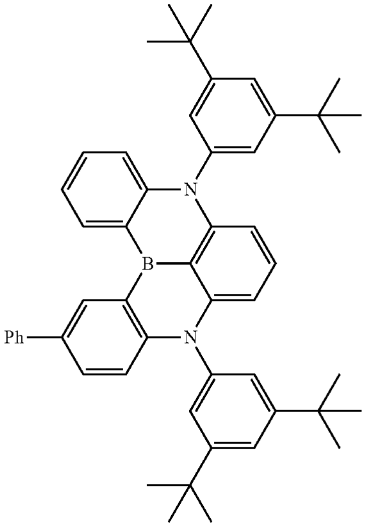
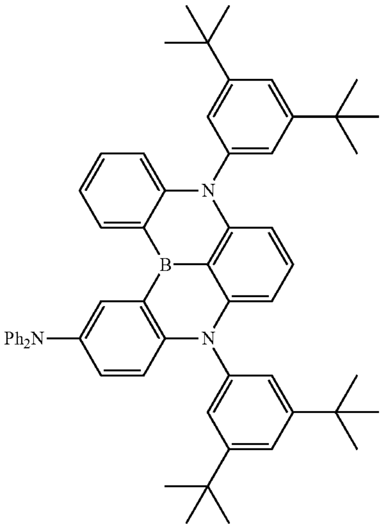

-continued
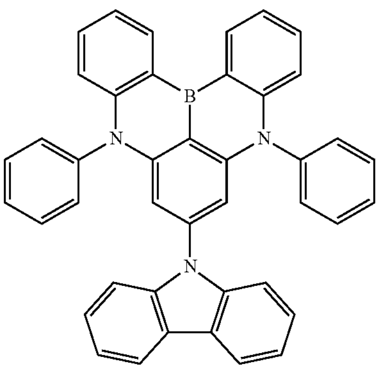
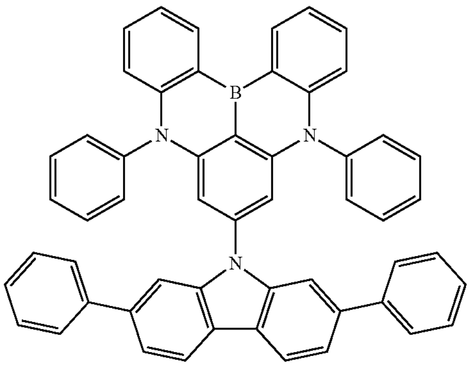
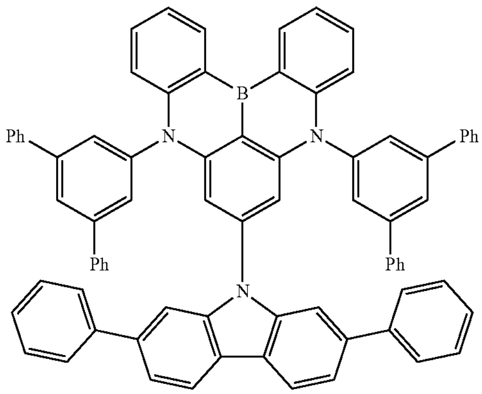
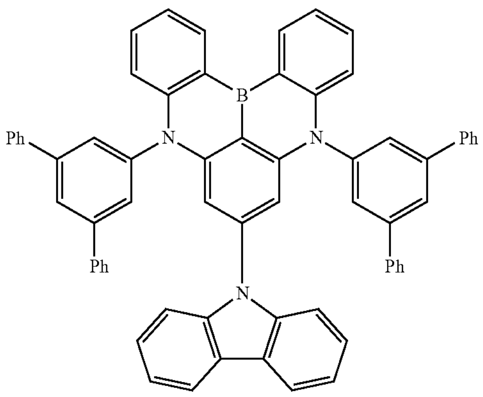
-continued
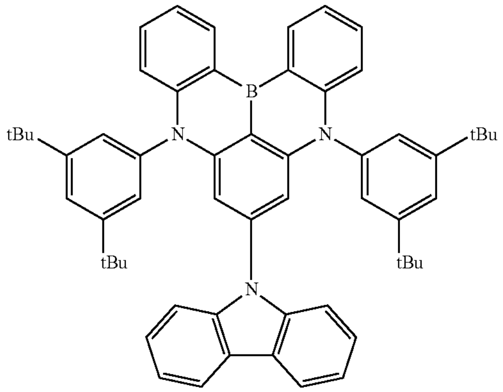
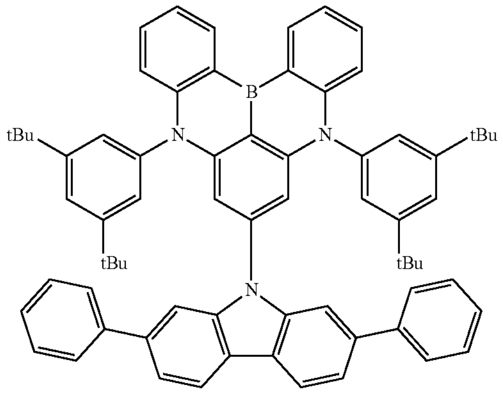
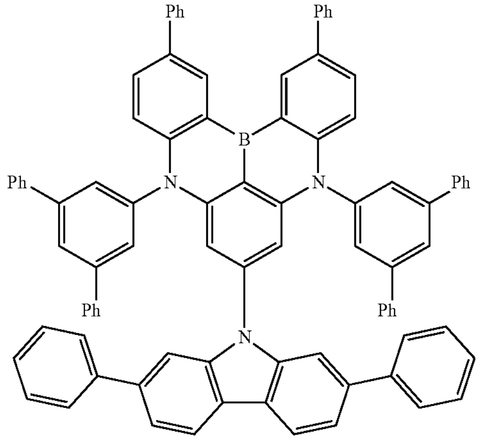
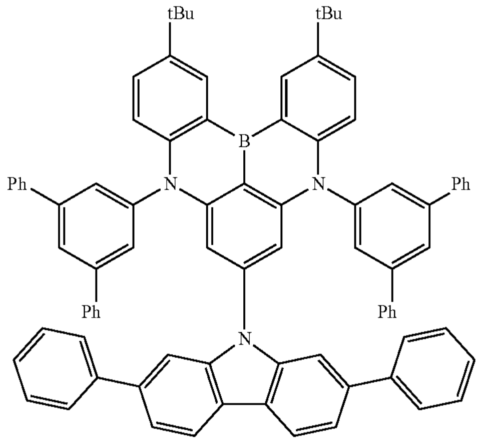

-continued
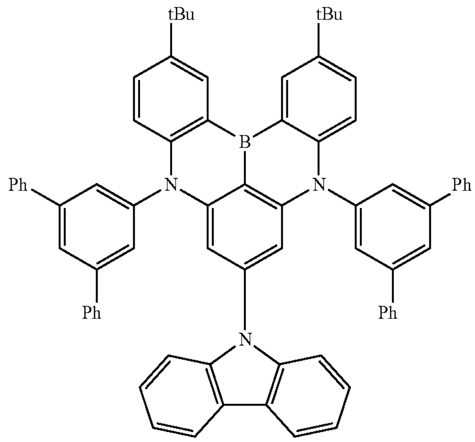
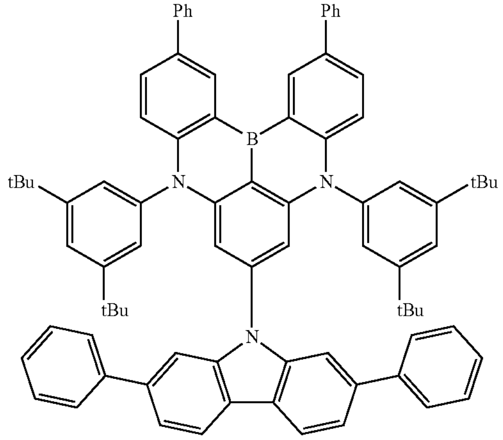
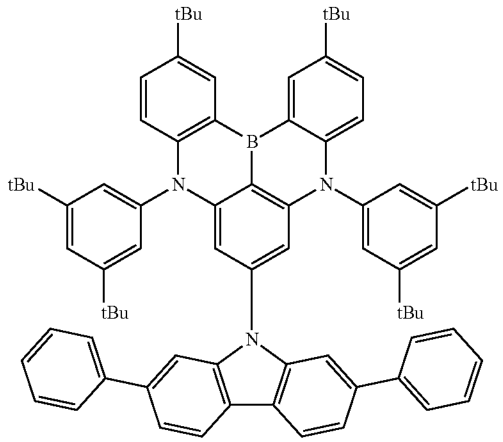
-continued
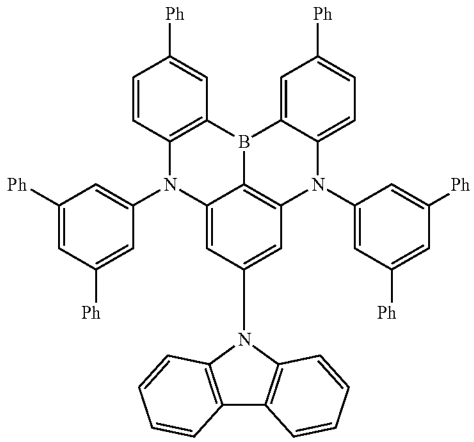 [SMILES: c1ccc(-c2cc(-c3ccccc3)cc(N3c4ccc(-c5ccccc5)cc4B4c5cc(-c6ccccc6)ccc5N(c5cc(-c6ccccc6)cc(-c6ccccc6)c5)c5cc(-n6c7ccccc7c7ccccc76)cc3c54)c2)cc1]
In a one embodiment, the TADF material $E^B$ and/or the emitter material $S^B$ is a green boron-containing NRCT emitter selected from the following group:
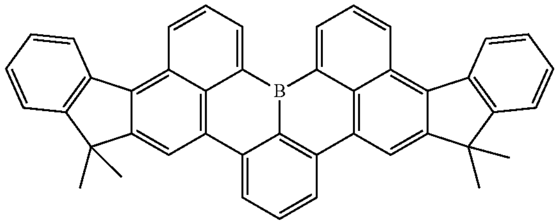
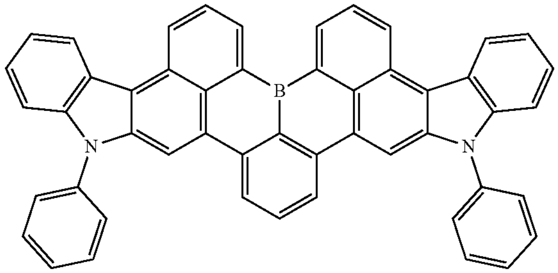
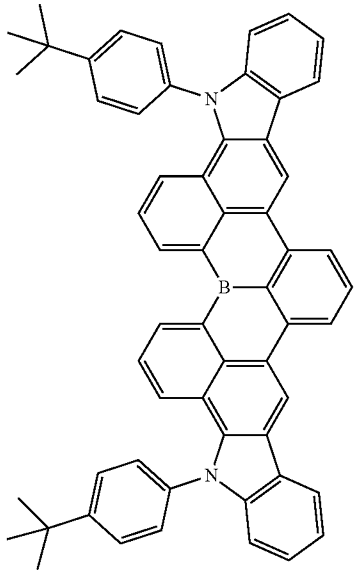

-continued
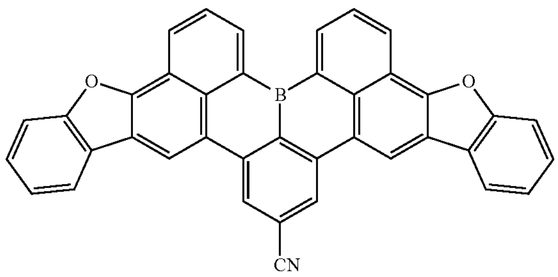
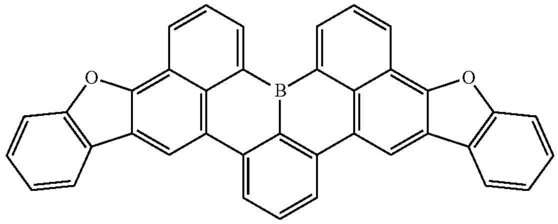
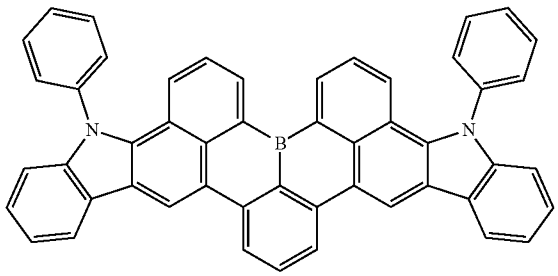
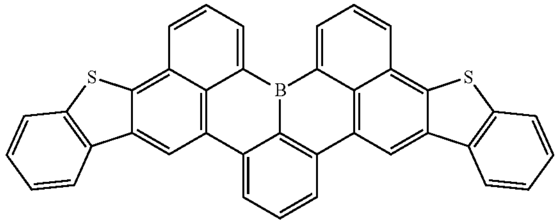
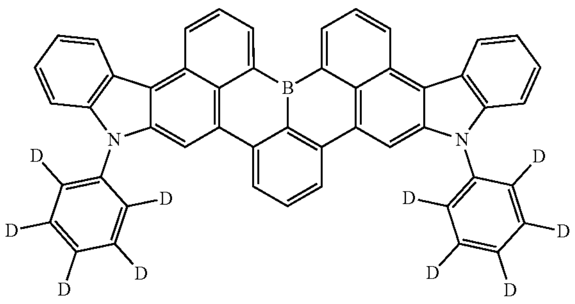
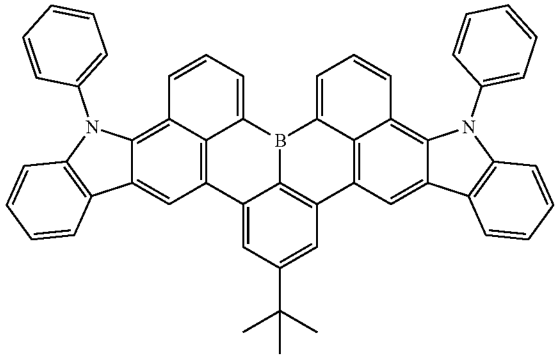
-continued
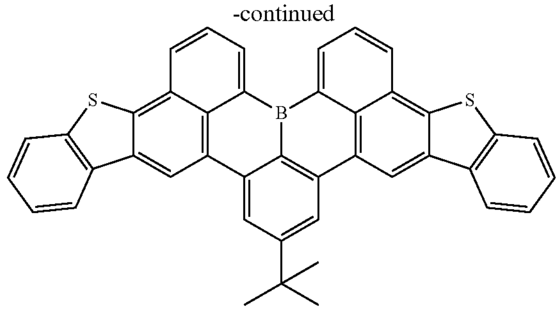
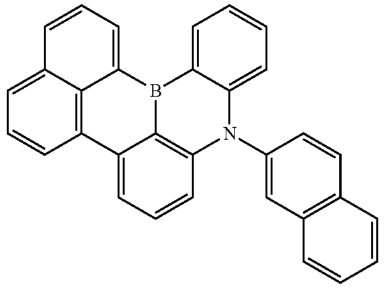
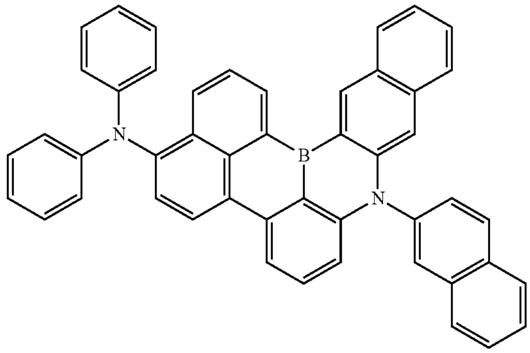
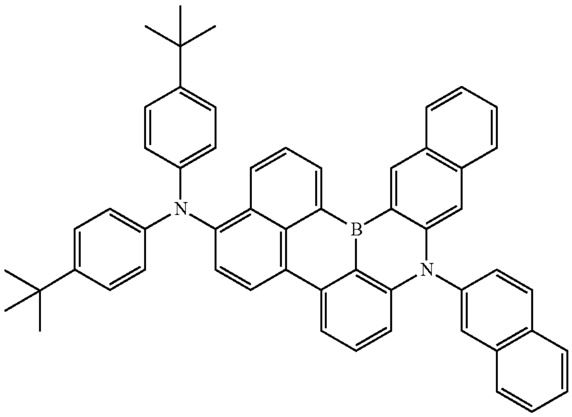
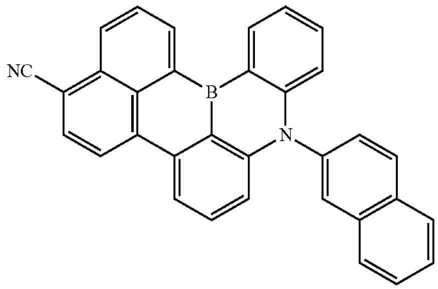

-continued

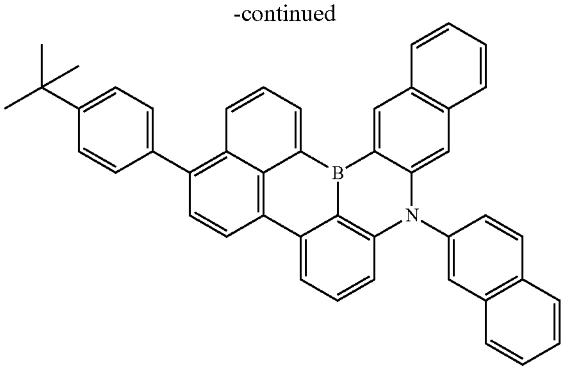

Organic TADF Emitters

In a preferred embodiment, the TADF material $E^B$ and/or the emitter material $S^B$ is an organic TADF material. According to the invention, organic emitter or organic material means that the emitter or material (predominantly) consists of the elements hydrogen (H), carbon (C), nitrogen (N), boron (B), silicon (Si) and optionally fluorine (F), optionally bromine (Br) and optionally oxygen (O). Particularly preferably, it does not contain any transition metals.

In a preferred embodiment, the TADF material $E^B$ is an organic TADF material. In a preferred embodiment, the emitter material $S^B$ is an organic emitter. In a more preferred embodiment, the TADF material $E^B$ and the emitter material $S^B$ are both organic TADF materials.

In a preferred embodiment, the TADF material $E^B$ and/or the emitter material $S^B$ is an organic TADF material, which is chosen from molecules of a structure of Formula I-TADF Formula I-TADF

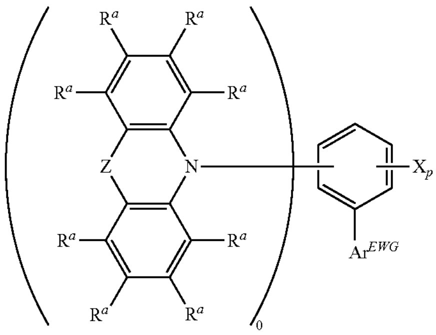

wherein o is at each occurrence independently from another 1 or 2;

p is at each occurrence independently from another 1 or 2;

X is at each occurrence independently from another selected $Ar^{EWG}$, H, CN or $CF_3$;

Z is at each occurrence independently from another selected from the group consisting of a direct bond, $CR^3R^4$, $C{=}CR^3R^4$, $C{=}O$, $C{=}NR^3$, $NR^3$, O, $SiR^3R^4$, S, S(O) and $S(O)_2$;

$Ar^{EWG}$ is at each occurrence independently from another a structure according to one of Formulas IIa to IIk Formula IIa

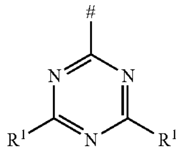

Formula IIb

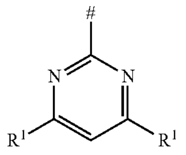

Formula IIc

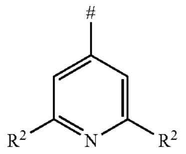

Formula IId

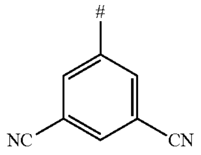

Formula IIe

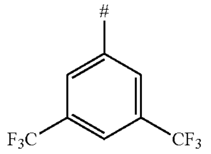

Formula IIf

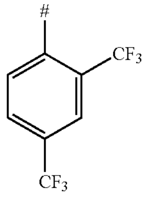

Formula IIg

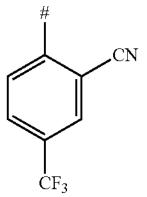

Formula IIh

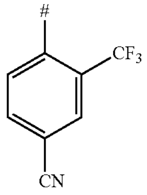

-continued

Formula IIi

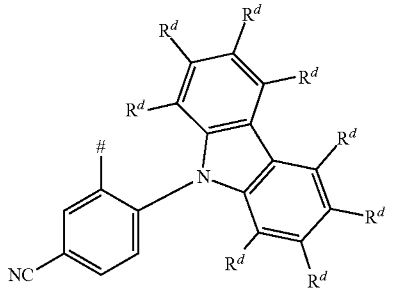

Formula IIj

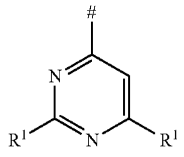

Formula IIk

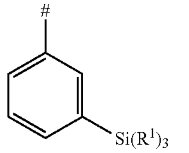

wherein # represents the binding site of the single bond linking $Ar^{EWG}$ to the substituted central phenyl ring of Formula I-TADF;

$R^1$ is at each occurrence independently from another selected from the group consisting of hydrogen, deuterium, $C_1$-$C_5$-alkyl, wherein one or more hydrogen atoms are optionally substituted by deuterium, and $C_6$-$C_{18}$-aryl, which is optionally substituted with one or more substituents $R^6$;

$R^2$ is at each occurrence independently from another selected from the group consisting of hydrogen, deuterium, $C_1$-$C_5$-alkyl, wherein one or more hydrogen atoms are optionally substituted by deuterium, and $C_6$-$C_{18}$-aryl, which is optionally substituted with one or more substituents $R^6$;

$R^a$, $R^3$ and $R^4$ is at each occurrence independently from another selected from the group consisting of hydrogen, deuterium, $N(R^5)_2$, $OR^5$, $SR^5$, $Si(R^5)_3$, $CF_3$, CN, F, $C_1$-$C_{40}$-alkyl which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$;

$C_1$-$C_{40}$-thioalkoxy which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$; and $C_6$-$C_{60}$-aryl which is optionally substituted with one or more substituents $R^5$; $C_3$-$C_{57}$-heteroaryl which is optionally substituted with one or more substituents $R^5$;

$R^5$ is at each occurrence independently from another selected from the group consisting of hydrogen, deuterium, $N(R^6)_2$, $OR^6$, $SR^6$, $Si(R^6)_3$, $CF_3$, CN, F, $C_1$-$C_{40}$-alkyl which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C═O, C═S, C═Se, $C{=}NR^6$, $P({=}O)(R^6)$, SO, $SO_2$, $NR^6$, O, S or $CONR^6$;

$C_6$-$C_{60}$-aryl which is optionally substituted with one or more substituents $R^6$; and $C_3$-$C_{57}$-heteroaryl which is optionally substituted with one or more substituents $R^6$;

$R^6$ is at each occurrence independently from another selected from the group consisting of hydrogen, deuterium, OPh, $CF_3$, CN, F, $C_1$-$C_6$-alkyl, wherein one or more hydrogen atoms are optionally, independently from each other substituted by deuterium, CN, $CF_3$, or F;

$C_1$-$C_5$-alkoxy, wherein one or more hydrogen atoms are optionally, independently from each other substituted by deuterium, CN, $CF_3$, or F;

$C_1$-$C_5$-thioalkoxy, wherein one or more hydrogen atoms are optionally, independently from each other substituted by deuterium, CN, $CF_3$, or F;

$C_6$-$C_{18}$-aryl which is optionally substituted with one or more $C_1$-$C_6$-alkyl substituents;

$C_3$-$C_{17}$-heteroaryl which is optionally substituted with one or more $C_1$-$C_6$-alkyl substituents;

$N(C_6$-$C_{18}$-aryl$)_2$;

$N(C_3$-$C_{17}$-heteroaryl$)_2$, and $N(C_3$-$C_{17}$-heteroaryl$)(C_6$-$C_{18}$-aryl$)$;

$R^d$ is at each occurrence independently from another selected from the group consisting of hydrogen, deuterium, $N(R^5)_2$, $OR^5$, $SR^5$, $Si(R^5)_3$, $CF_3$, CN, F, $C_1$-$C_{40}$-alkyl which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$;

$C_1$-$C_{40}$-thioalkoxy which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$; and $C_6$-$C_{60}$-aryl which is optionally substituted with one or more substituents $R^5$; $C_3$-$C_{57}$-heteroaryl which is optionally substituted with one or more substituents $R^5$;

wherein the substituents $R^a$, $R^3$, $R^4$ or $R^5$ independently from each other optionally may form a mono- or polycyclic, aliphatic, aromatic and/or benzo-fused ring system with one or more substituents $R^a$, $R^3$, $R^4$ or $R^5$ and wherein the one or more substituents $R^d$ independently from each other optionally may form a mono- or polycyclic, aliphatic, aromatic and/or benzo-fused ring system with one or more substituents $R^d$.

According to the invention, the substituents $R^a$, $R^3$, $R^4$ or $R^5$ at each occurrence independently from each other may optionally form a mono- or polycyclic, aliphatic, aromatic and/or benzo-fused ring system with one or more substituents $R^a$, $R^3$, $R^4$ or $R^5$.

According to the invention, the substituents $R^d$ at each occurrence independently from each other may optionally form a mono- or polycyclic, aliphatic, aromatic and/or benzo-fused ring system with one or more other substituents $R^d$.

In a particularly preferred embodiment of the invention, Z is a direct bond at each occurrence.

In a preferred embodiment, the TADF material $E^B$ is an organic TADF material, which is chosen from molecules of a structure of Formula I-TADF.

In one embodiment of the invention, the TADF material $E^B$ comprises at least one triazine structure according to Formula IIa.

In a preferred embodiment, the TADF material $E^B$ is an organic TADF material, which is chosen from molecules of a structure of Formula II-TADF Formula II-TADF

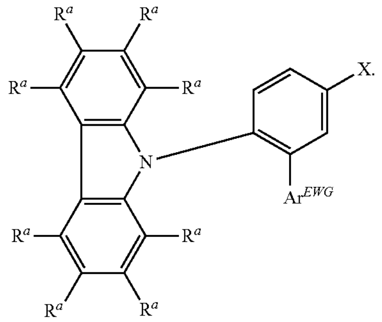

In one embodiment of the invention, $R^a$ is at each occurrence independently from another selected from the group consisting of hydrogen, deuterium, Me, $^{i}$Pr, $^{t}$Bu, CN, $CF_3$, Ph, which is optionally substituted with one or more substituents independently from each other selected from the group consisting of Me, $^{i}$Pr, $^{t}$Bu, CN, $CF_3$ and Ph;

pyridinyl, which is optionally substituted with one or more substituents independently from each other selected from the group consisting of Me, $^{i}$Pr, $^{t}$Bu, CN, $CF_3$ and Ph;

pyrimidinyl, which is optionally substituted with one or more substituents independently from each other selected from the group consisting of Me, $^{i}$Pr, $^{t}$Bu, CN, $CF_3$ and Ph;

carbazolyl, which is optionally substituted with one or more substituents independently from each other selected from the group consisting of Me, $^{i}$Pr, $^{t}$Bu, CN, $CF_3$ and Ph;

triazinyl, which is optionally substituted with one or more substituents independently from each other selected from the group consisting of Me, $^{i}$Pr, $^{t}$Bu, CN, $CF_3$ and Ph; and $N(Ph)_2$.

In one embodiment of the invention, $R^d$ is at each occurrence independently from another selected from the group consisting of hydrogen, deuterium, Me, $^{i}$Pr, $^{t}$Bu, CN, $CF_3$, Ph, which is optionally substituted with one or more substituents independently from each other selected from the group consisting of Me, $^{i}$Pr, $^{t}$Bu, CN, $CF_3$ and Ph;

pyridinyl, which is optionally substituted with one or more substituents independently from each other selected from the group consisting of Me, $^{i}$Pr, $^{t}$Bu, CN, $CF_3$ and Ph;

pyrimidinyl, which is optionally substituted with one or more substituents independently from each other selected from the group consisting of Me, $^{i}$Pr, $^{t}$Bu, CN, $CF_3$ and Ph;

carbazolyl, which is optionally substituted with one or more substituents independently from each other selected from the group consisting of Me, $^{i}$Pr, $^{t}$Bu, CN, $CF_3$ and Ph;

triazinyl, which is optionally substituted with one or more substituents independently from each other selected from the group consisting of Me, $^{i}$Pr, $^{t}$Bu, CN, $CF_3$ and Ph; and $N(Ph)_2$.

In a preferred embodiment, X is CN.

In one embodiment of the invention, the TADF material $E^B$ is chosen from a structure of Formula III:

(Formula III)

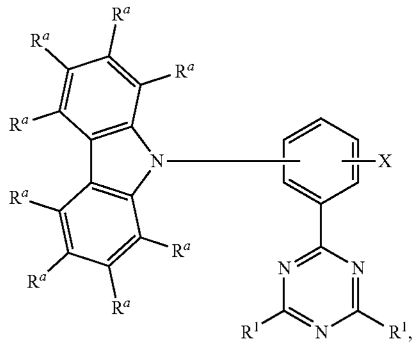

wherein $R^a$, X and $R^1$ are defined as above.

In one embodiment of the invention, $E^B$ is chosen from molecules of a structure of Formula IIIa:

(Formula IIIa)

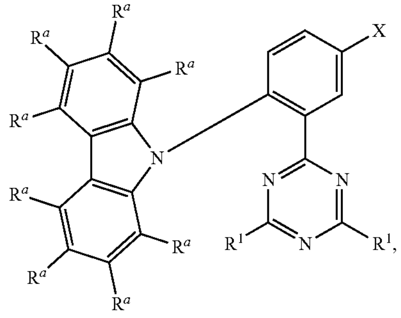

wherein $R^a$, X and $R^1$ are defined as above.

In one embodiment of the invention, $E^B$ is chosen from molecules of a structure of Formula IIIa-1:

(Formula IIIa-1)

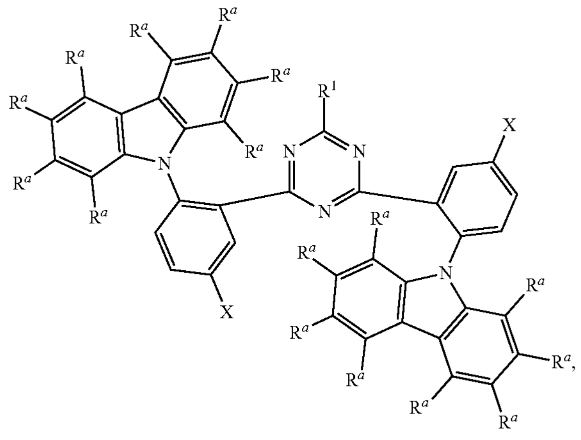

wherein $R^a$, X and $R^1$ are defined as above.

In one embodiment of the invention, $E^B$ is chosen from molecules of a structure of Formula IIIa-2:

(Formula IIIa-2)

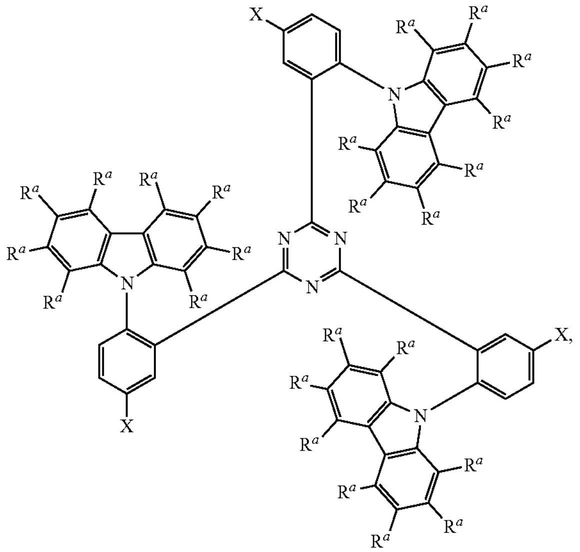

wherein $R^a$, X and $R^1$ are defined as above.

In one embodiment of the invention, $E^B$ is chosen from molecules of a structure of Formula IIIb:

(Formula IIIb)

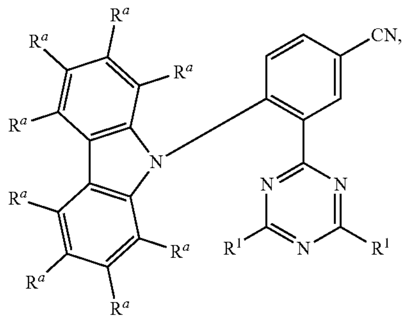

wherein $R^a$ and $R^1$ are defined as above.

In one embodiment of the invention, $E^B$ is chosen from molecules of a structure of Formula IIIa-1:

(Fromula IIIb-1)

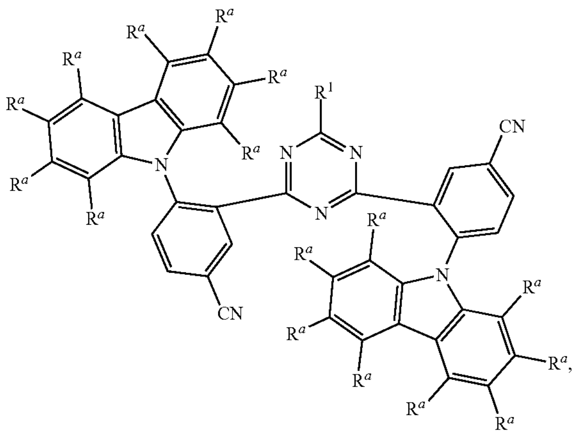

wherein $R^a$ and $R^1$ are defined as above.

In one embodiment of the invention, $E^B$ is chosen from molecules of a structure of Formula IIIc:

(Formula IIIc)

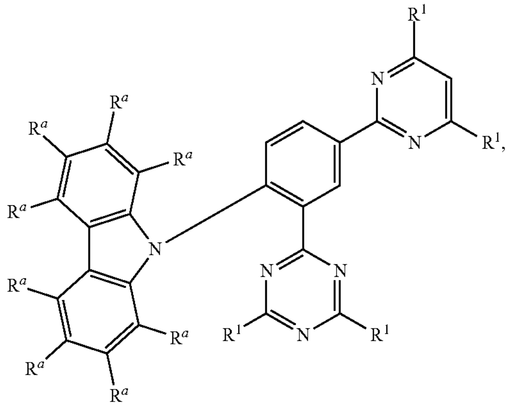

wherein $R^a$ and $R^1$ are defined as above.

In one embodiment of the invention, $E^B$ is chosen from molecules of a structure of Formula IIId:

(Formula IIId)

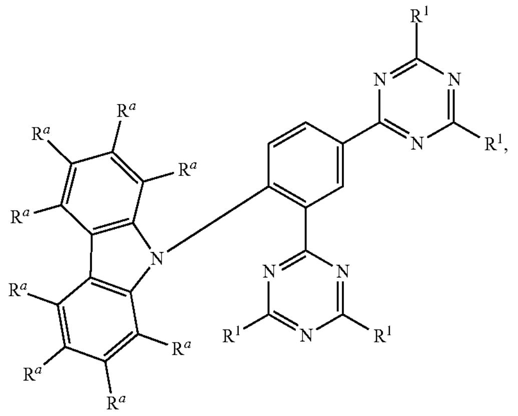

wherein $R^a$ and $R^1$ are defined as above.

In one embodiment of the invention, $E^B$ is chosen from molecules of a structure of Formula IV:

(Formula IV)

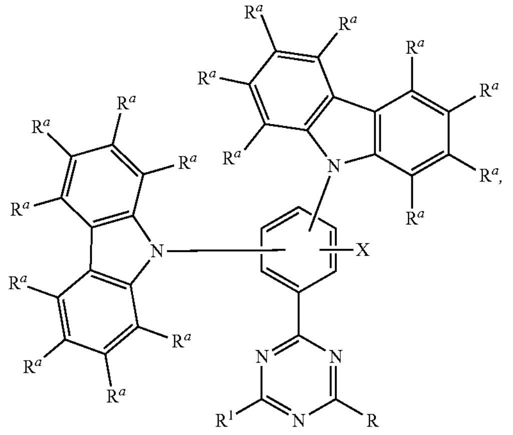

wherein $R^a$, $R^1$ and X are defined as above.

In one embodiment of the invention, $E^B$ is chosen from molecules of a structure of Formula IVa:

(Formula IVa)

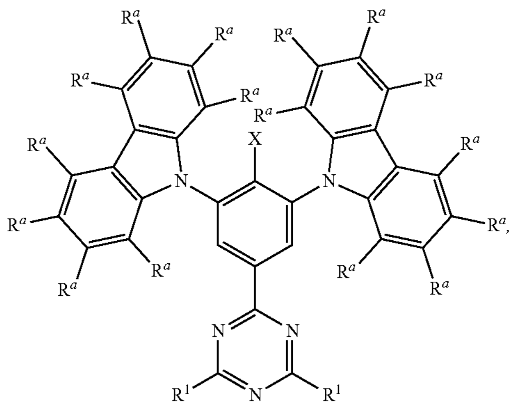

wherein $R^a$, $R^1$ and X are defined as above.

In one embodiment of the invention, $E^B$ is chosen from molecules of a structure of Formula IVb:

(Formula IVb)

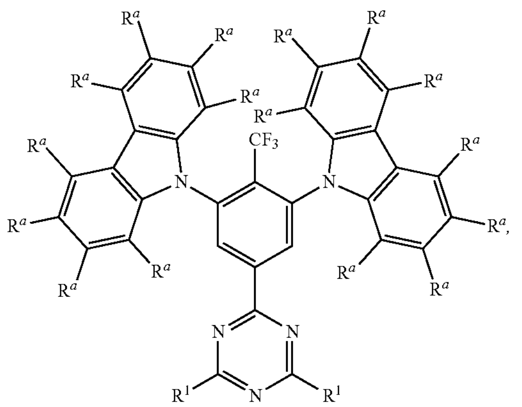

wherein $R^a$ and $R^1$ are defined as above.

In one embodiment of the invention, $E^B$ is chosen from molecules of a structure of Formula V:

(Formula V)

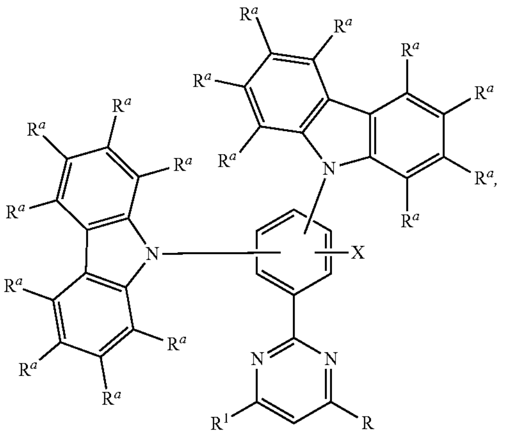

wherein $R^a$, $R^1$ and X are defined as above.

In one embodiment of the invention, $E^B$ is chosen from molecules of a structure of Formula Va:

(Formula Va)

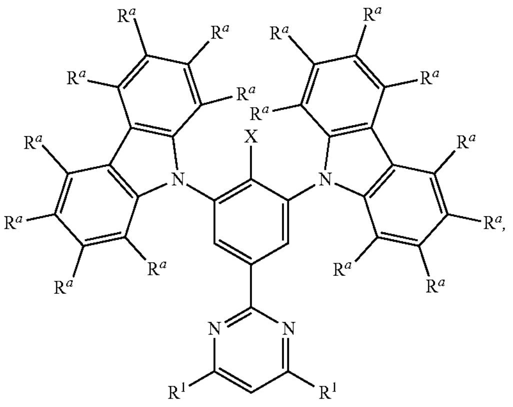

wherein $R^a$, $R^1$ and X are defined as above.

In one embodiment of the invention, $E^B$ is chosen from molecules of a structure of Formula Vb:

(Formula Vb)

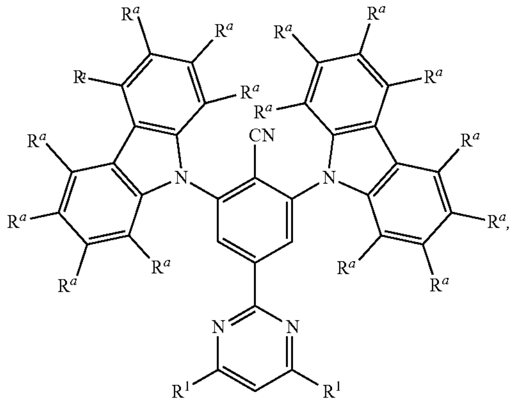

wherein $R^a$ and $R^1$ are defined as above.

In one embodiment of the invention, $E^B$ is chosen from molecules of a structure of Formula VI:

(Formula VI)

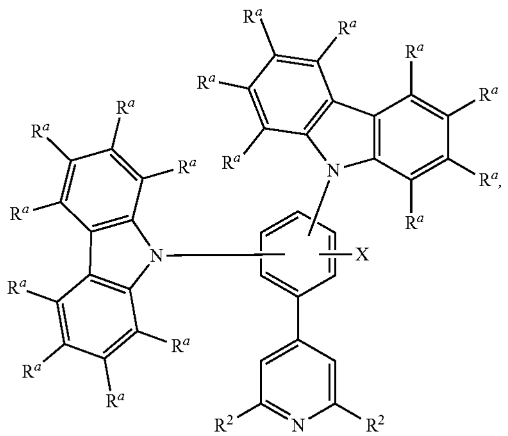

wherein $R^a$, $R^1$ and X are defined as above.

In one embodiment of the invention, $E^B$ is chosen from molecules of a structure of Formula VIa:

(Formula Via)

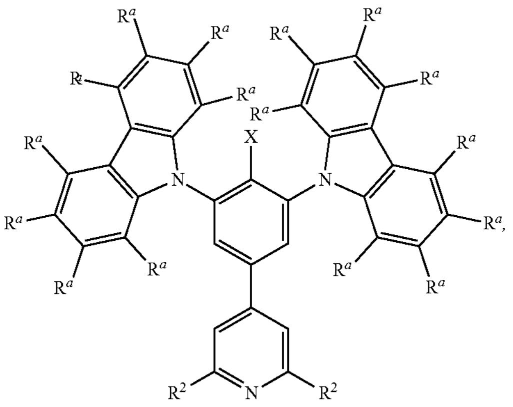

wherein $R^a$, $R^1$ and X are defined as above.

In one embodiment of the invention, $E^B$ is chosen from molecules of a structure of Formula VIb:

(Formula VIb)

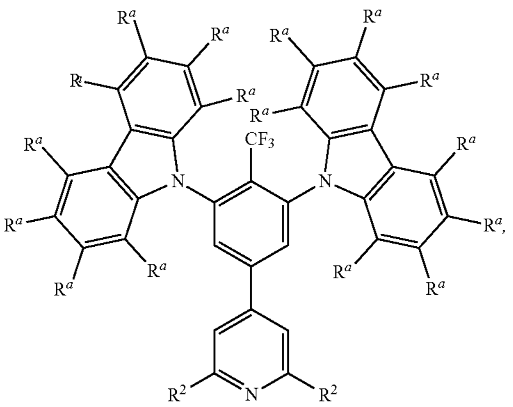

wherein $R^a$ and $R^1$ are defined as above.

In one embodiment of the invention, $E^B$ is chosen from molecules of a structure of Formula VII:

(Formula VII)

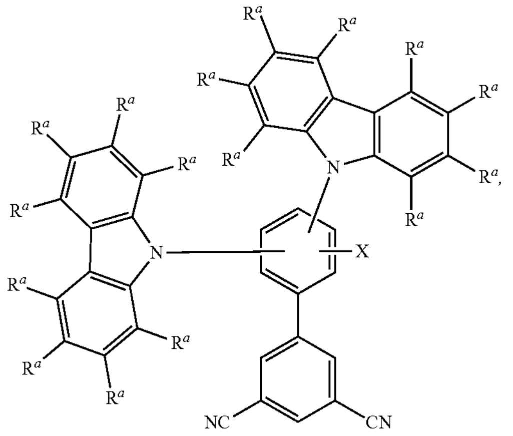

wherein $R^a$ and X are defined as above.

In one embodiment of the invention, $E^B$ is chosen from molecules of a structure of Formula VIIa:

(Formula VIIa)

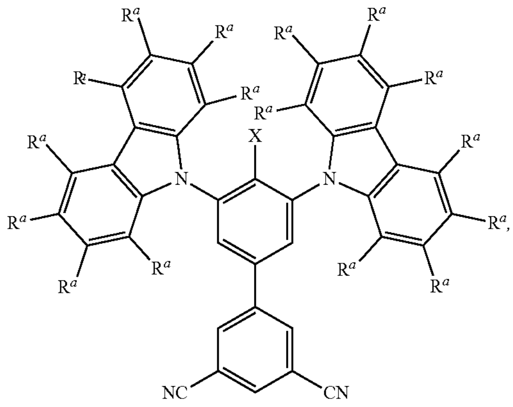

wherein $R^a$ and X are defined as above.

In one embodiment of the invention, $E^B$ is chosen from molecules of a structure of Formula VIIb:

(Formula VIIb)

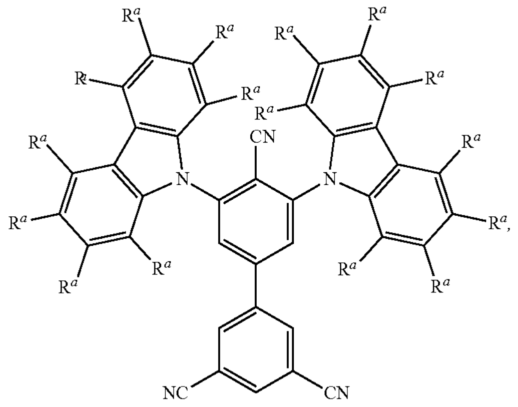

wherein $R^a$ is defined as above.

In one embodiment of the invention, $E^B$ is chosen from molecules of a structure of Formula VIII:

(Formula VIII)

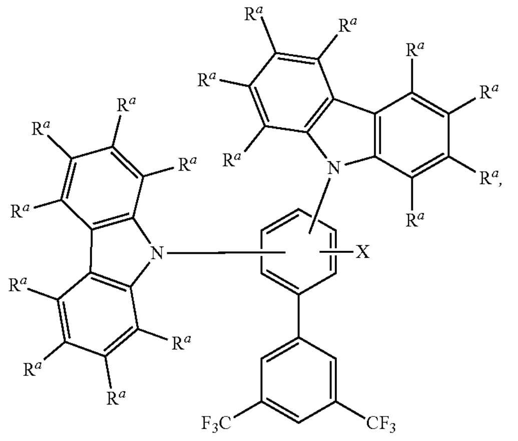

wherein $R^a$ and X are defined as above.

In one embodiment of the invention, $E^B$ is chosen from molecules of a structure of Formula VIIIa:

(Formula VIIIa)

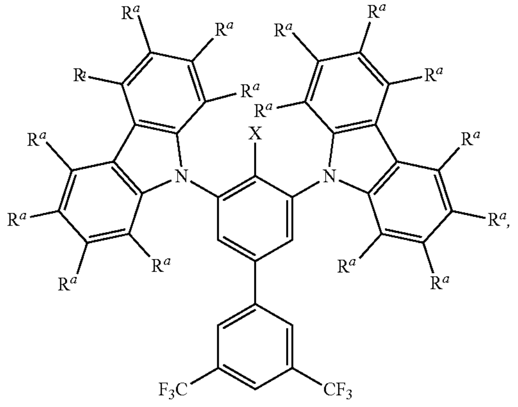

wherein $R^a$ and X are defined as above.

In one embodiment of the invention, $E^B$ is chosen from molecules of a structure of Formula VIIIb:

(Formula VIIIb)

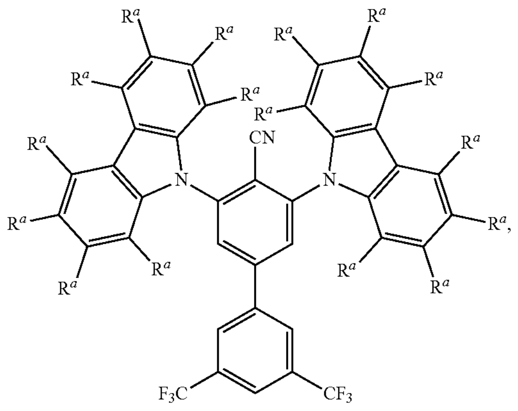

wherein $R^a$ is defined as above.

In one embodiment of the invention, $E^B$ is chosen from molecules of a structure of Formula IX:

(Formula IX)

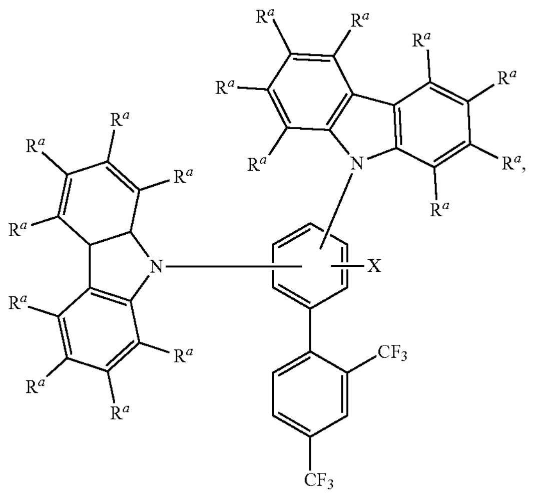

wherein $R^a$ and X are defined as above.

In one embodiment of the invention, $E^B$ is chosen from molecules of a structure of Formula IXa:

(Formula IXa)

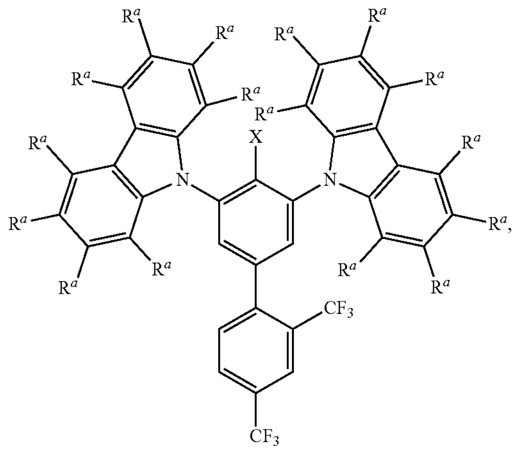

wherein $R^a$ and X are defined as above.

In one embodiment of the invention, $E^B$ is chosen from molecules of a structure of Formula IXb:

(Formula IXb)

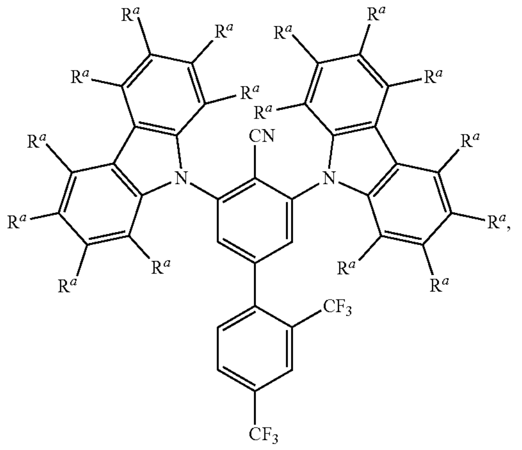

wherein $R^a$ is defined as above.

In one embodiment of the invention, $E^B$ is chosen from molecules of a structure of Formula X:

(Formula X)

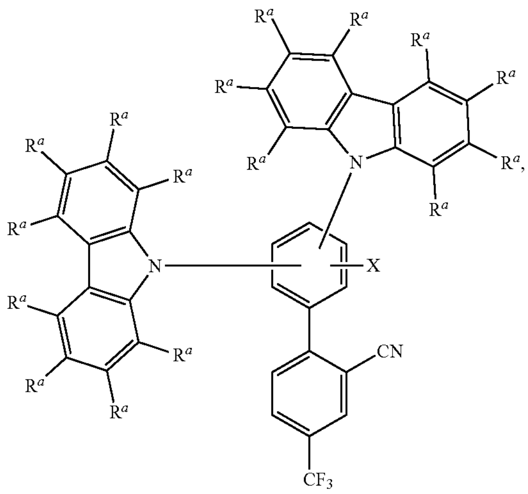

wherein $R^a$ and X are defined as above.

In one embodiment of the invention, $E^B$ is chosen from molecules of a structure of Formula Xa:

(Formula Xa)

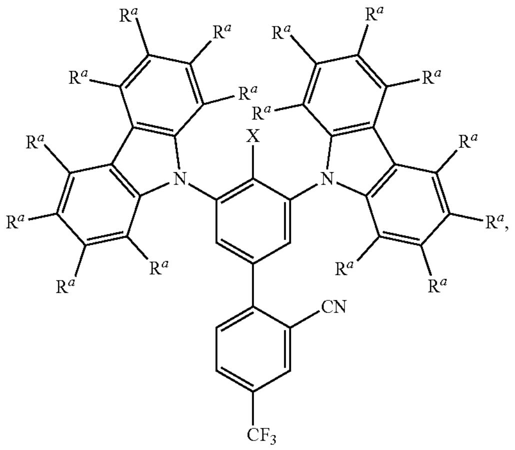

wherein $R^a$ and X are defined as above.

In one embodiment of the invention, $E^B$ is chosen from molecules of a structure of Formula Xb:

(Formula Xb)

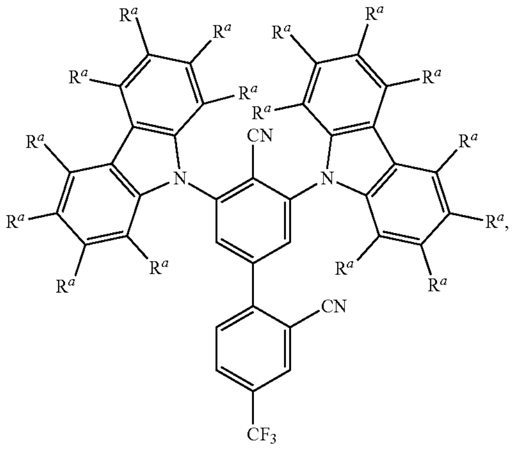

wherein $R^a$ is defined as above.

In one embodiment of the invention, $E^B$ is chosen from molecules of a structure of Formula XI:

(Formula XI)

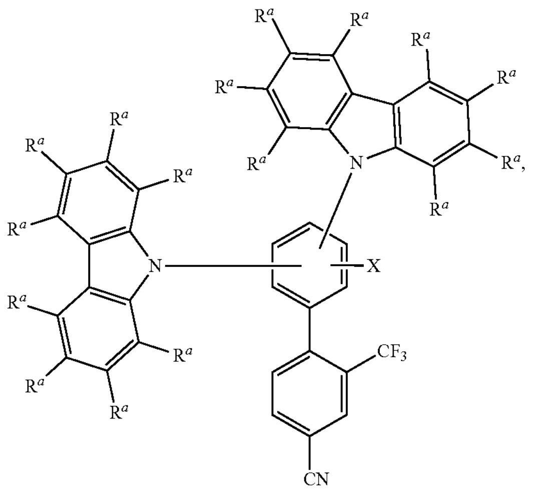

wherein $R^a$ and X are defined as above.

In one embodiment of the invention, $E^B$ is chosen from molecules of a structure of Formula XIa:

(Formula Xia)

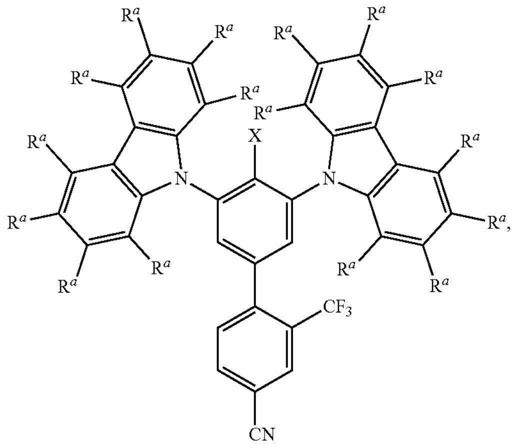

wherein $R^a$ and X are defined as above.

In one embodiment of the invention, $E^B$ is chosen from molecules of a structure of Formula XIb:

(Formula XIb)

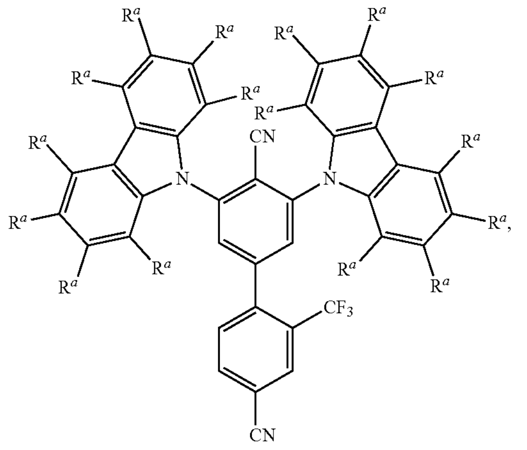

wherein $R^a$ is defined as above.

In one embodiment of the invention, $E^B$ is chosen from molecules of a structure of Formula XII:

(Formula XII)

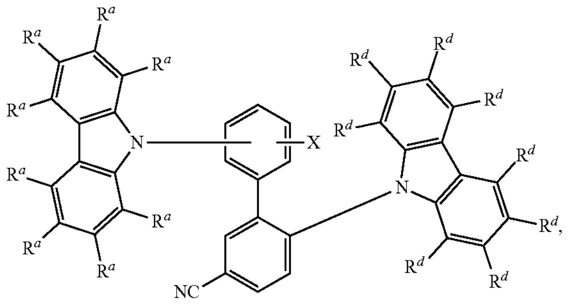

wherein $R^a$, X and $R^d$ are defined as above.

In one embodiment of the invention, $E^B$ is chosen from molecules of a structure of Formula XIIa:

(Formula XIIa)

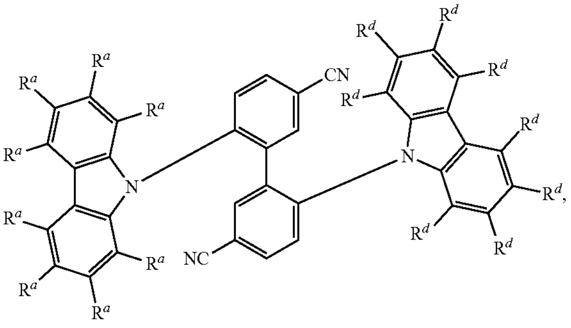

wherein $R^a$, X and $R^d$ are defined as above.

In one embodiment of the invention, $E^B$ is chosen from molecules of a structure of Formula XIIb:

(Formula XIIb)

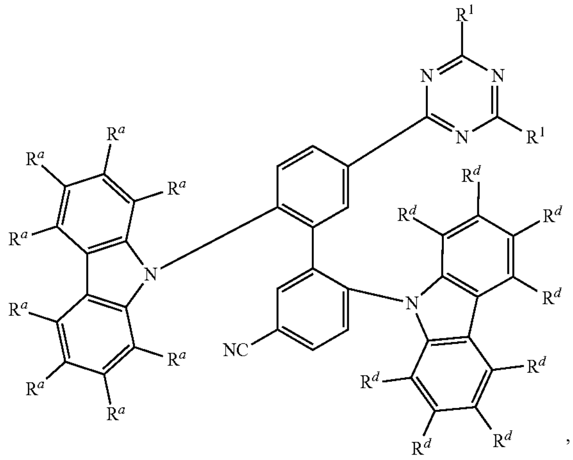

, wherein $R^a$, X and $R^d$ are defined as above.

The synthesis of the molecules of a structure of Formula I-TADF can be accomplished via standard reactions and reaction conditions known to the skilled artesian. Typically, in a first step a coupling reaction, preferably a palladium catalyzed coupling reaction, is performed.

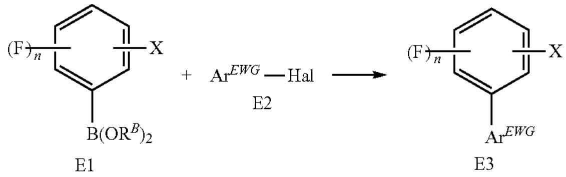

E1 E2 E3

E1 can be any boronic acid ($R^B$=H) or an equivalent boronic acid ester ($R^B$=alkyl or aryl), in particular two $R^B$ form a ring to give e.g. boronic acid pinacol esters, of fluoro-(trifluoromethyl)phenyl, difluoro-(trifluoromethyl) phenyl, fluoro-(cyano)phenyl or difluoro-(cyano)phenyl. As second reactant E2 preferably $Ar^{EWG}$—Br is used. Reaction conditions of such palladium catalyzed coupling reactions are known the person skilled in the art, e.g. from WO 2017/005699, and it is known that the reacting groups of E1 and E2 can be interchanged to optimize the reaction yields.

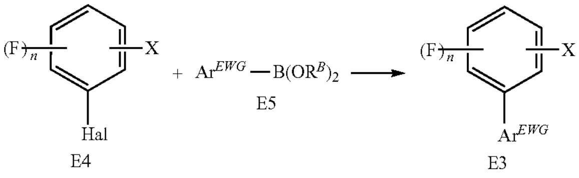

E4 E5 E3

In a second step, the molecules according to Formula I-TADF are obtained via the reaction of a nitrogen heterocycle in a nucleophilic aromatic substitution with the aryl halide, preferably aryl fluoride, or aryl dihalide, preferably aryl difluoride, E3. Typical conditions include the use of a base, such as tribasic potassium phosphate or sodium hydride, for example, in an aprotic polar solvent, such as dimethyl sulfoxide (DMSO) or N,N-dimethylformamide (DMF), for example.

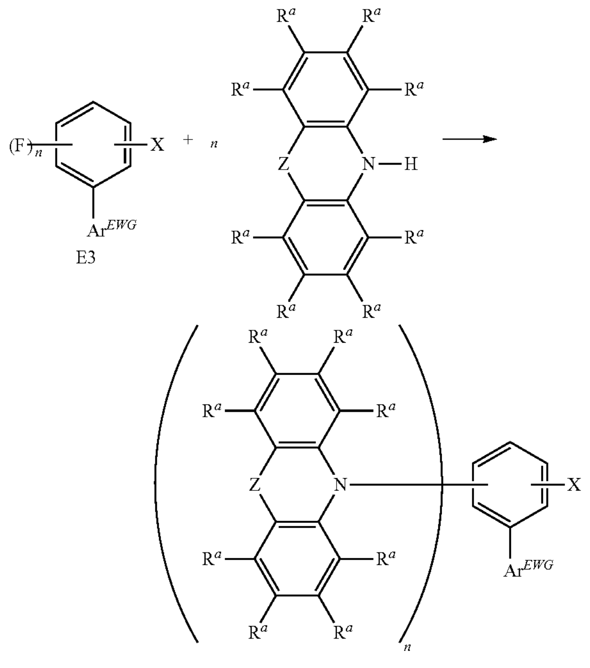

In particular, the donor molecule E6 is a 3,6-substituted carbazole (e.g., 3,6-dimethylcarbazole, 3,6 diphenylcarbazole, 3,6-di-tert-butylcarbazole), a 2,7-substituted carbazole (e.g., 2,7 dimethylcarbazole, 2,7-diphenylcarbazole, 2,7-di-tert-butylcarbazole), a 1,8-substituted carbazole (e.g., 1,8- dimethylcarbazole, 1,8-diphenylcarbazole, 1,8-di-tert-butylcarbazole), a 1 substituted carbazole (e.g., 1-methylcarbazole, 1-phenylcarbazole, 1-tert-butylcarbazole), a 2 substituted carbazole (e.g., 2-methylcarbazole, 2-phenylcarbazole, 2-tert-butylcarbazole), or a 3 substituted carbazole (e.g., 3-methylcarbazole, 3-phenylcarbazole, 3-tert-butylcarbazole).

Alternatively, a halogen-substituted carbazole, particularly 3-bromocarbazole, can be used as E6.

In a subsequent reaction a boronic acid ester functional group or boronic acid functional group may be exemplarily introduced at the position of the one or more halogen substituents, which was introduced via E6, to yield the corresponding carbazol-3-ylboronic acid ester or carbazol-3-ylboronic acid, e.g., via the reaction with bis(pinacolato) diboron (CAS No. 73183-34-3). Subsequently, one or more substituents $R^a$ may be introduced in place of the boronic acid ester group or the boronic acid group via a coupling reaction with the corresponding halogenated reactant $R^a$-Hal, preferably $R^a$—Cl and $R^a$—Br.

Alternatively, one or more substituents $R^a$ may be introduced at the position of the one or more halogen substituents, which was introduced via D-H, via the reaction with a boronic acid of the substituent $R^a$ [$R^a$—$B(OH)_2$] or a corresponding boronic acid ester.

An alternative synthesis route comprises the introduction of a nitrogen heterocycle via copper- or palladium-catalyzed coupling to an aryl halide or aryl pseudohalide, preferably an aryl bromide, an aryl iodide, aryl triflate or an aryl tosylate.

Device Wherein the Emitter Material $S^B$ is a Blue Fluorescence Emitter

In one embodiment of the invention, the emitter material $S^B$ is a fluorescence emitter, in particular a blue fluorescence emitter.

In one embodiment, the emitter material $S^B$ is a blue fluorescence emitter selected from the following group:

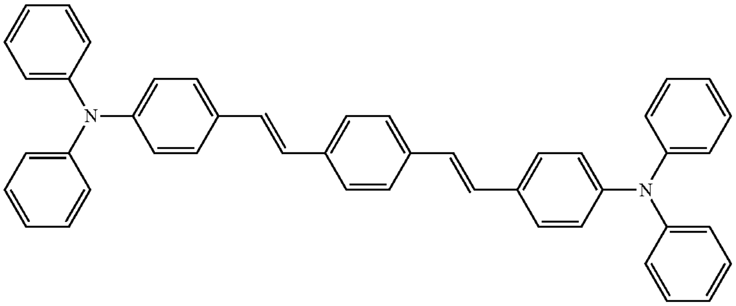

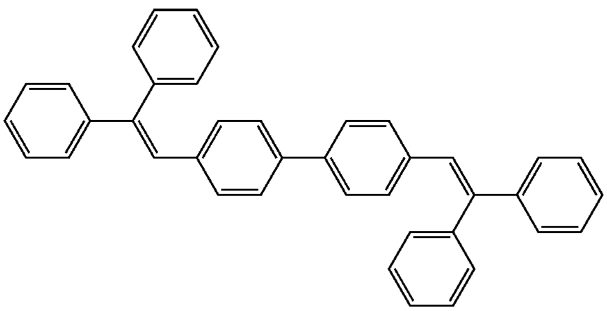

-continued
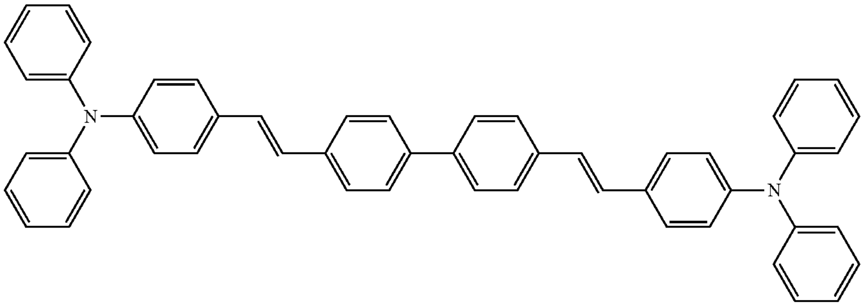
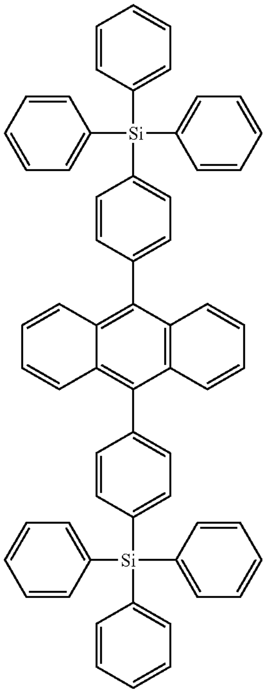
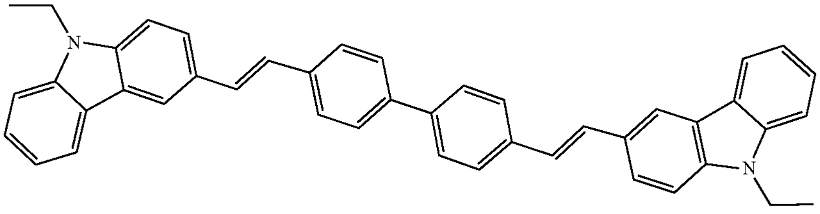
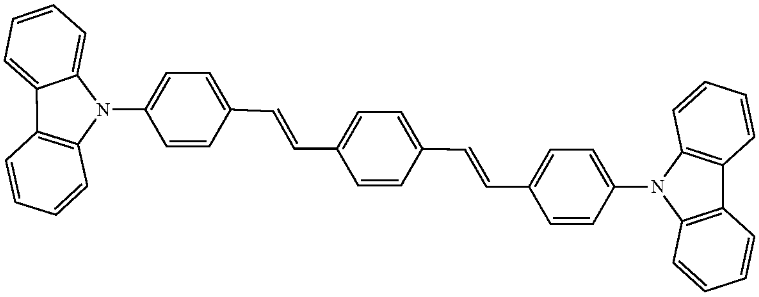
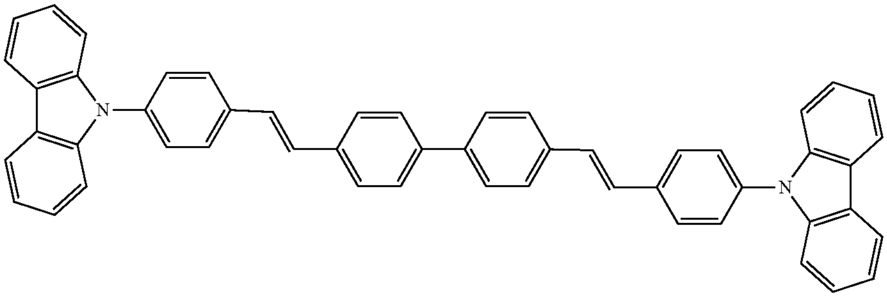

-continued
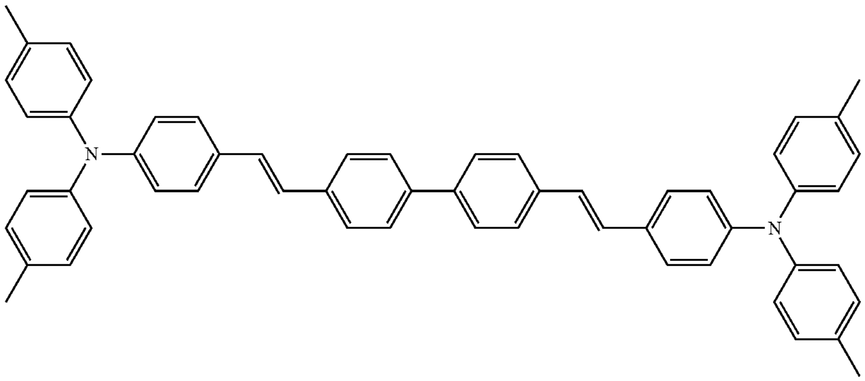
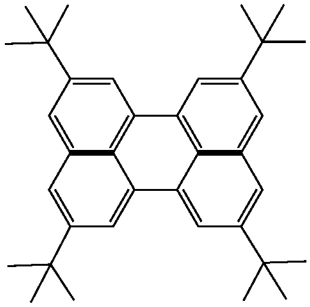
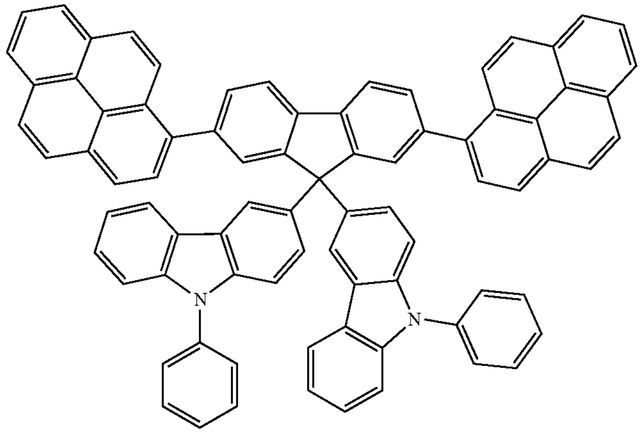
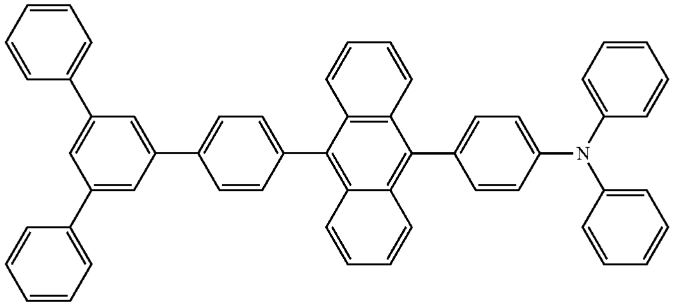

-continued
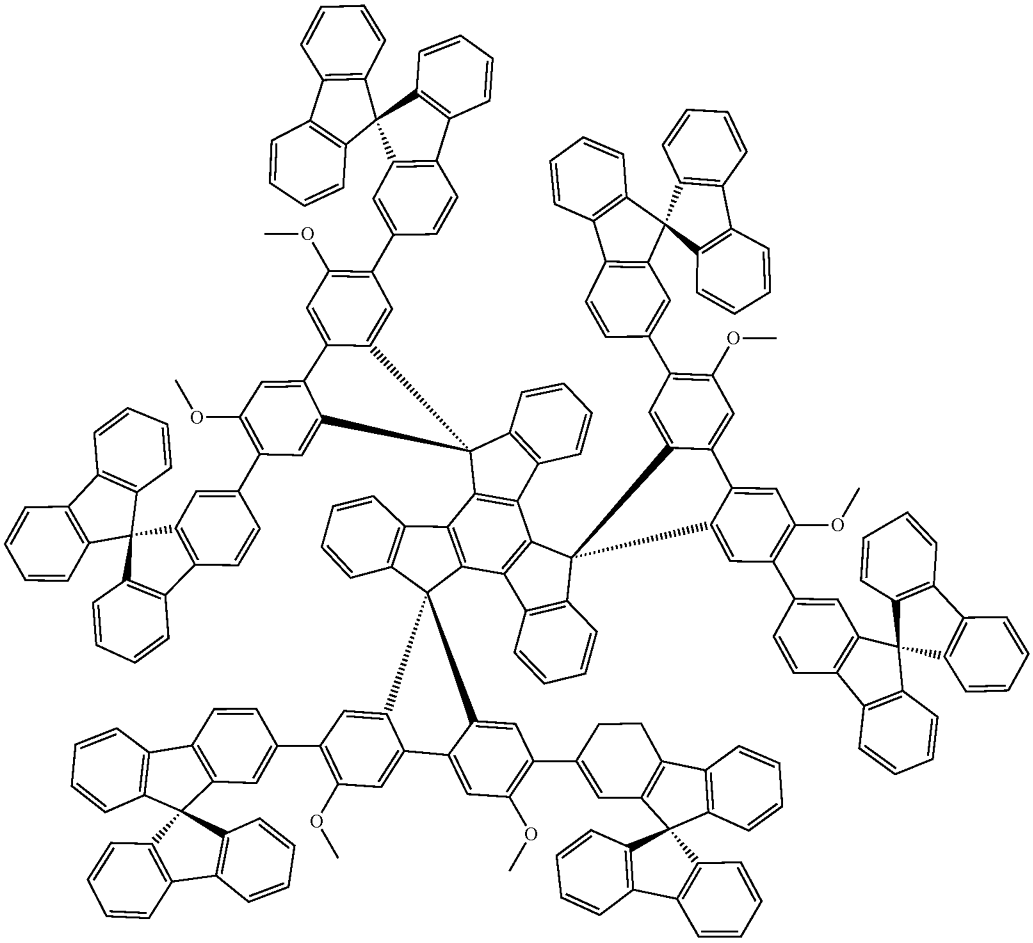
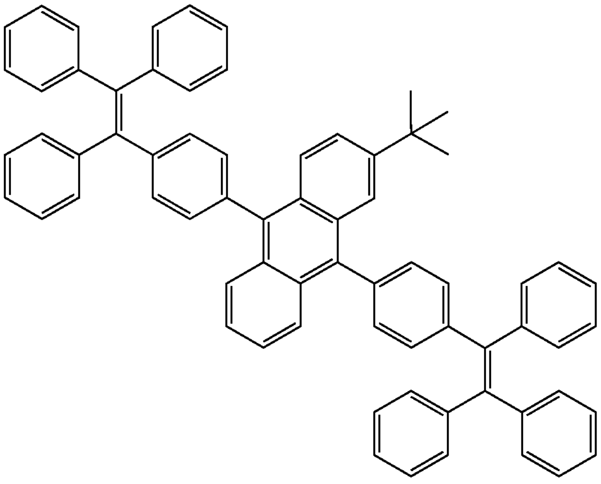

-continued
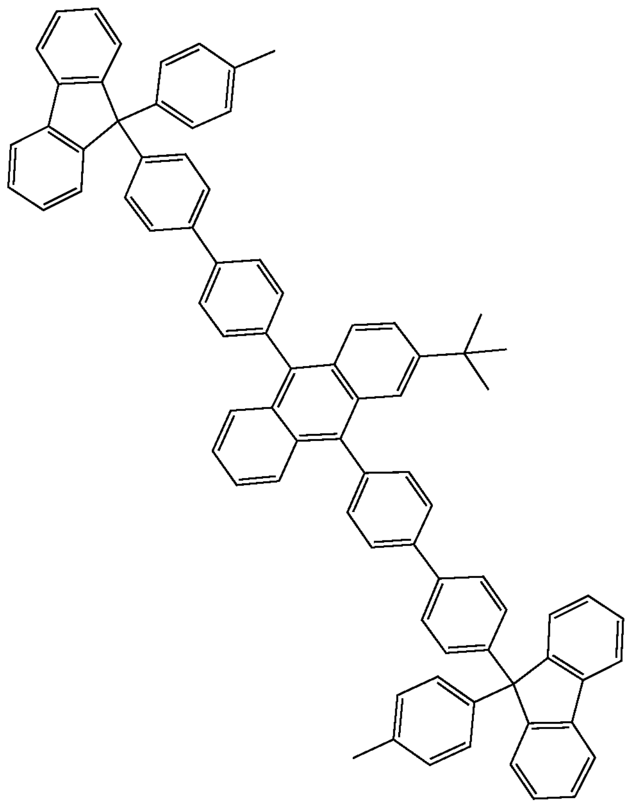
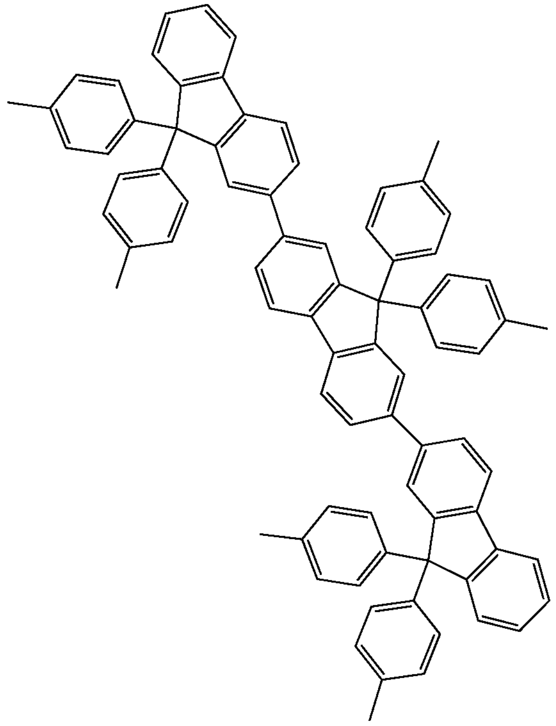

-continued
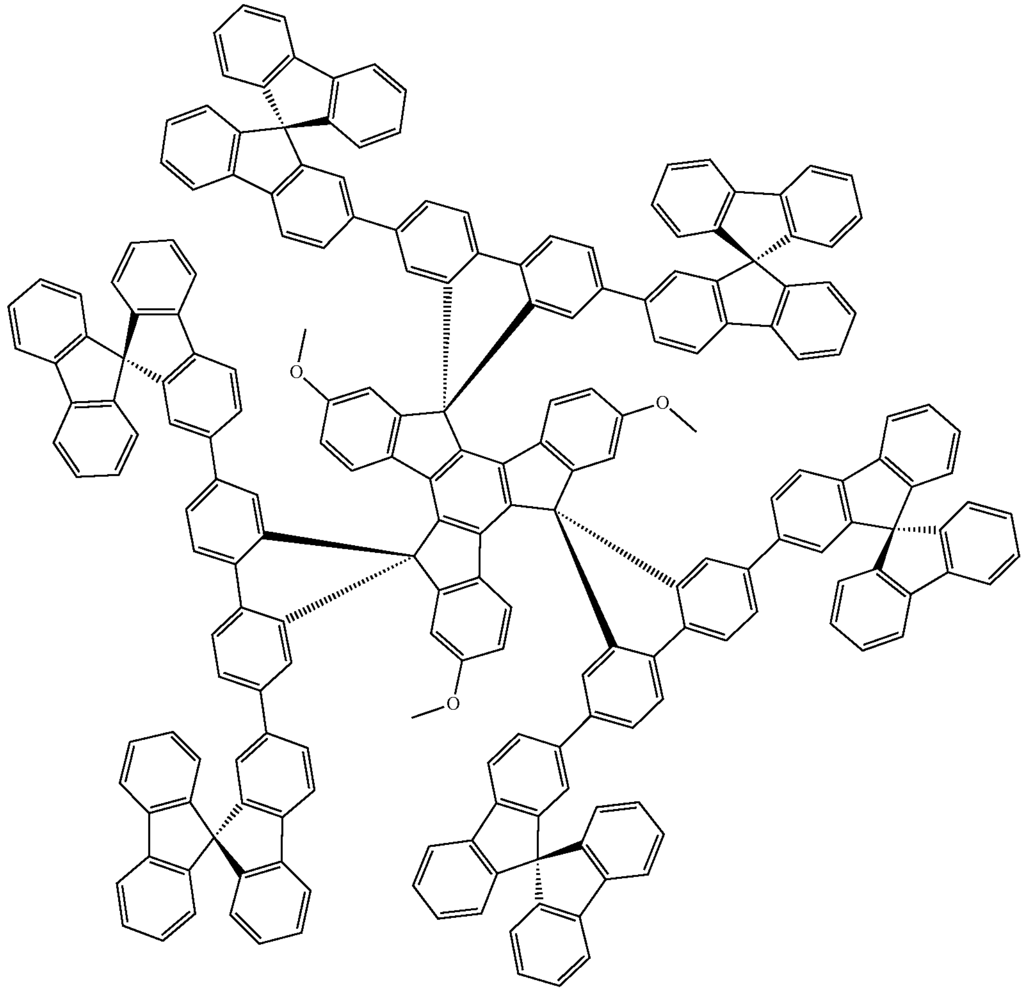
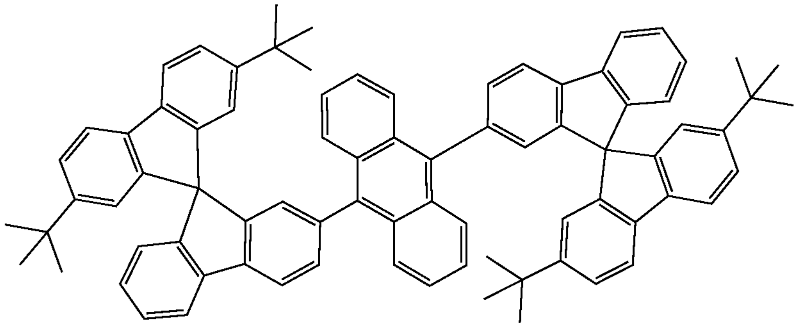

-continued
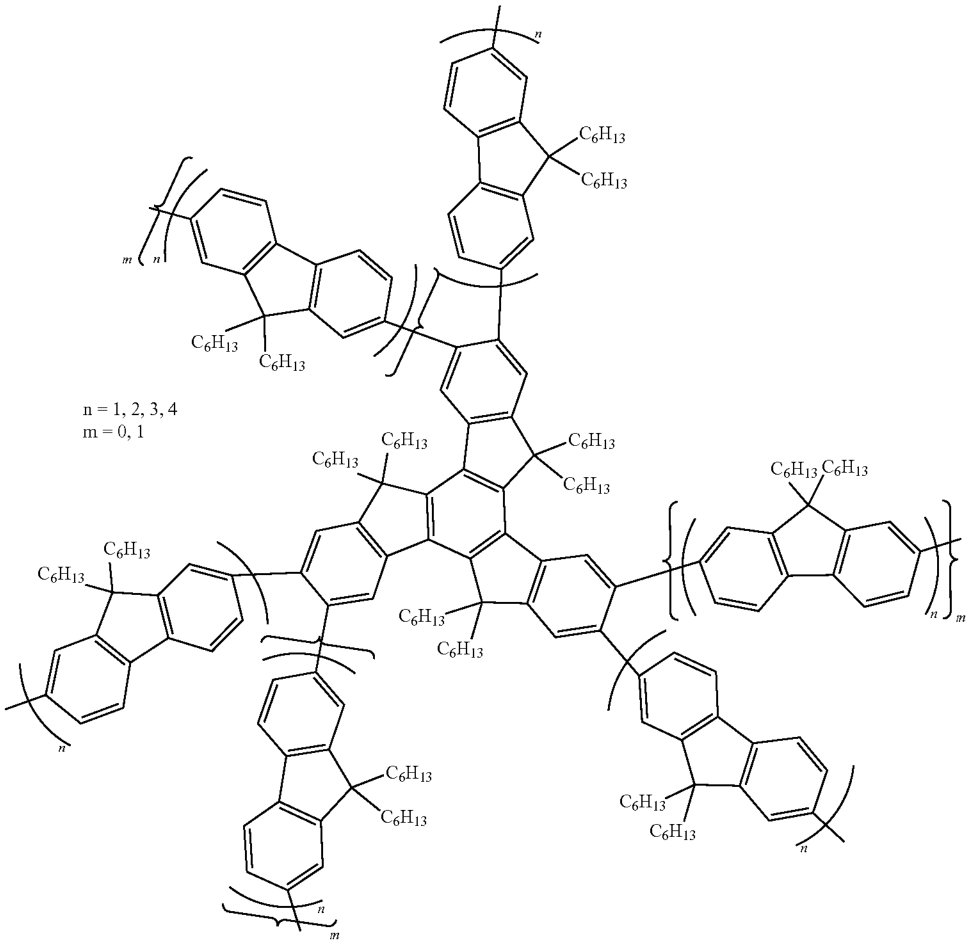
n = 1, 2, 3, 4
m = 0, 1

-continued
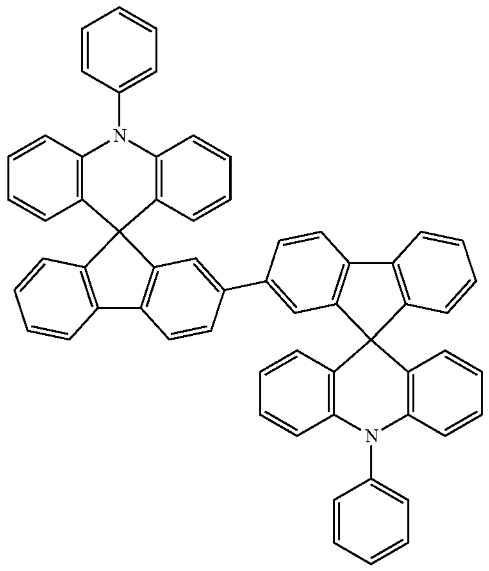
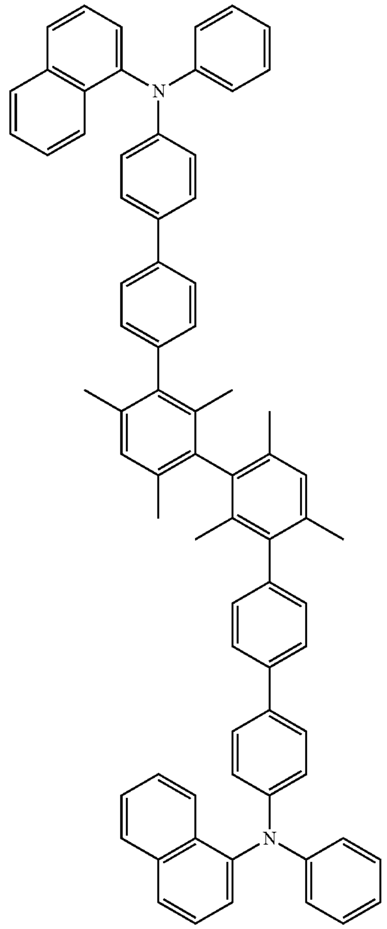
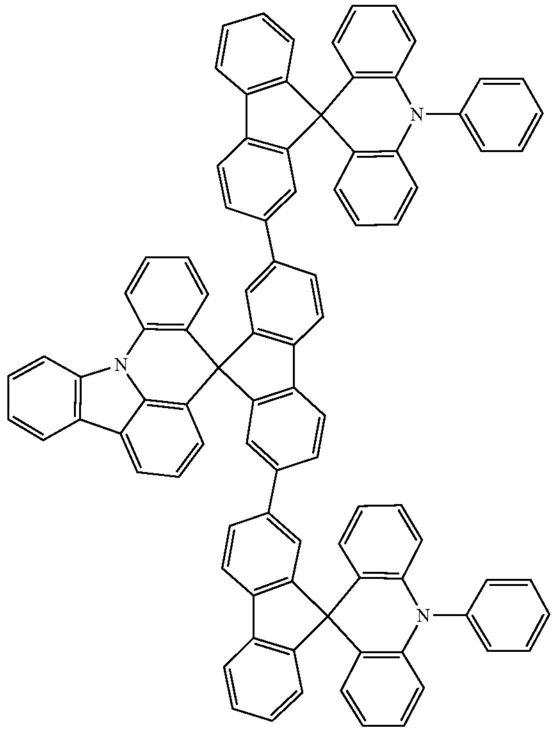

-continued
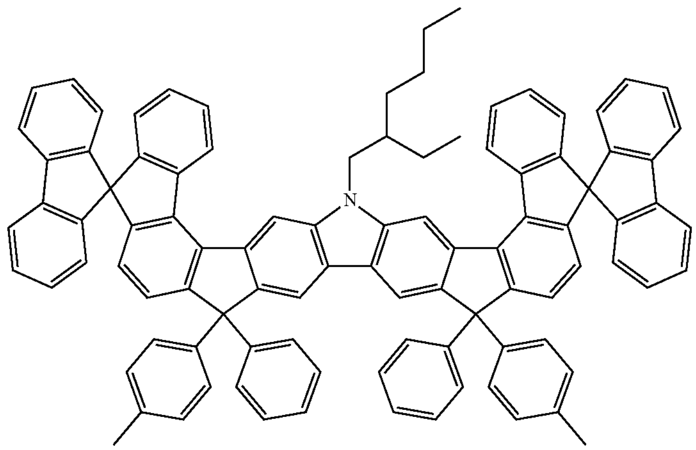
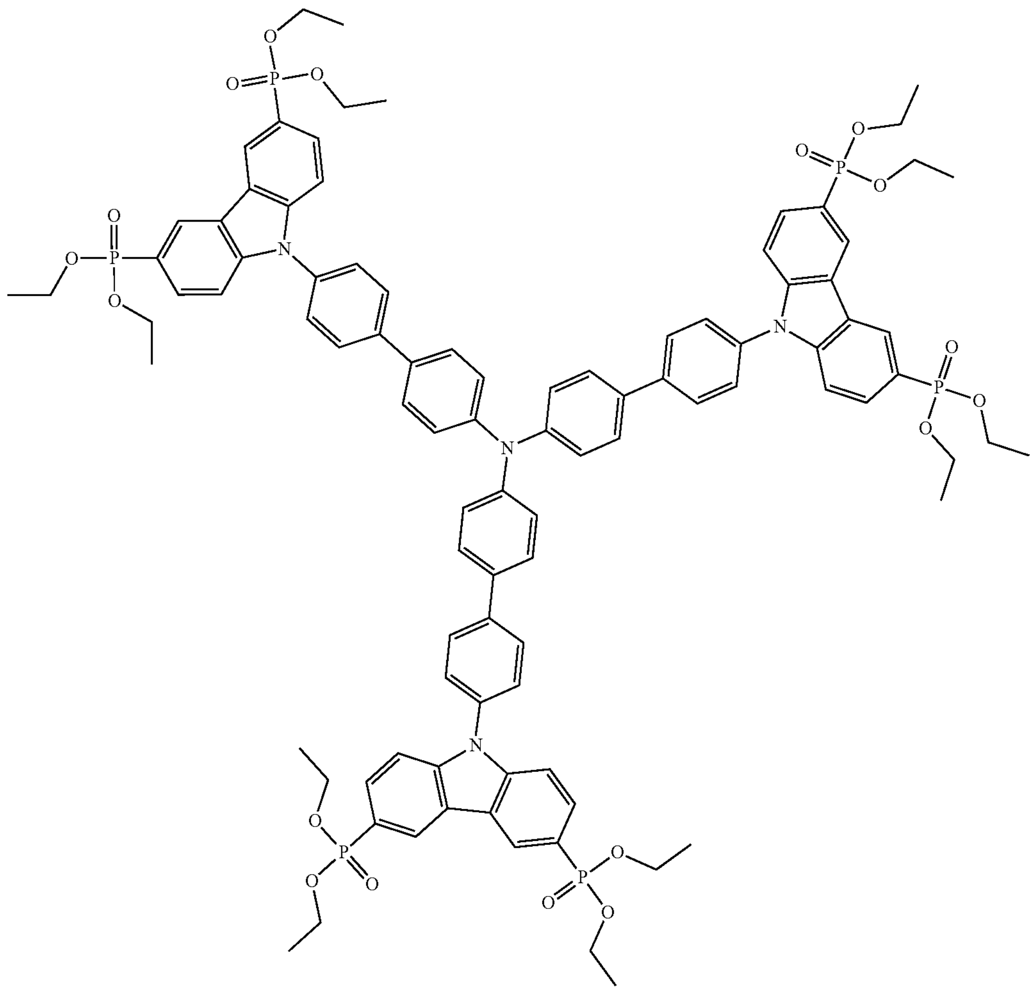

-continued
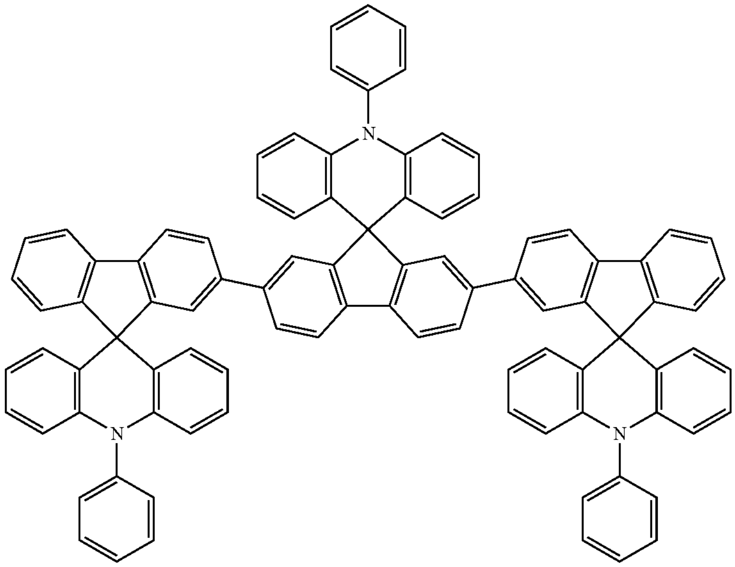
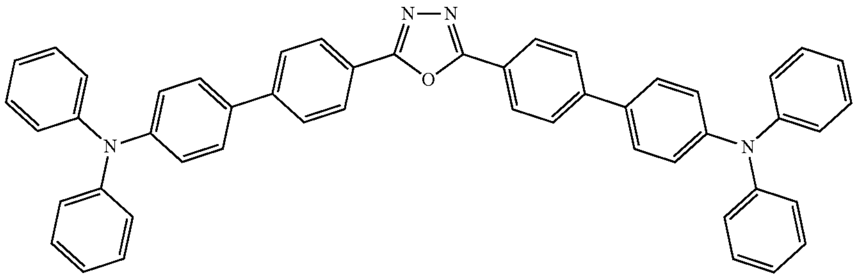
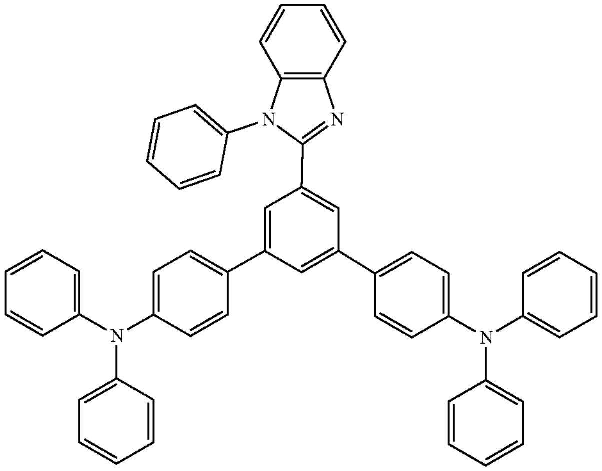

-continued
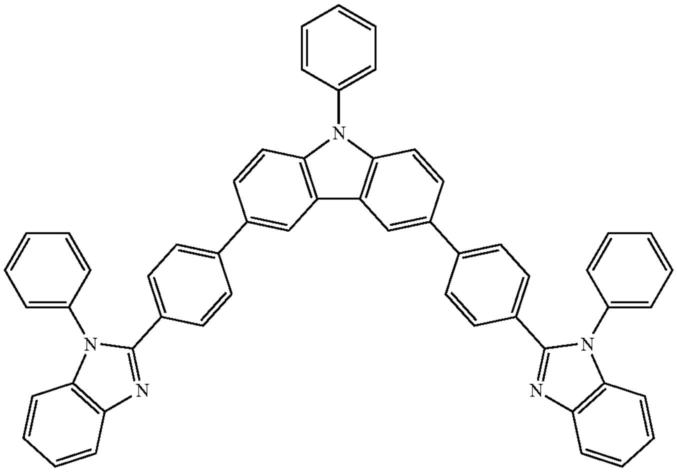
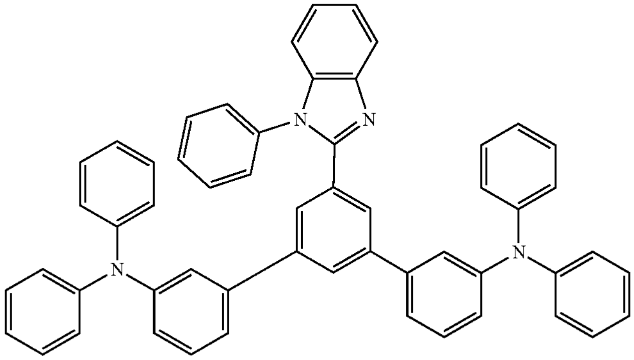
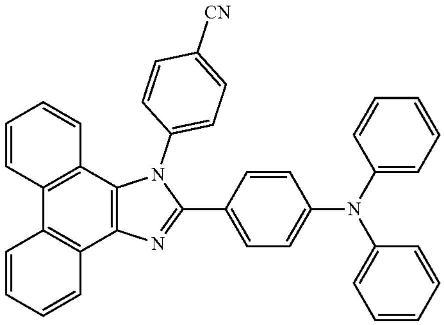
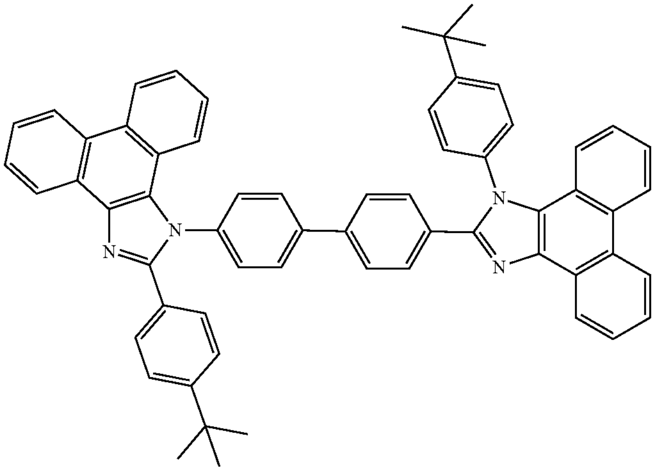
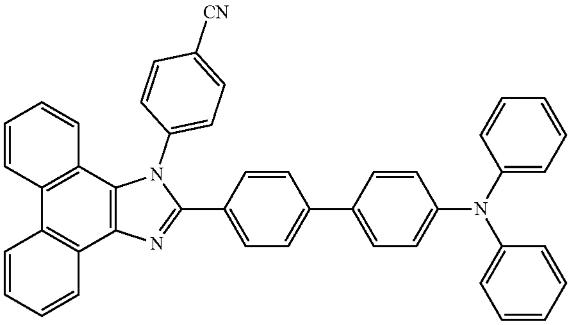

-continued
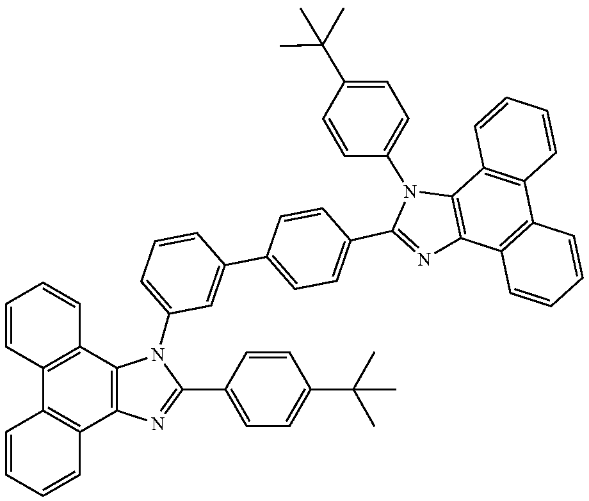
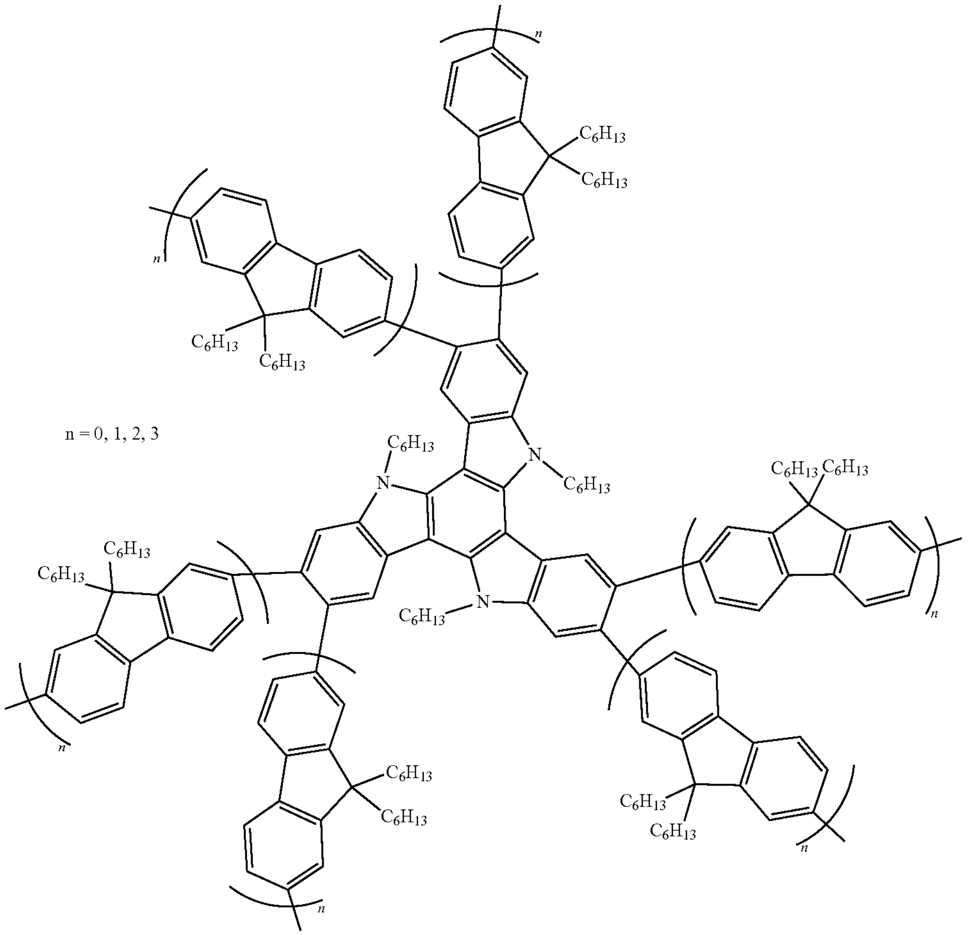
n = 0, 1, 2, 3

-continued
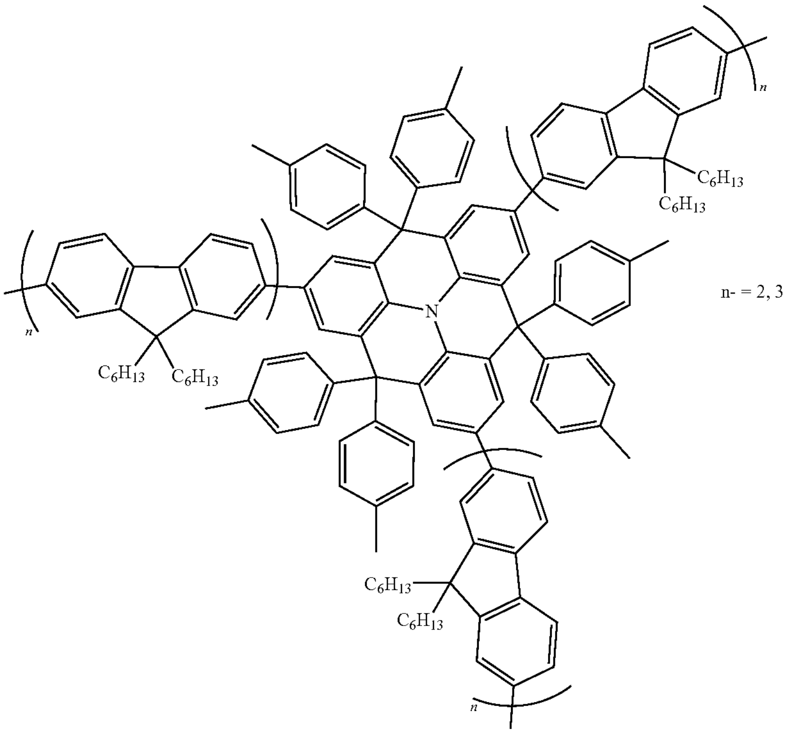
n- = 2, 3
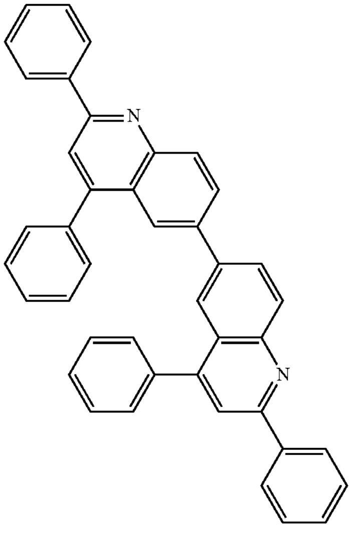
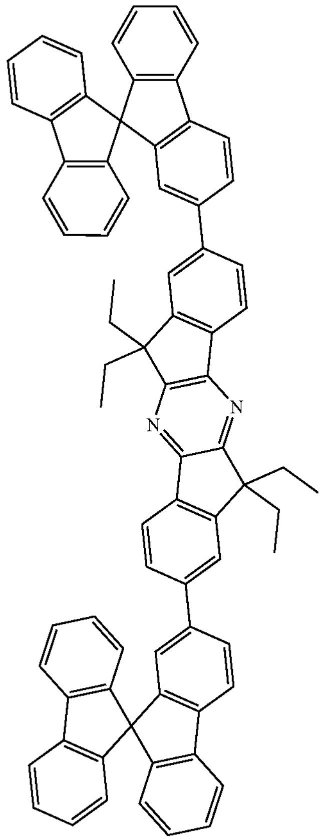

-continued
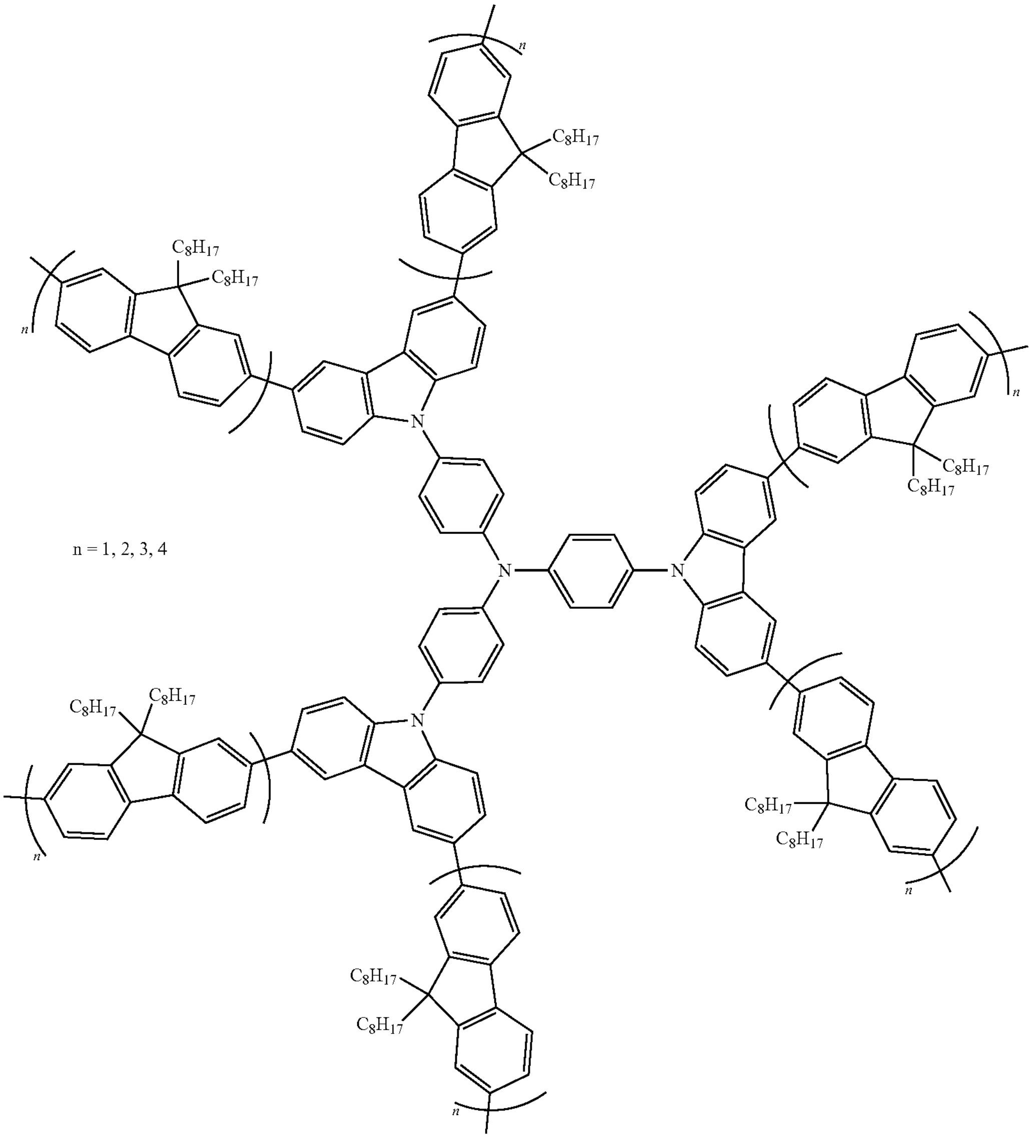
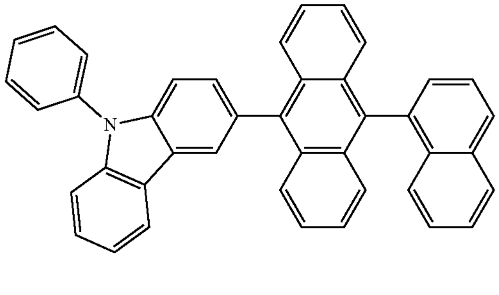

-continued
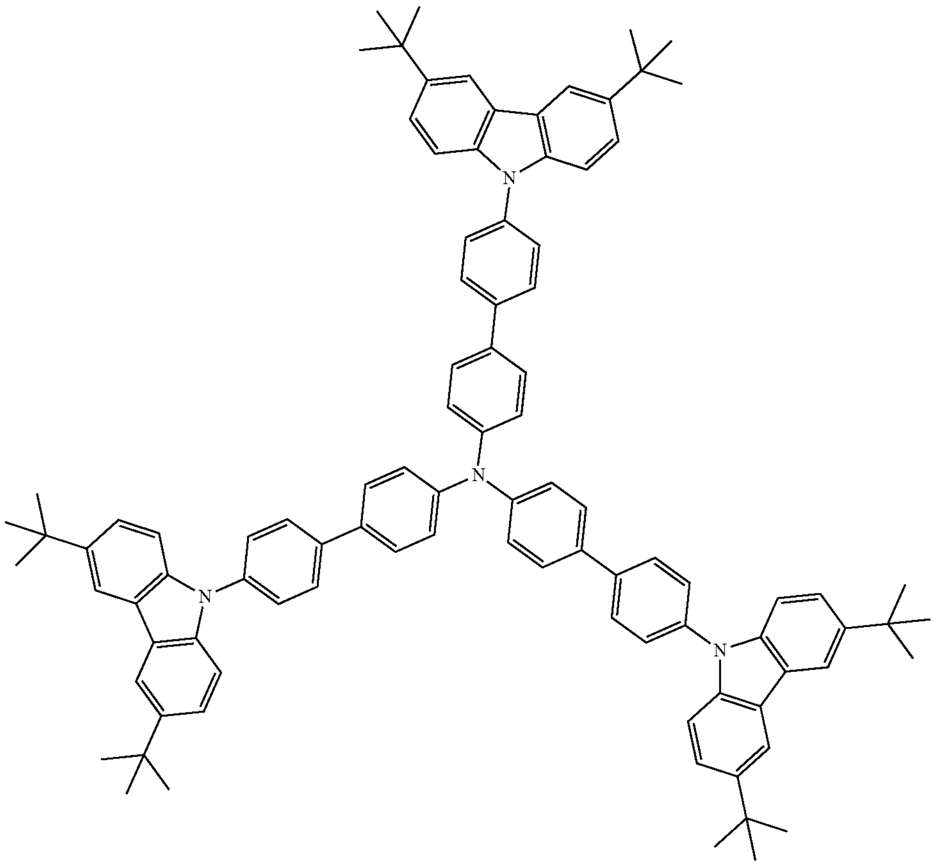
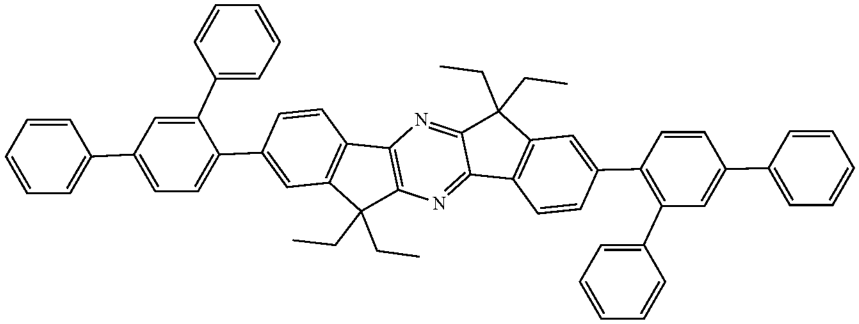
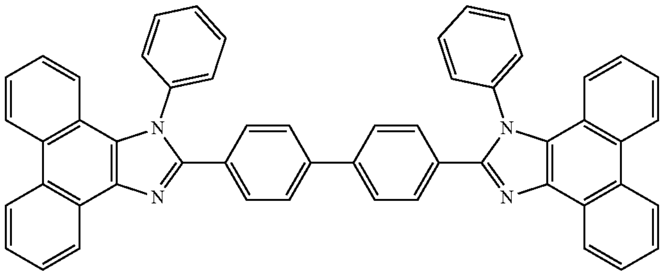
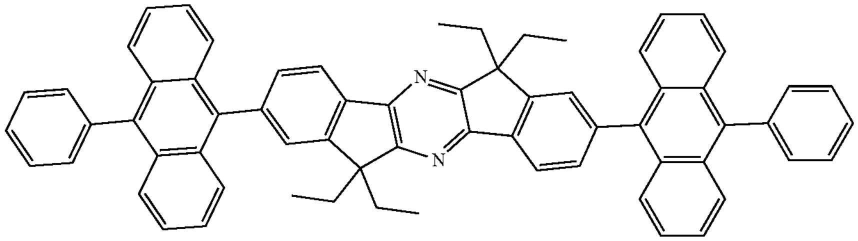

-continued
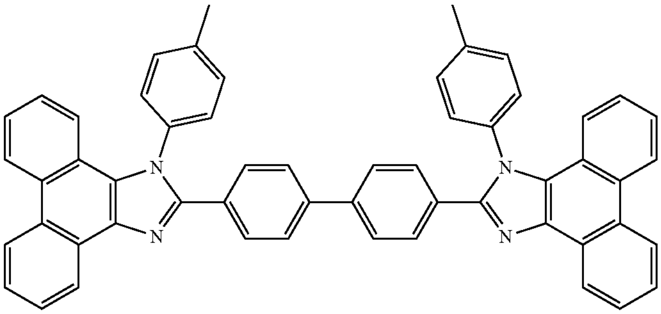
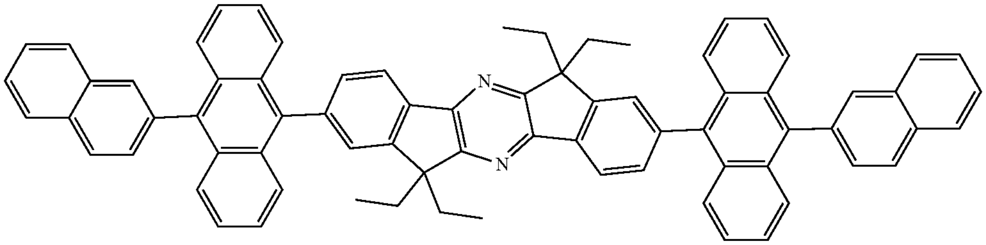
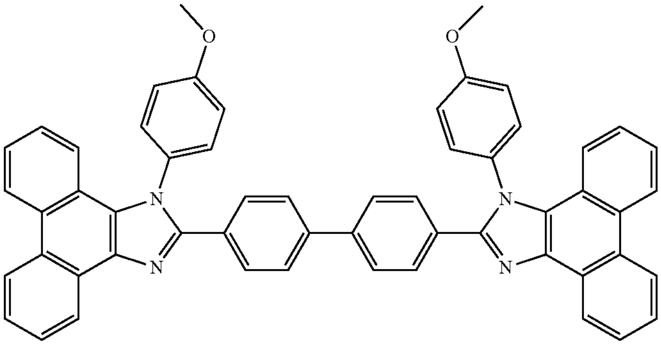
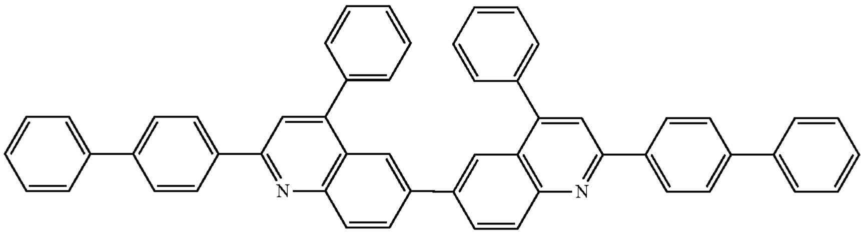
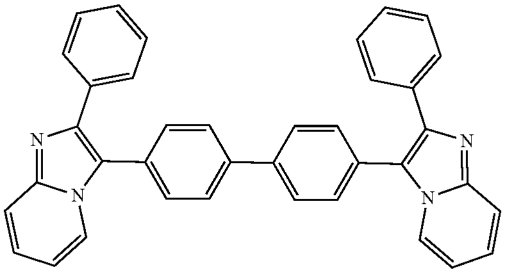
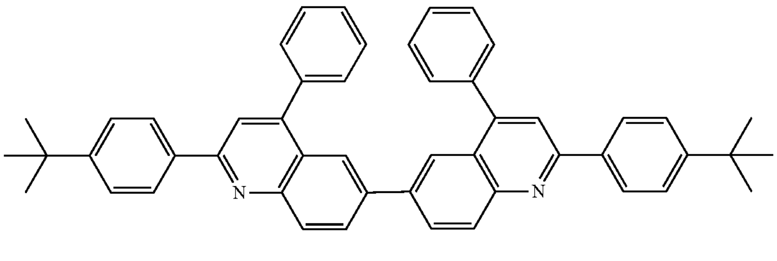
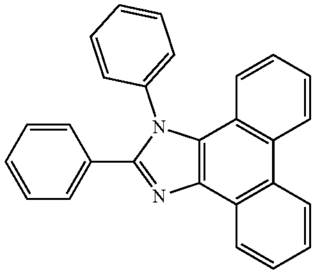

-continued
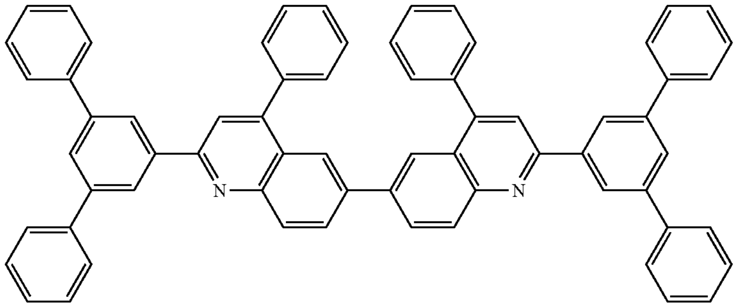
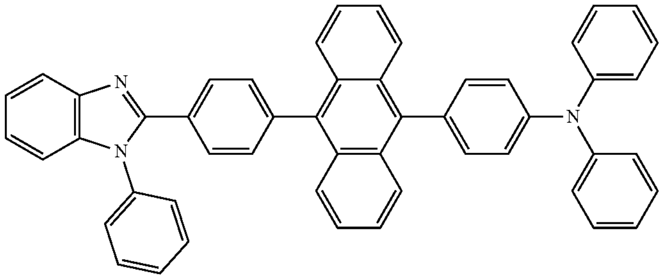
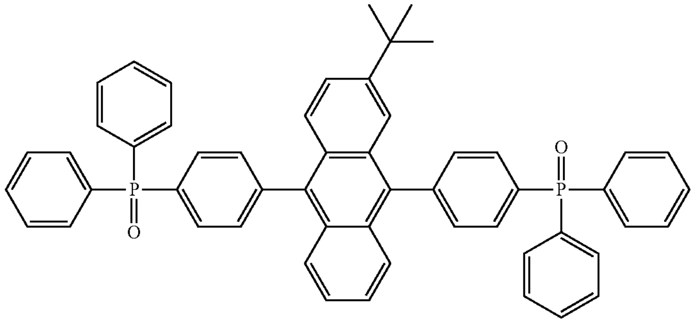
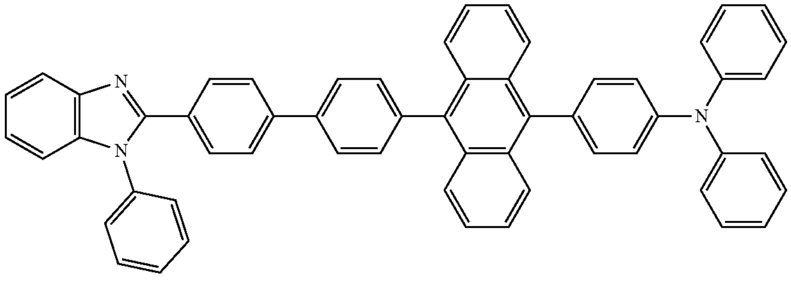
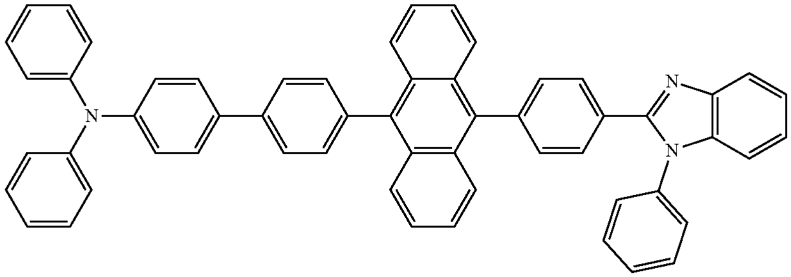

-continued
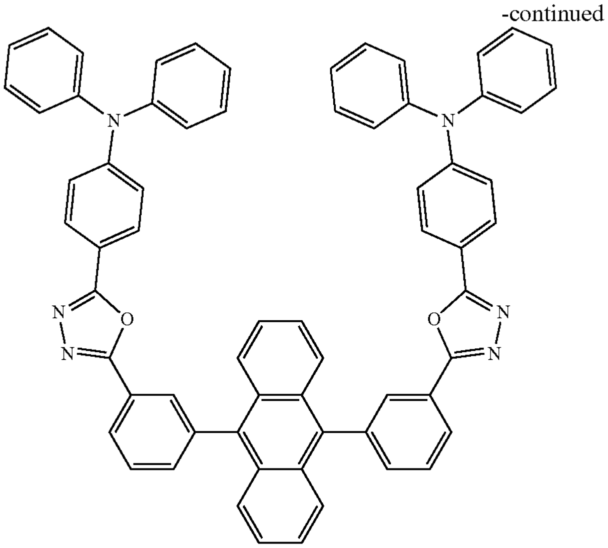
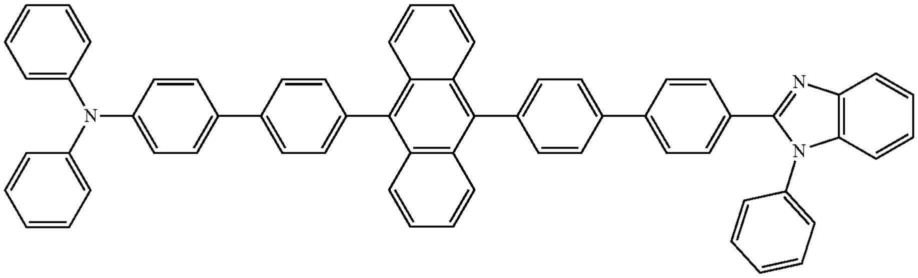
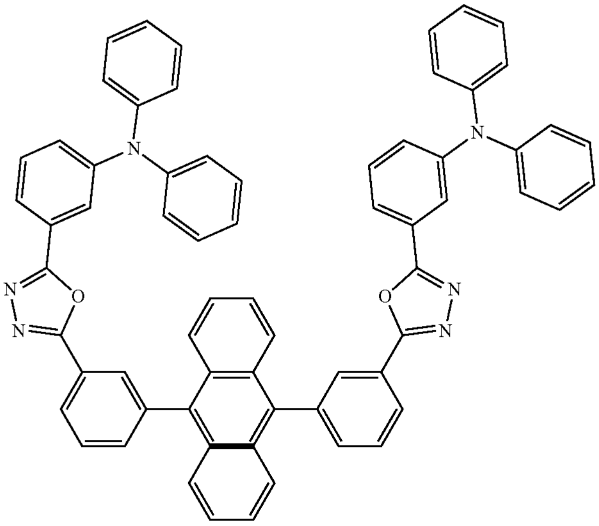
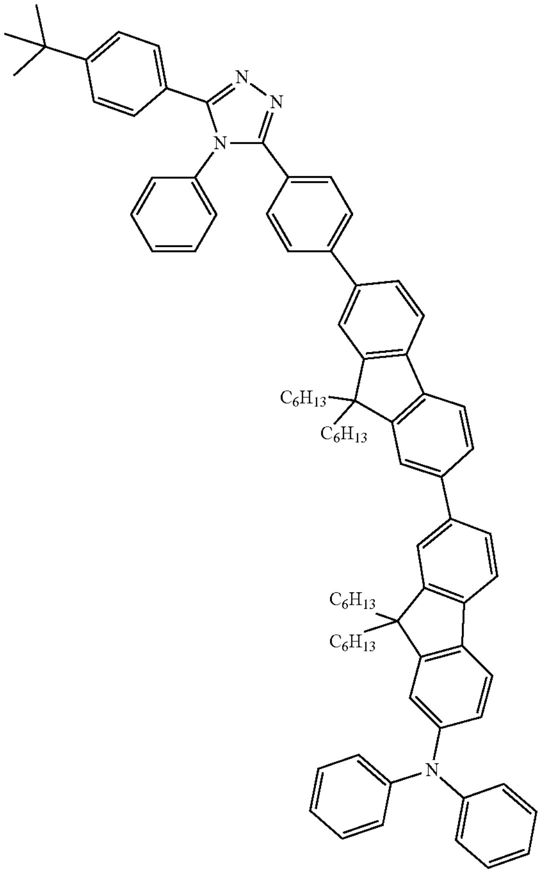

-continued
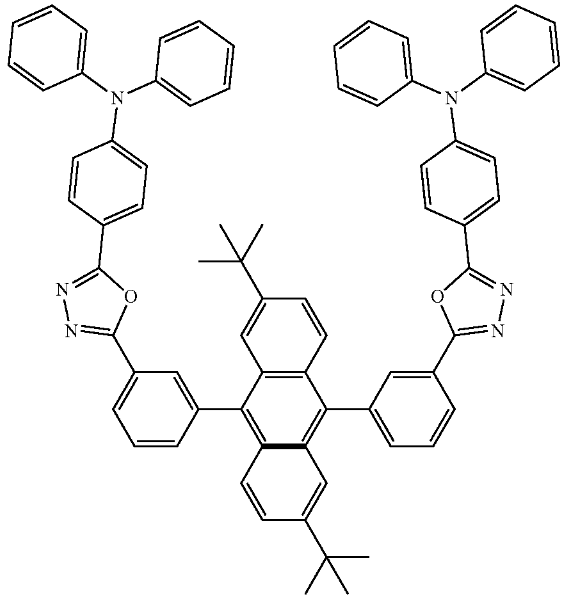
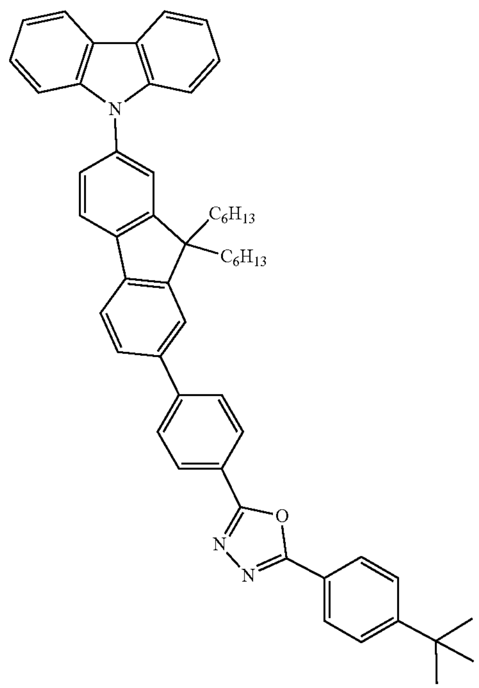
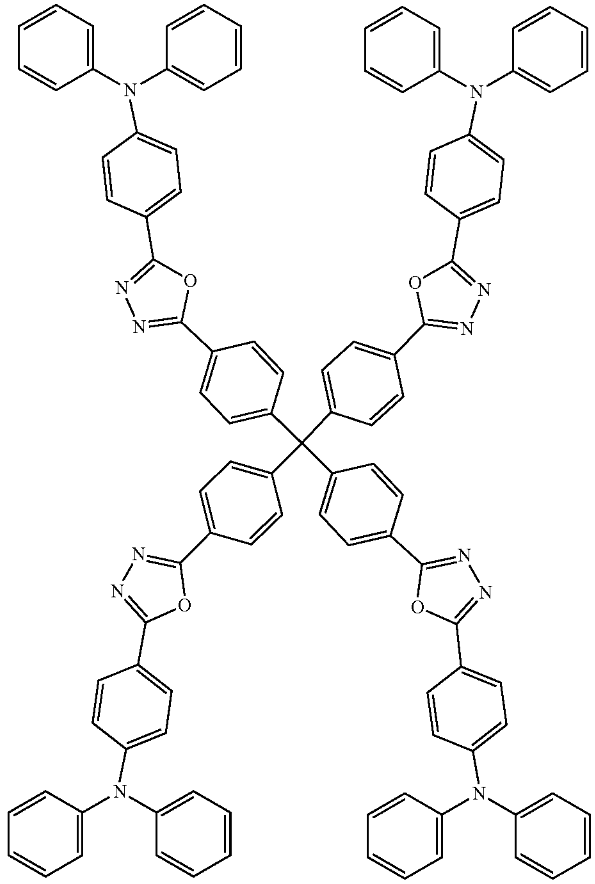
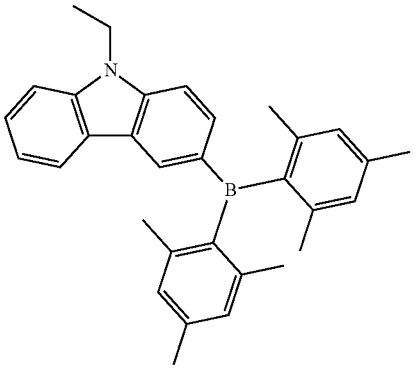

-continued
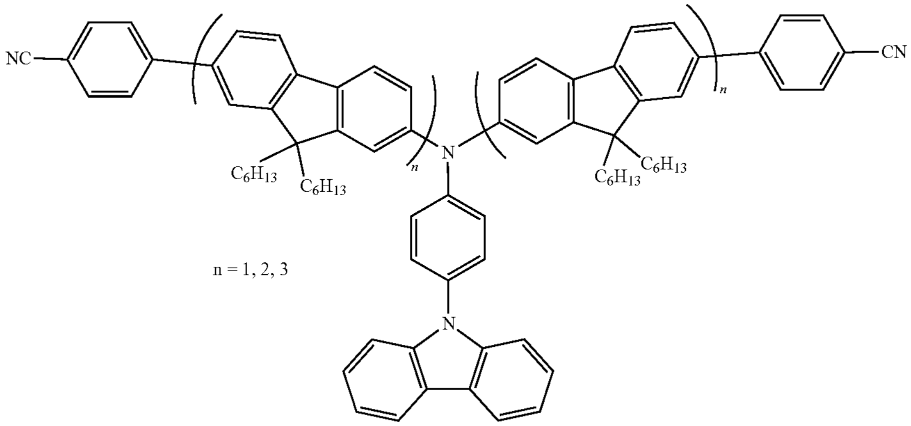
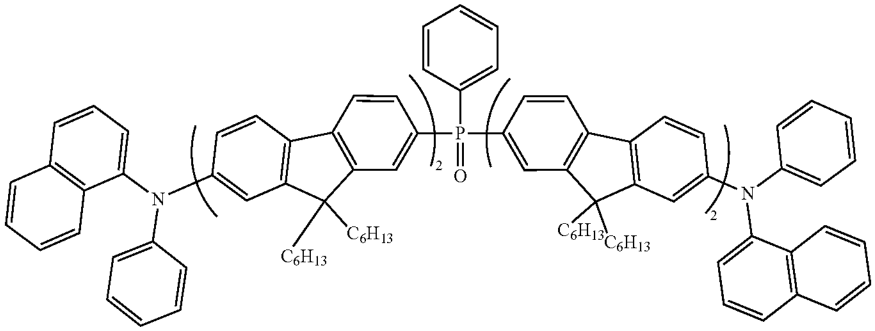
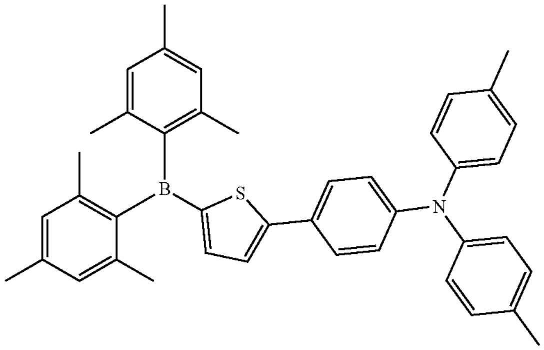
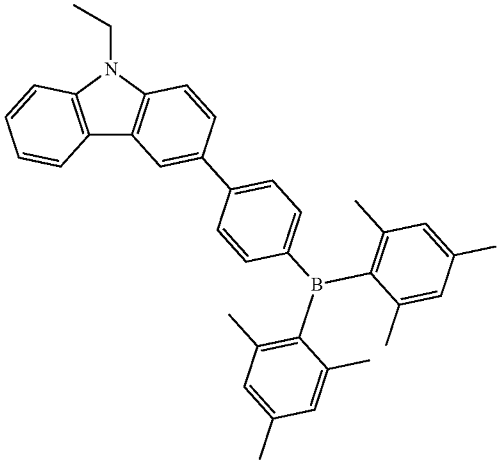
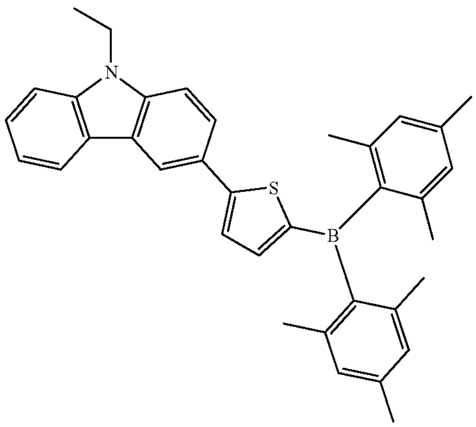
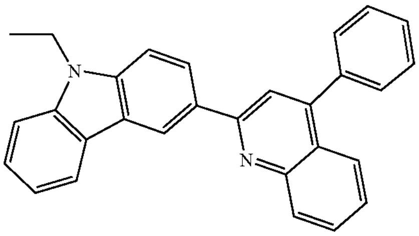

-continued
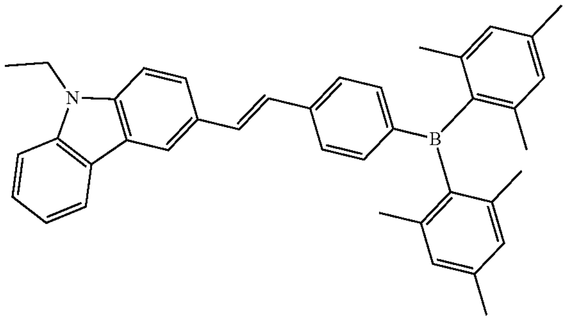
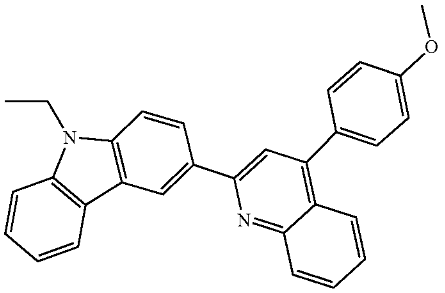
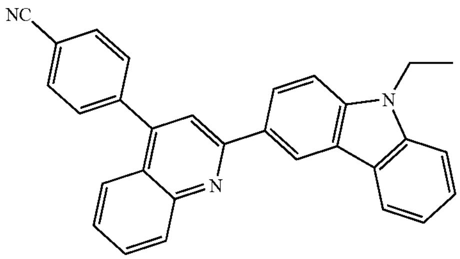
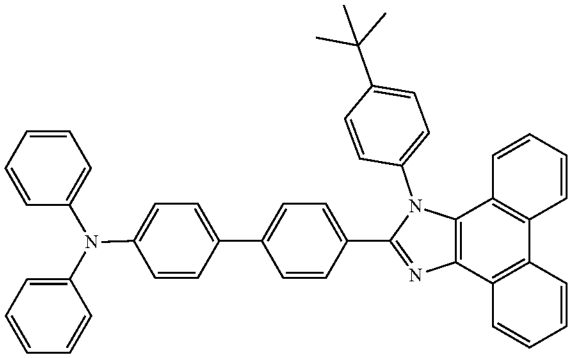
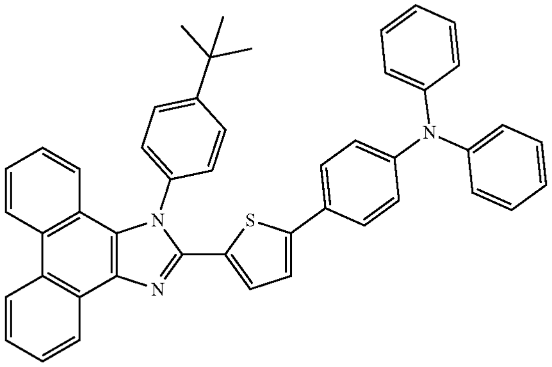
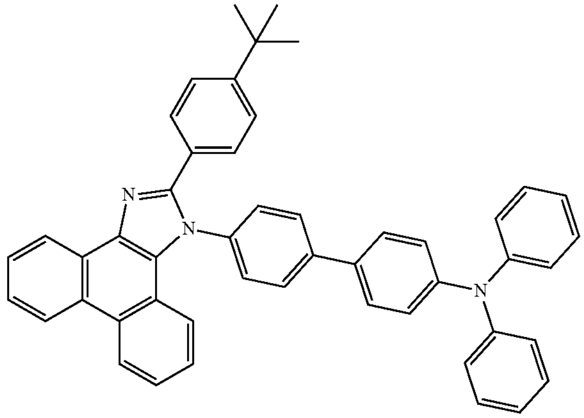
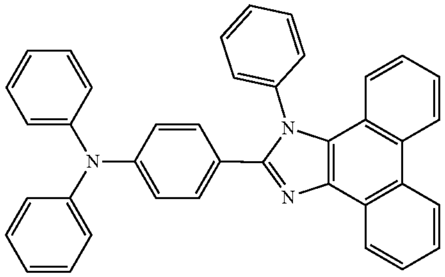
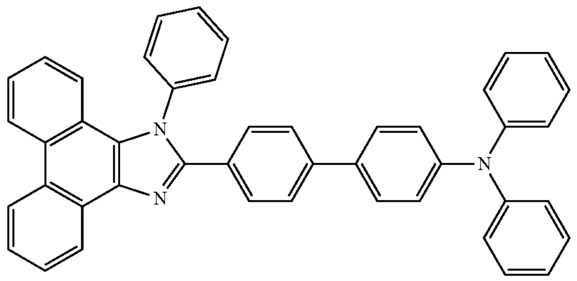

-continued
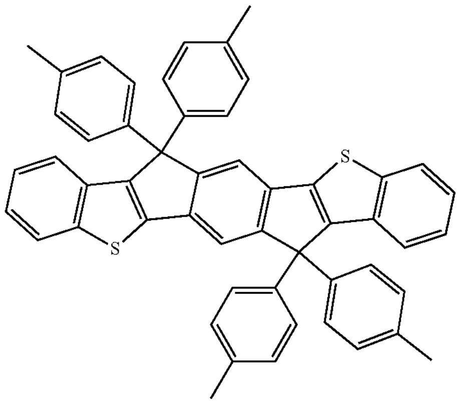
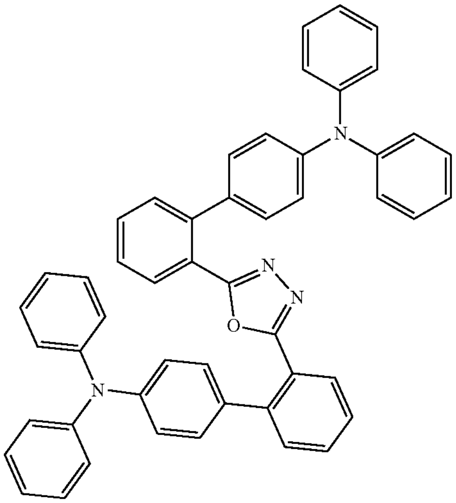
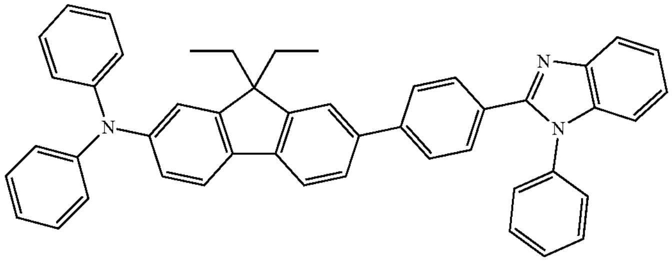
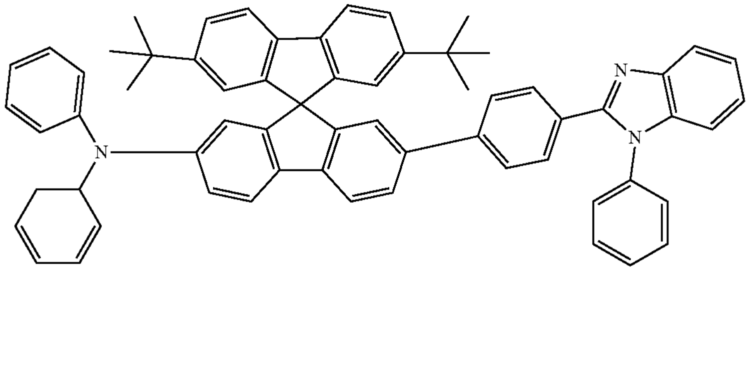

-continued
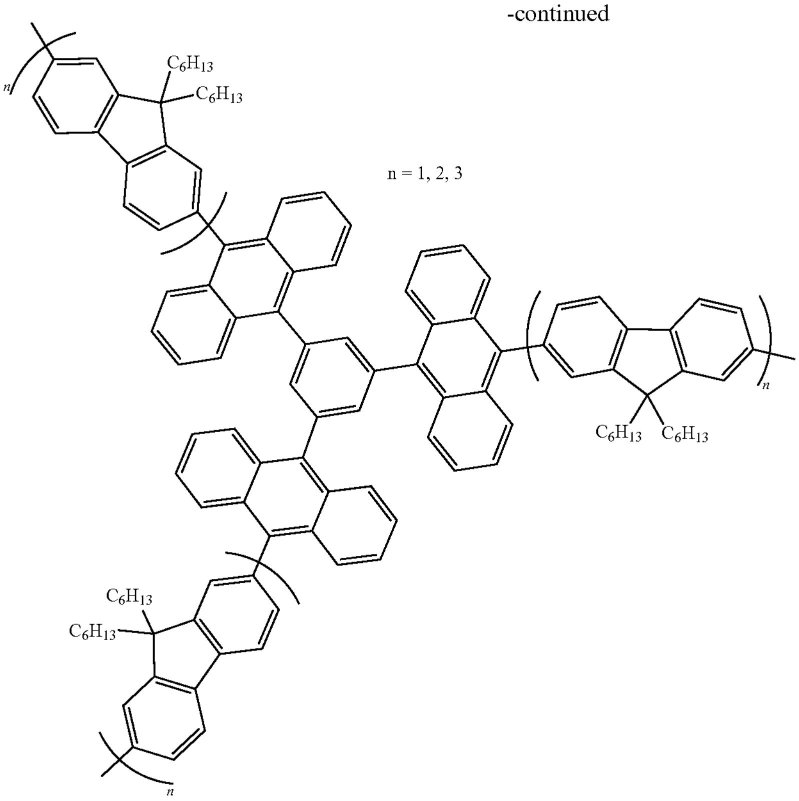
n = 1, 2, 3
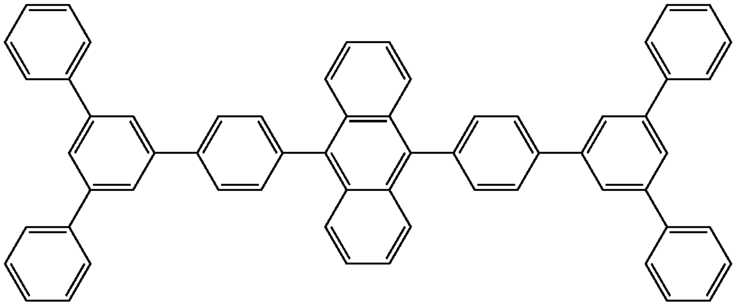
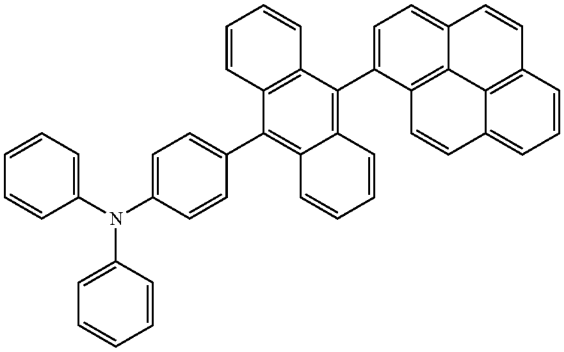

-continued
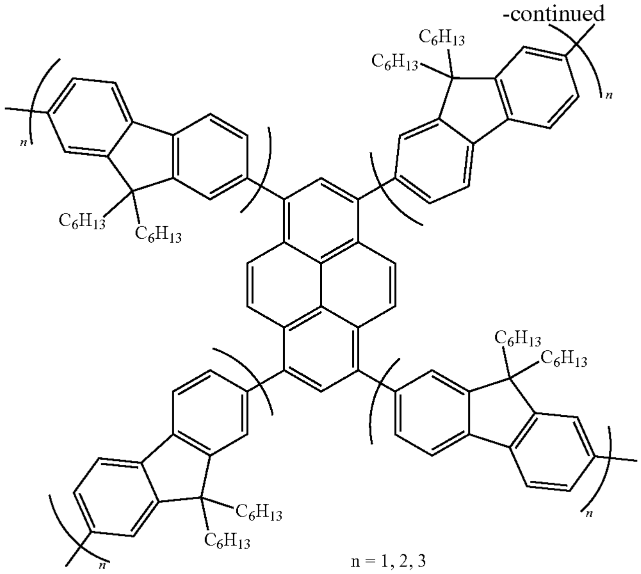
n = 1, 2, 3
In certain embodiments, the emitter material $S^B$ is a blue fluorescence emitter selected from the following group:
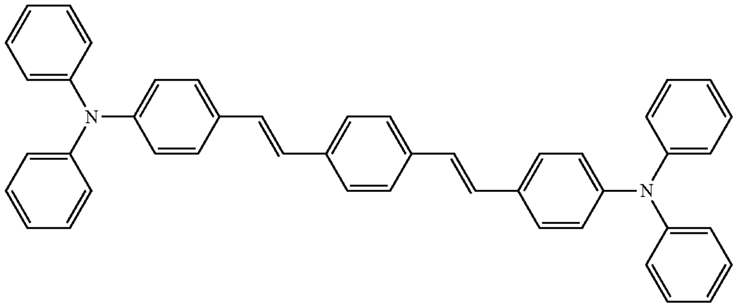
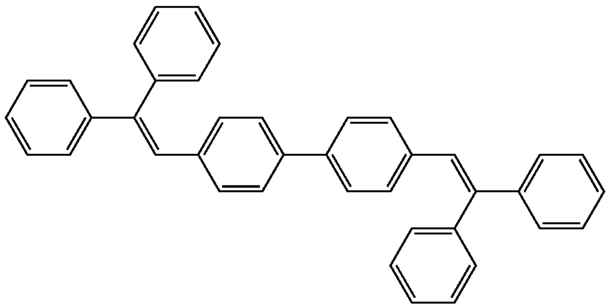
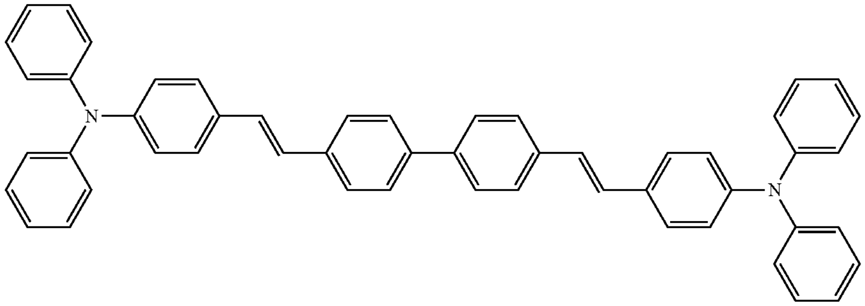

-continued
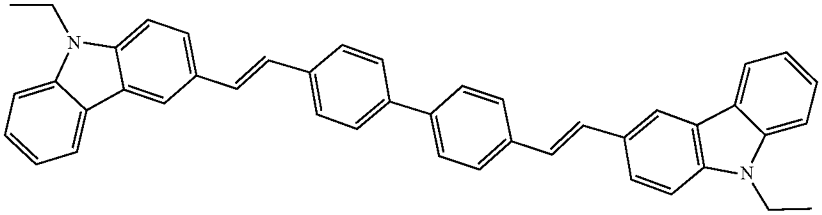
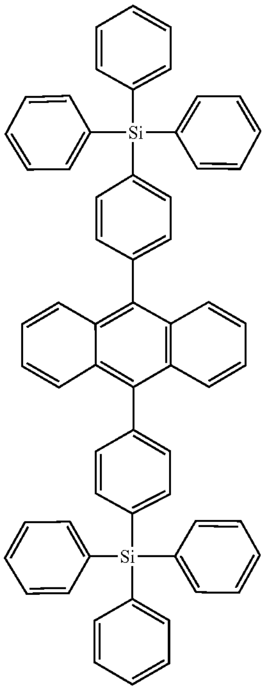
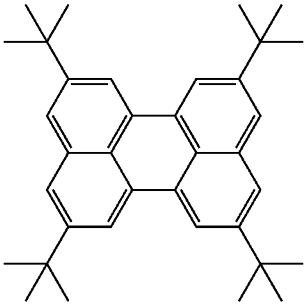
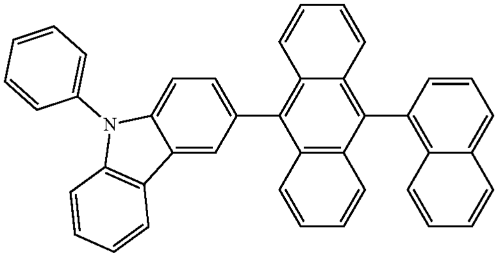
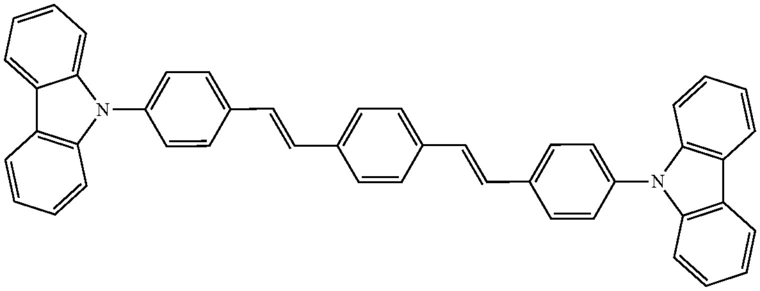

-continued
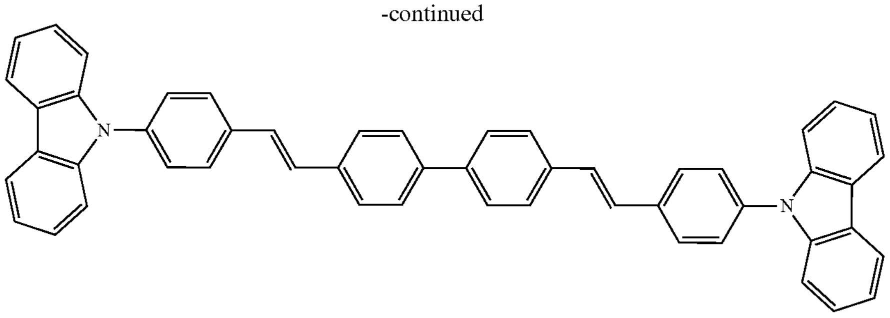
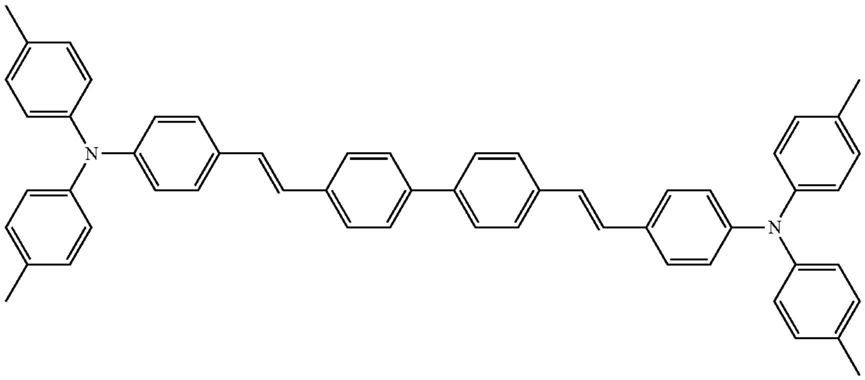
Device Wherein the Emitter Material $S^B$ is a Triplet-Triplet Annihilation (TTA) Fluorescence Emitter
In one embodiment of the invention, the emitter material $S^B$ is a triplet-triplet annihilation (TTA) emitter.
In one embodiment, $S^B$ is a blue TTA emitter selected from the following group:
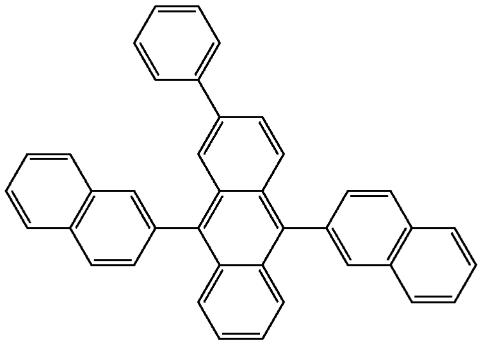
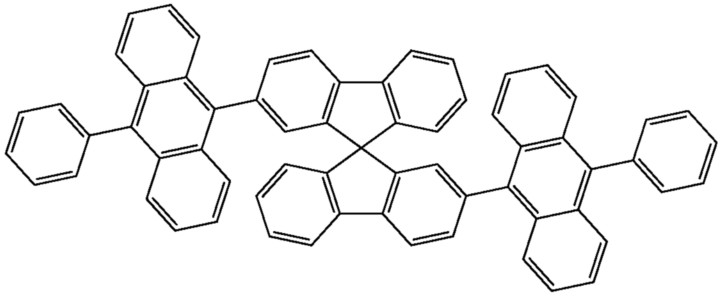

-continued
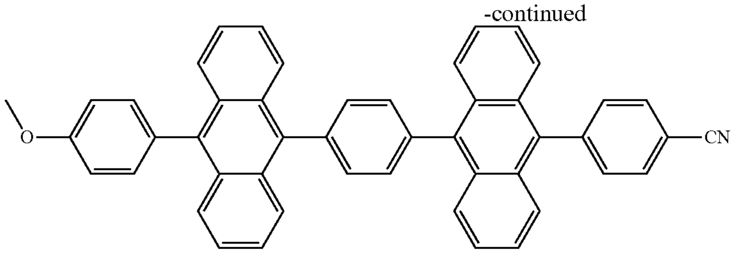
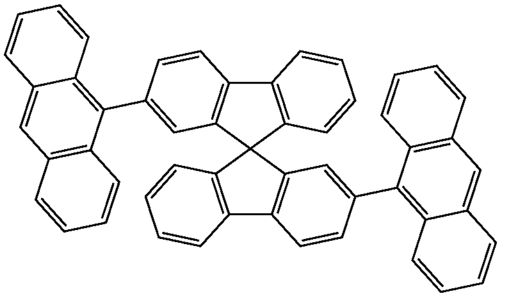
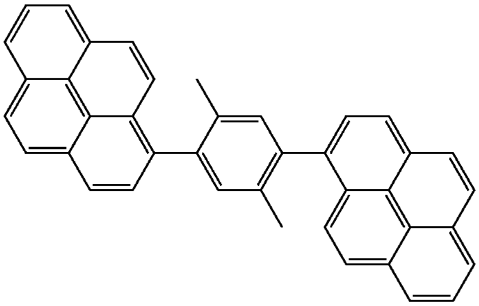
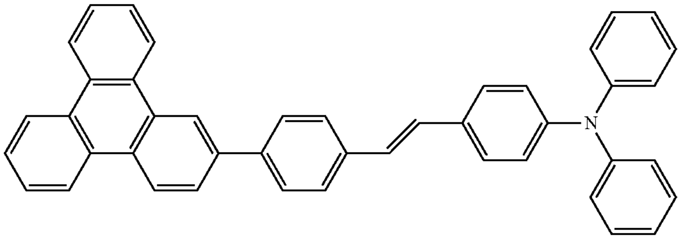
Device Wherein the Emitter Material $S^B$ is a Green Fluorescence Emitter
In a further embodiment of the invention, the emitter material $S^B$ is a fluorescence emitter, in particular a green fluorescence emitter.
In one embodiment, the emitter material $S^B$ is a fluorescence emitter selected from the following group:
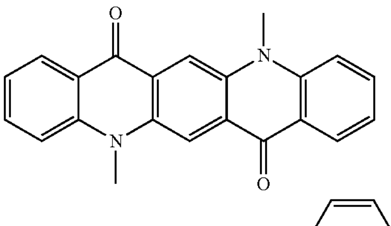
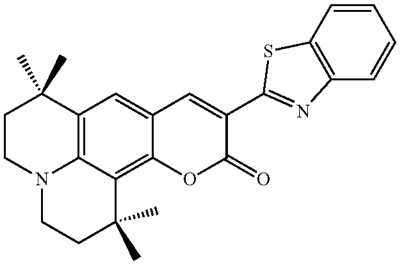
-continued
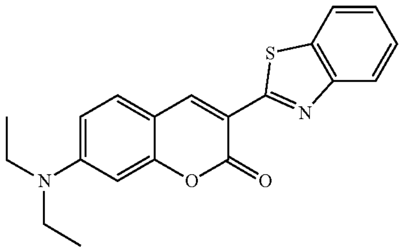
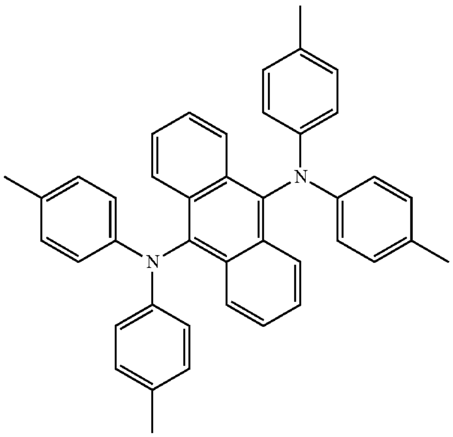

-continued
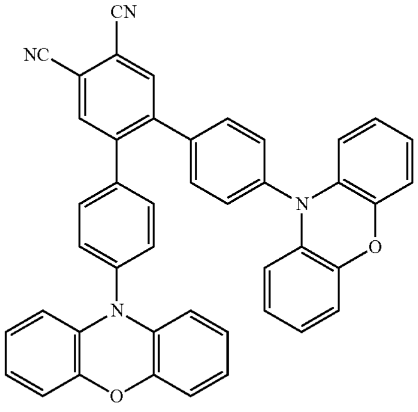
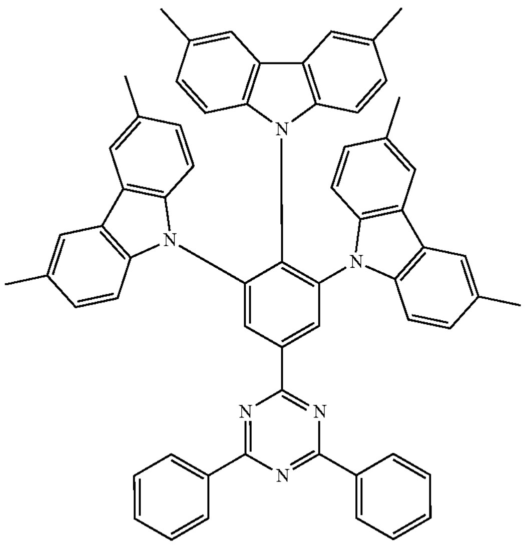
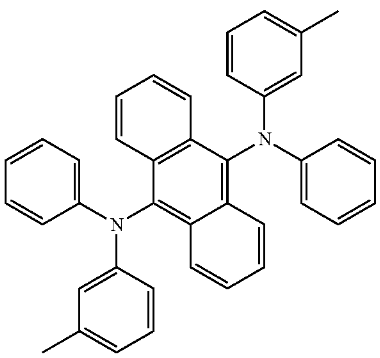
-continued
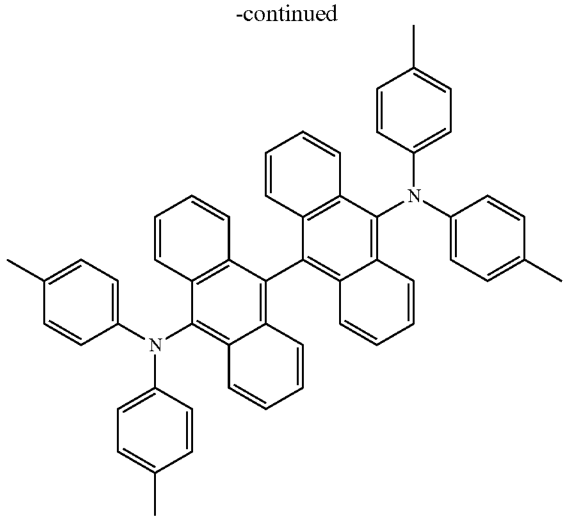
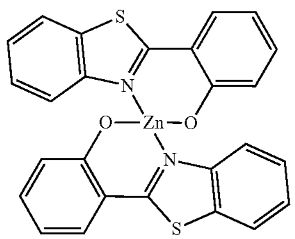
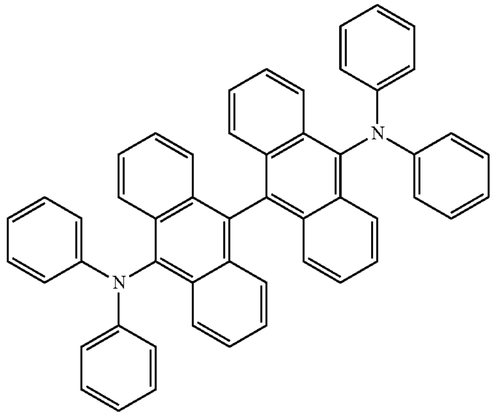
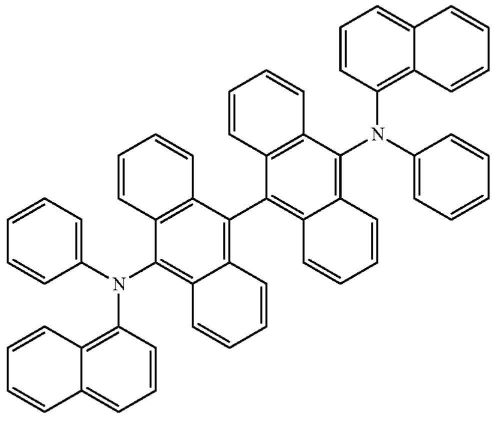

-continued

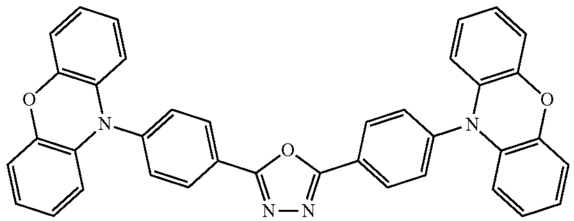

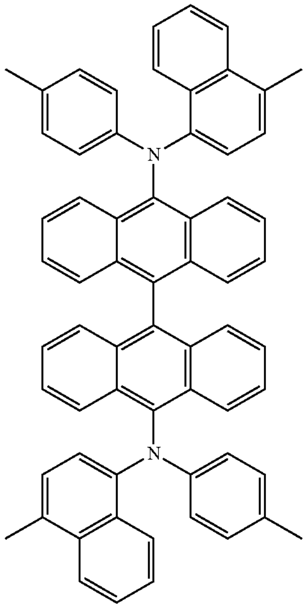

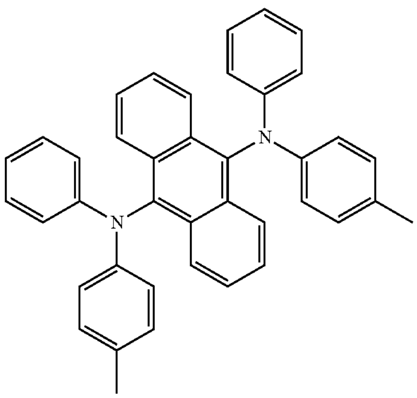

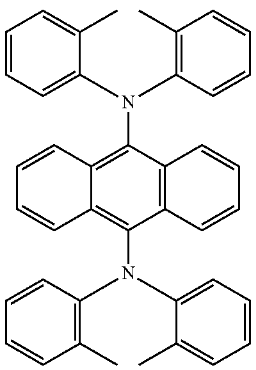

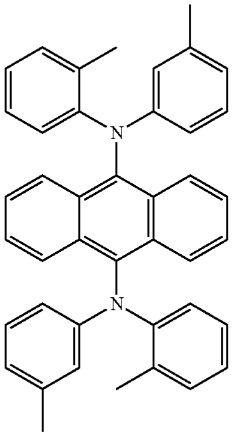

-continued

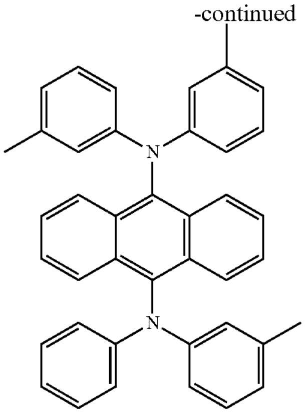

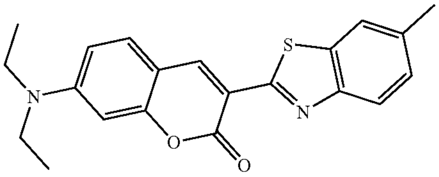

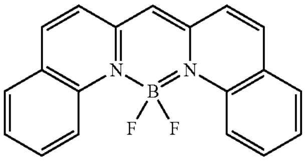

In a further embodiment of the invention, the device has an emission peak in the visible or nearest ultraviolet range, i.e., in the range of a wavelength of from 380 to 800 nm, in particular between 485 nm and 590 nm, preferably between 505 nm and 565 nm, even more preferably between 515 nm and 545 nm.

Device Wherein the Emitter Material $S^B$ is a Red Fluorescence Emitter

In a further embodiment of the invention, the emitter material $S^B$ is a fluorescence emitter, in particular a red fluorescence emitter.

In one embodiment, the emitter material $S^B$ is a fluorescence emitter selected from the following group:
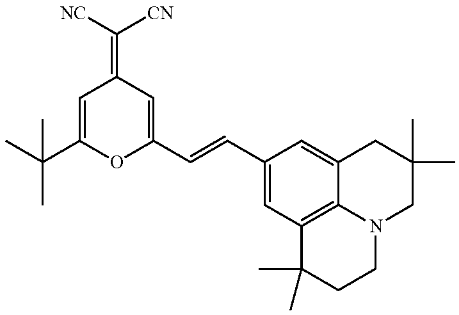
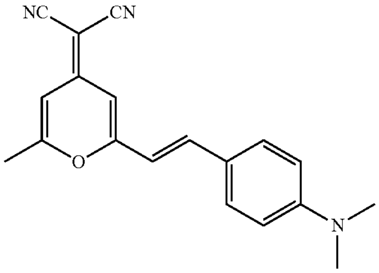
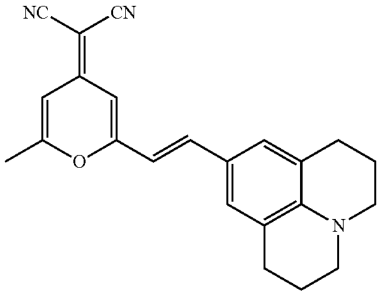
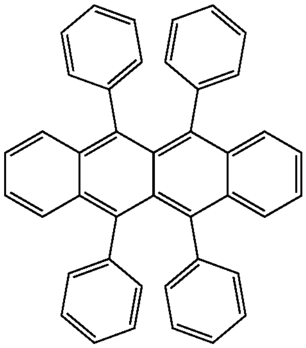
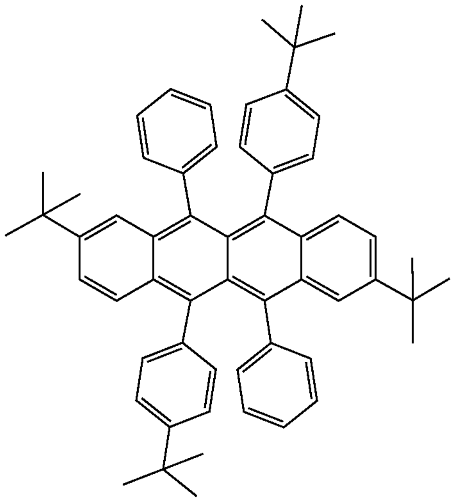
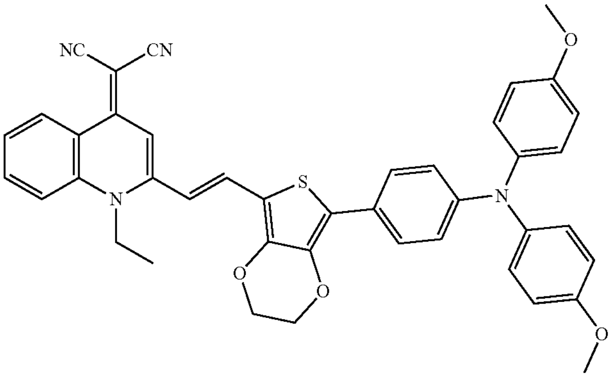
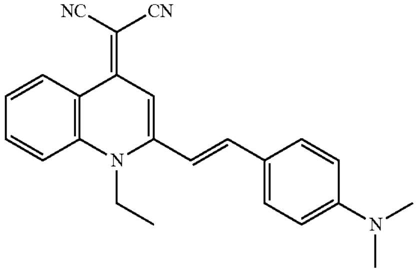
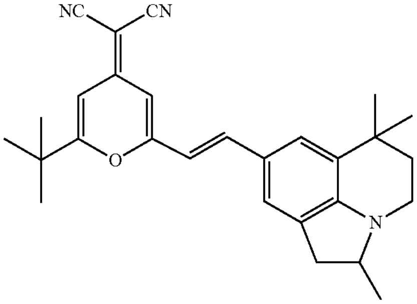

-continued
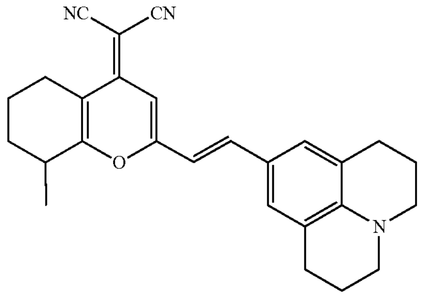
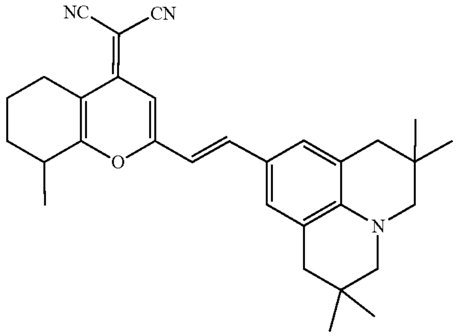
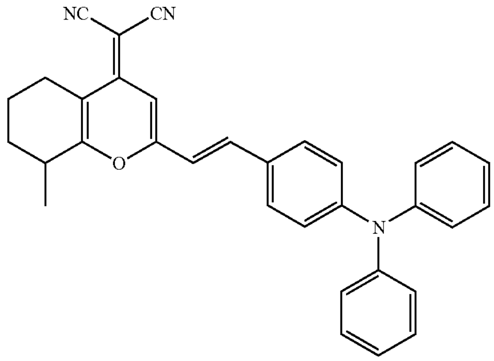
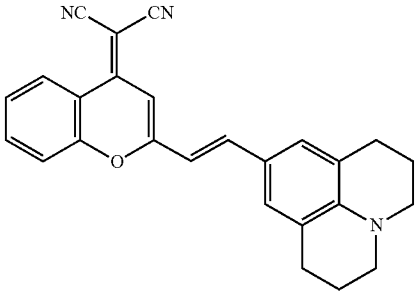
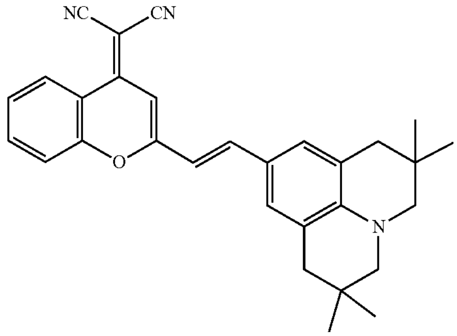
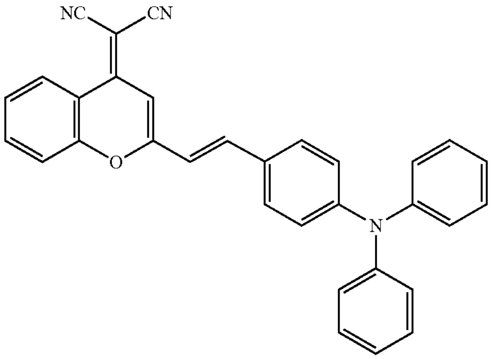
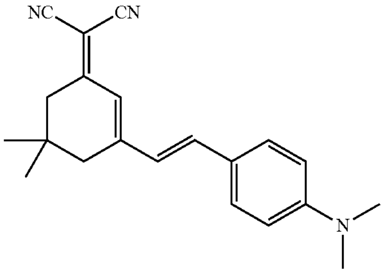
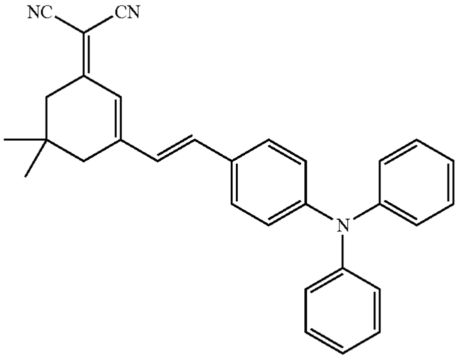
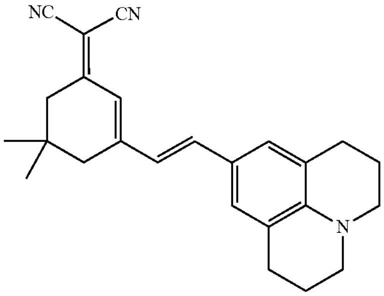
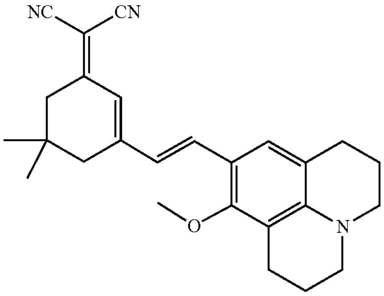

-continued
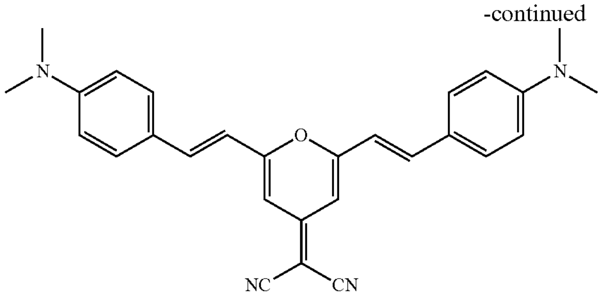
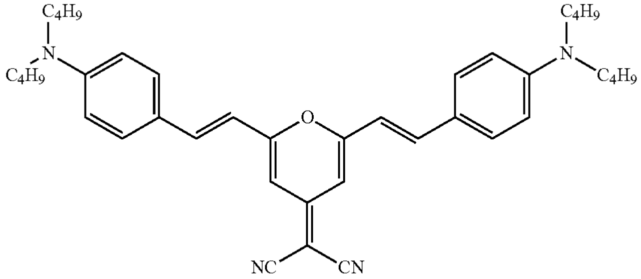
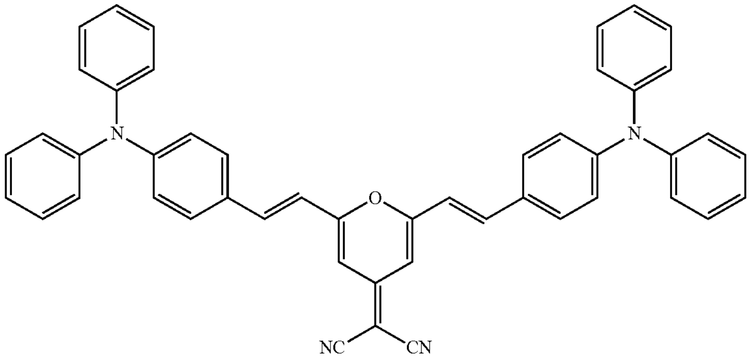
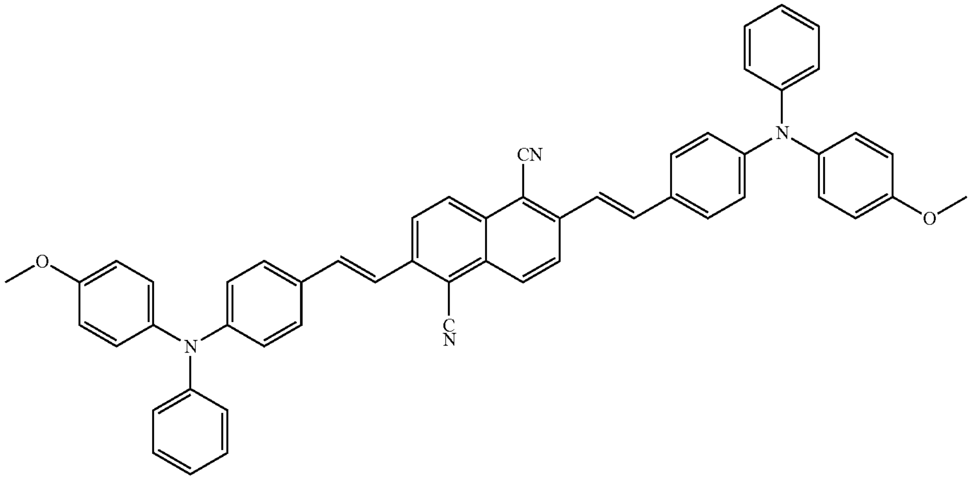
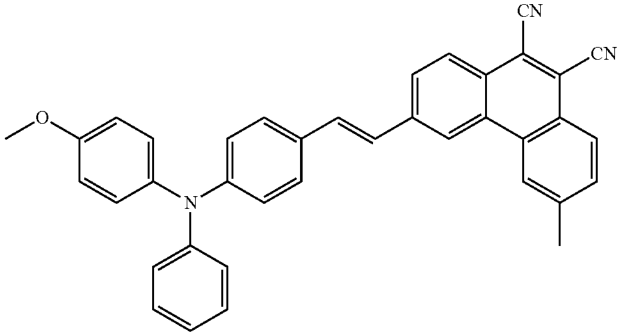

-continued
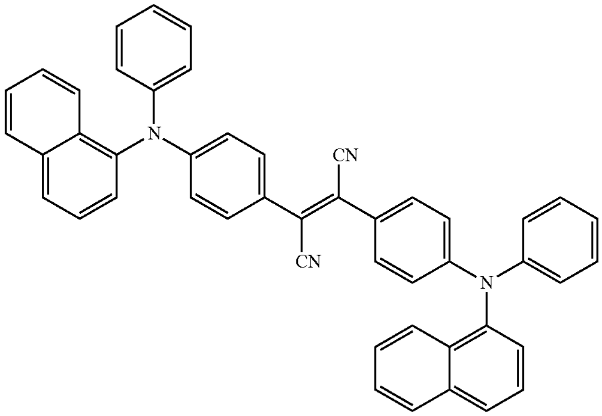
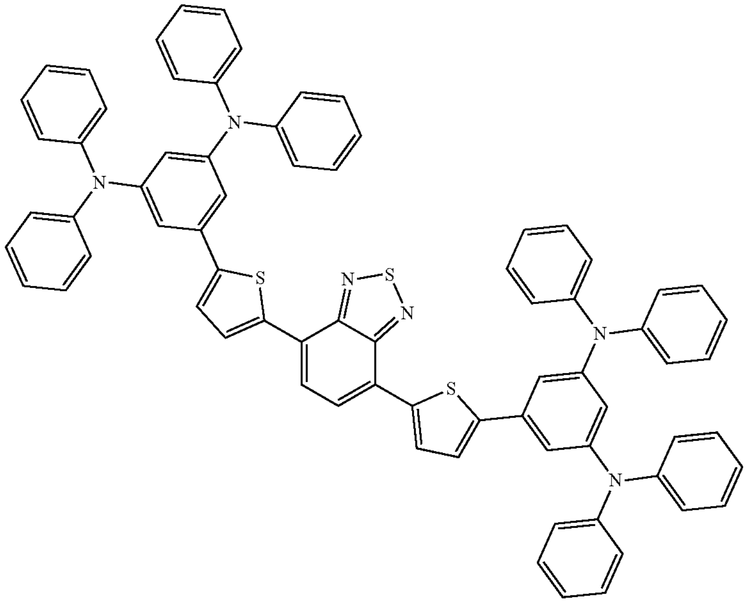
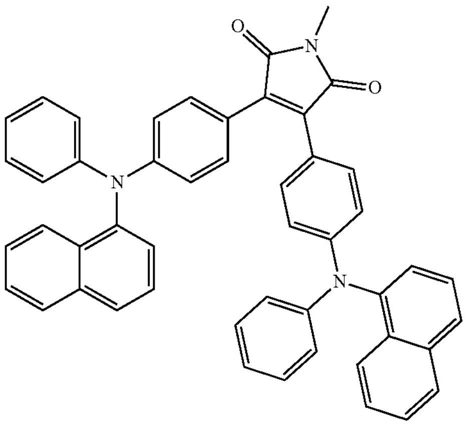
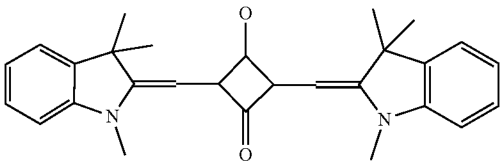

-continued
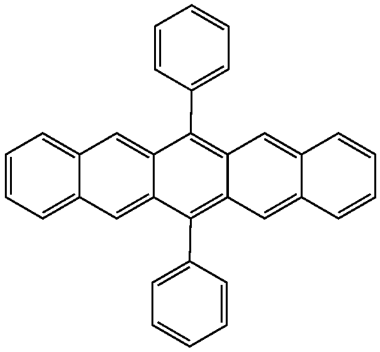
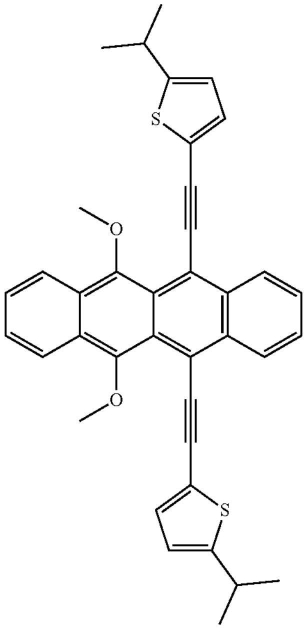
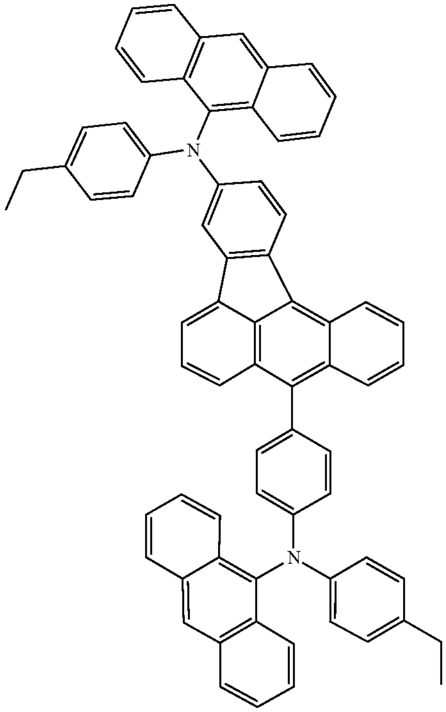
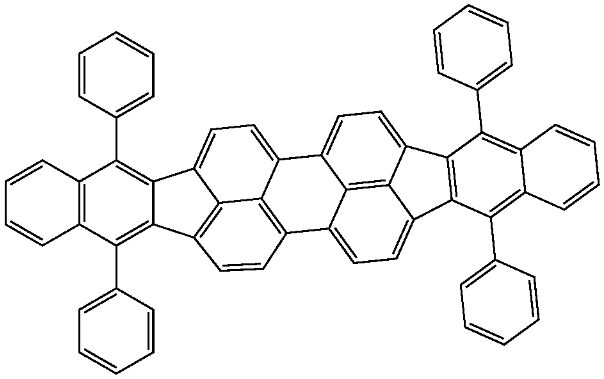
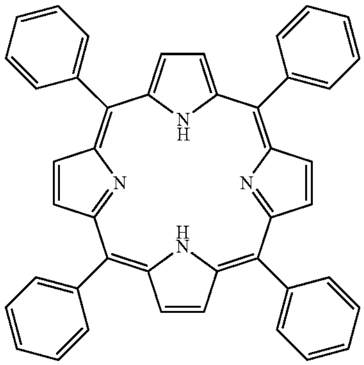
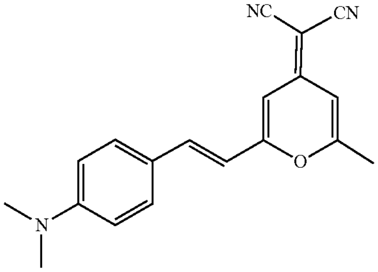

-continued
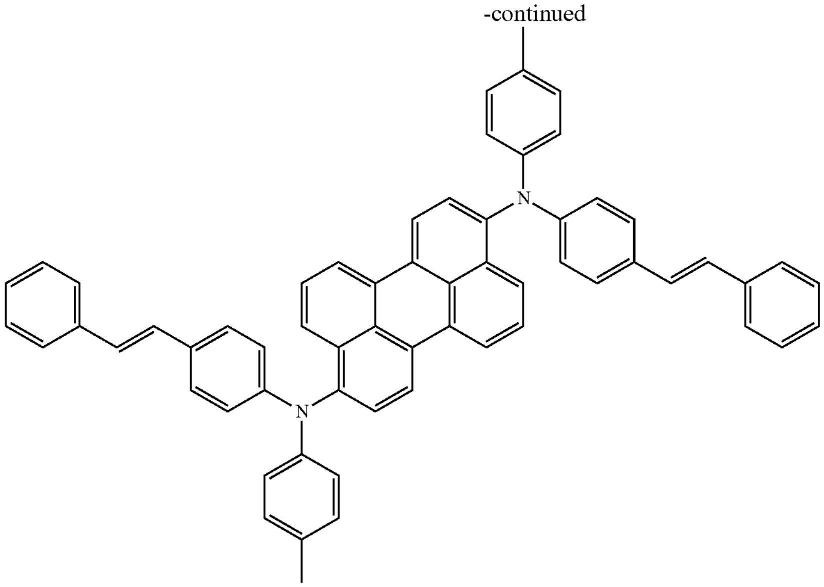
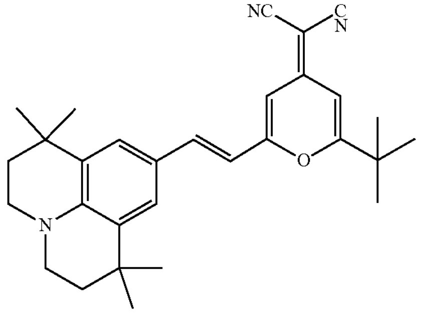
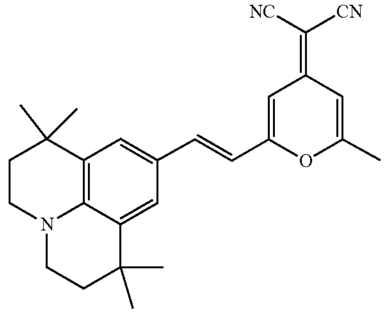
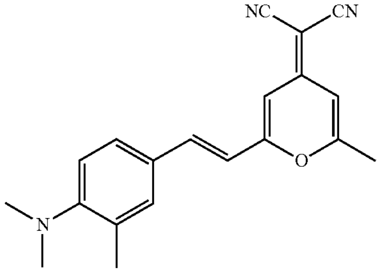
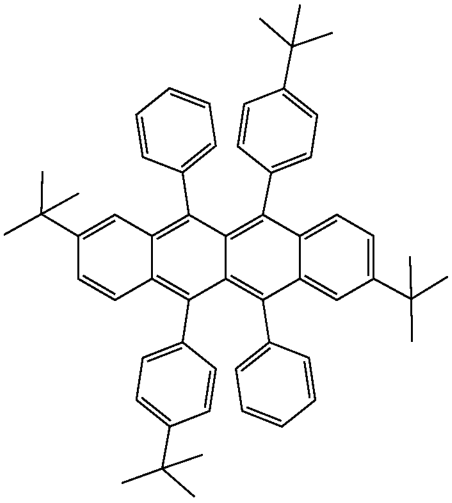

-continued

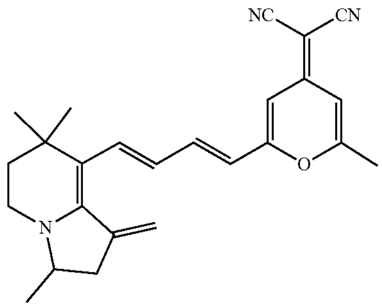

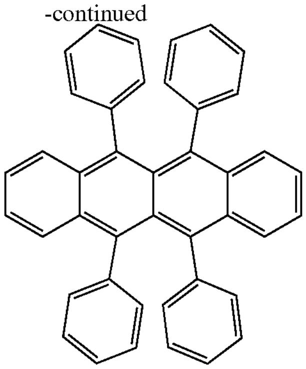

In a further embodiment of the invention, the device has an emission peak in the visible or nearest ultraviolet range, i.e., in the range of a wavelength of from 380 to 800 nm, in particular between 590 nm and 690 nm, preferably between 610 nm and 665 nm, even more preferably between 620 nm and 640 nm.

Orbital and excited state energies can be determined either by means of experimental methods known to the person skilled in the art. Experimentally, the energy of the highest occupied molecular orbital $E^{HOMO}$ is determined by methods known to the person skilled in the art from cyclic voltammetry measurements with an accuracy of 0.1 eV. The energy of the lowest unoccupied molecular orbital $E^{LUMO}$ is calculated as $E^{HOMO}+E^{gap}$, where $E^{gap}$ is determined as follows:

For host compounds, the onset of emission of a film with 10% by weight of host in poly(methyl methacrylate) (PMMA) is used as $E^{gap}$, unless stated otherwise.

For emitter compounds, e.g., NRCT emitters and fluorescence emitters, $E^{gap}$ is determined as the energy at which the excitation and emission spectra of a film with 1% by weight of emitter in PMMA cross, unless stated otherwise.

For organic TADF emitters, $E^{gap}$ is determined as the energy at which the excitation and emission spectra of a film with 10% by weight of emitter in PMMA cross, unless stated otherwise.

For host compounds, the onset of emission of a film with 10% by weight of host in poly(methyl methacrylate) (PMMA), which corresponds to the energy of the first excited singlet state S1, is used as $E^{gap}$, unless stated otherwise.

For emitter compounds, e.g., NRCT emitters and fluorescence emitters, $E^{gap}$ and thus the energy of the first excited singlet state S1 is determined in the same way, unless stated otherwise.

For organic TADF emitters, the onset of emission of a film with 10% by weight of host in poly(methyl methacrylate) (PMMA), which corresponds to the energy of the first excited singlet state S1, is used as $E^{gap}$, unless stated otherwise.

For host compounds, the energy of the first excited triplet state T1 is determined from the onset of the time-gated emission spectrum at 77 K, typically with a delay time of 1 ms and an integration time of 1 ms, if not otherwise stated measured in a film of poly(methyl methacrylate) (PMMA) with 10% by weight of host.

For emitter compounds, e.g., NRCT emitters and fluorescence emitters, the energy of the first excited triplet state T1 is determined from the onset of the time-gated emission spectrum at 77 K, typically with a delay time of 1 ms and an integration time of 1 ms, if not otherwise stated measured in a film of poly(methyl methacrylate) (PMMA) with 1% by weight of emitter.

For organic TADF emitters, the energy of the first excited triplet state T1 is determined from the onset of the time-gated emission spectrum at 77 K, typically with a delay time of 1 ms and an integration time of 1 ms, if not otherwise stated measured in a film of poly(methyl methacrylate) (PMMA) with 10% by weight of TADF compound.

For TADF compounds, the energy of the first excited triplet state T1 is determined from the onset of the time-gated emission spectrum at 77 K, typically with a delay time of 1 ms and an integration time of 1 ms.

In the electron transport layer (ETL, any electron transporter may be used. Exemplarily, compounds poor of electrons such as, e.g., benzimidazoles, pyridines, triazoles, oxadiazoles (e.g., 1,3,4-oxadiazole), phosphinoxides and sulfone, may be used. Exemplarily, an electron transporter $ETM^D$ may also be a star-shaped heterocycle such as 1,3,5-tri(1-phenyl-1H-benzo[d]imidazol-2-yl)phenyl (TPBi). The $ETM^D$ may exemplarily be NBphen (2,9-bis(naphthalen-2-yl)-4,7-diphenyl-1,10-phenanthroline), Alq3 (Aluminum-tris(8-hydroxyquinoline)), TSPO1 (diphenyl triphenylsilylphenyl-phosphinoxide), BPyTP2 (2,7-di(2,2'-bipyridin-5-yl)triphenyle), Sif87 (dibenzo[b,d]thiophen-2-yltriphenylsilane), Sif88 (dibenzo[b,d]thiophen yl)diphenylsilane), BmPyPhB (1,3-bis[3,5-di(pyridin-3-yl) phenyl]benzene) and/or BTB (4,4'-bis-[2-(4,6-diphenyl-1,3,5-triazinyl)]-1,1'-biphenyl). Optionally, the electron transport layer may be doped with materials such as Liq (8-hydroxyquinolinolatolithium). Optionally, a second electron transport layer may be located between electron transport layer and the cathode layer C.

Adjacent to the electron transport layer (ETL), a cathode layer C may be located. Exemplarily, the cathode layer C may comprise or may consist of a metal (e.g., Al, Au, Ag, Pt, Cu, Zn, Ni, Fe, Pb, LiF, Ca, Ba, Mg, In, W, or Pd) or a metal alloy. For practical reasons, the cathode layer C may also consist of (essentially) intransparent metals such as Mg, Ca or Al. Alternatively or additionally, the cathode layer C may also comprise graphite and or carbon nanotubes (CNTs). Alternatively, the cathode layer C may also consist of nanoscale silver wires.

An OLED may further, optionally, comprise a protection layer between the electron transport layer (ETL) D and the cathode layer C (which may be designated as electron injection layer (EIL)). This layer may comprise lithium fluoride, caesium fluoride, silver, Liq (8-hydroxyquinolinolatolithium), $Li_2O$, $BaF_2$, MgO and/or NaF.

Accordingly, a further embodiment of the present invention relates to an OLED, which exhibits an external quantum efficiency at 1000 cd/$m^2$ of more than 10%, more preferably of more than 12%, more preferably of more than 15%, even more preferably of more than 17% or even more than 20% and/or exhibits an emission maximum between 490 nm and 570 nm, preferably between 500 nm and 560 nm, more preferably between 510 nm and 550 nm, even more preferably between 520 nm and 540 nm and/or exhibits a LT80 value at 500 cd/$m^2$ of more than 3000 h, preferably more than 6000 h, more preferably more than 12000 h, even more preferably more than 22500 h or even more than 30000 h.

Accordingly, a further embodiment of the present invention relates to an OLED, which exhibits an external quantum efficiency at 1000 cd/$m^2$ of more than 10%, more preferably of more than 12%, more preferably of more than 15%, even more preferably of more than 17% or even more than 20% and/or exhibits an emission maximum between 420 nm and 500 nm, preferably between 430 nm and 490 nm, more preferably between 440 nm and 480 nm, even more preferably between 450 nm and 470 nm and/or exhibits a LT80 value at 500 cd/$m^2$ of more than 100 h, preferably more than 200 h, more preferably more than 400 h, even more preferably more than 750 h or even more than 1000 h.

A further embodiment of the present invention relates to an OLED, which emits light at a distinct color point. According to the present invention, the OLED emits light with a narrow emission band (small full width at half maximum (FWHM)). In a preferred embodiment, the OLED according to the invention emits light with a FWHM of the main emission peak of below 0.43 eV, more preferably of below 0.39 eV, even more preferably of below 0.35 eV or even below 0.31 eV.

In a particularly preferred embodiment, the emitter material $S^B$ is a NRCT emitter and the OLED according to the invention emits light with a FWHM of the main emission peak of below 0.25 eV, more preferably of below 0.23 eV, even more preferably of below 0.21 eV or even below 0.20 eV.

A further embodiment of the present invention relates to an OLED, which emits light with CIEx and CIEy color coordinates close to the CIEx (=0.131) and CIEy (=0.046) color coordinates of the primary color blue (CIEx=0.131 and CIEy=0.046) as defined by ITU-R Recommendation BT.2020 (Rec. 2020) and thus is suited for the use in Ultra High Definition (UHD) displays, e.g. UHD-TVs. In commercial applications, typically top-emitting (top-electrode is transparent) devices are used, whereas test devices as used throughout the present application represent bottom-emitting devices (bottom-electrode and substrate are transparent). The CIEy color coordinate of a blue device can be reduced by up to a factor of two, when changing from a bottom- to a top-emitting device, while the CIEx remains nearly unchanged (Okinaka et al. doi:10.1002/sdtp.10480). Accordingly, a further embodiment of the present invention relates to an OLED, whose emission exhibits a CIEx color coordinate of between 0.02 and 0.30, preferably between 0.03 and 0.25, more preferably between 0.05 and 0.20 or even more preferably between 0.08 and 0.18 or even between 0.10 and 0.15 and/or a CIEy color coordinate of between 0.00 and 0.45, preferably between 0.01 and 0.30, more preferably between 0.02 and 0.20 or even more preferably between 0.03 and 0.15 or even between 0.04 and 0.10.

A further embodiment of the present invention relates to an OLED, which emits light with CIEx and CIEy color coordinates close to the CIEx (=0.170) and CIEy (=0.797) color coordinates of the primary color green (CIEx=0.170 and CIEy=0.797) as defined by ITU-R Recommendation BT.2020 (Rec. 2020) and thus is suited for the use in Ultra High Definition (UHD) displays, e.g. UHD-TVs. In this context, the term "close to" refers to the ranges of CIEx and CIEy coordinates provided at the end of this paragraph. In commercial applications, typically top-emitting (top-electrode is transparent) devices are used, whereas test devices as used throughout the present application represent bottom-emitting devices (bottom-electrode and substrate are transparent). The CIEy color coordinate of a blue device can be reduced by up to a factor of two, when changing from a bottom- to a top-emitting device, while the CIEx remains nearly unchanged (Okinaka et al. doi:10.1002/sdtp.10480). Accordingly, a further embodiment of the present invention relates to an OLED, whose emission exhibits a CIEx color coordinate of between 0.06 and 0.34, preferably between 0.07 and 0.29, more preferably between 0.09 and 0.24 or even more preferably between 0.12 and 0.22 or even between 0.14 and 0.19 and/or a CIEy color coordinate of between 0.75 and 1.20, preferably between 0.76 and 1.05, more preferably between 0.77 and 0.95 or even more preferably between 0.78 and 0.90 or even between 0.79 and 0.85.

A further embodiment of the present invention relates to an OLED, which emits light with CIEx and CIEy color coordinates close to the CIEx (=0.708) and CIEy (=0.292) color coordinates of the primary color red (CIEx=0.708 and CIEy=0.292) as defined by ITU-R Recommendation BT.2020 (Rec. 2020) and thus is suited for the use in Ultra High Definition (UHD) displays, e.g. UHD-TVs. In this context, the term "close to" refers to the ranges of CIEx and CIEy coordinates provided at the end of this paragraph. In commercial applications, typically top-emitting (top-electrode is transparent) devices are used, whereas test devices as used throughout the present application represent bottom-emitting devices (bottom-electrode and substrate are transparent). The CIEy color coordinate of a blue device can be reduced by up to a factor of two, when changing from a bottom- to a top-emitting device, while the CIEx remains nearly unchanged (Okinaka et al. doi:10.1002/sdtp.10480). Accordingly, a further embodiment of the present invention relates to an OLED, whose emission exhibits a CIEx color coordinate of between 0.60 and 0.88, preferably between 0.61 and 0.83, more preferably between 0.63 and 0.78 or even more preferably between 0.66 and 0.76 or even between 0.68 and 0.73 and/or a CIEy color coordinate of between 0.25 and 0.70, preferably between 0.26 and 0.55, more preferably between 0.27 and 0.45 or even more preferably between 0.28 and 0.40 or even between 0.29 and 0.35.

As used throughout the present application, the terms "aryl" and "aromatic" may be understood in the broadest sense as any mono-, bi- or polycyclic aromatic moieties. If not otherwise indicated, an aryl may also be optionally substituted by one or more substituents which are exemplified further throughout the present application. Accordingly, the term "arylene" refers to a divalent residue that bears two binding sites to other molecular structures and thereby serving as a linker structure. As used throughout the present application, the terms "heteroaryl" and "heteroaromatic" may be understood in the broadest sense as any mono-, bi- or polycyclic heteroaromatic moieties that include at least one heteroatom, in particular which bear from one to three heteroatoms per aromatic ring.

Exemplarily, a heteroaromatic compound may be pyrrole, furan, thiophene, imidazole, oxazole, thiazole, triazole, pyrazole, pyridine, pyrazine and pyrimidine, and the like. If not otherwise indicated, a heteroaryl may also be optionally substituted by one or more substituents which are exemplified further throughout the present application. Accordingly, the term "heteroarylene" refers to a divalent residue that bears two binding sites to other molecular structures and thereby serving as a linker structure.

As used throughout the present application, the term "alkyl" may be understood in the broadest sense as both, linear or branched chain alkyl residue. Preferred alkyl residues are those containing from one to fifteen carbon atoms. Exemplarily, an alkyl residue may be methyl, ethyl, propyl, isopropyl, butyl, isobutyl, tert-butyl, and the like. If not otherwise indicated, an alkyl may also be optionally substituted by one or more substituents which are exemplified further throughout the present application. Accordingly, the term "alkylene" refers to a divalent residue that bears two binding sites to other molecular structures and thereby serving as a linker structure.

If not otherwise indicated, as used herein, in particular in the context of aryl, arylene, heteroaryl, alkyl and the like, the term "substituted" may be understood in the broadest sense. Preferably, such substitution means a residue selected from the group consisting of $C_1$-$C_{20}$-alkyl, $C_7$-$C_{19}$-alkaryl, and $C_6$-$C_{18}$-aryl. Accordingly, preferably, no charged moiety, more preferably no functional group is present in such substitution.

It will be noticed that hydrogen can, at each occurrence, be replaced by deuterium.

Unless otherwise specified, any of the layers of the various embodiments may be deposited by any suitable method. The layers in the context of the present invention, including the light-emitting layer B, may optionally be prepared by means of liquid processing (also designated as "film processing", "fluid processing", "solution processing" or "solvent processing"). This means that the components comprised in the respective layer are applied to the surface of a part of a device in liquid state. Preferably, the layers in the context of the present invention, including the light-emitting layer B, may be prepared by means of spin-coating. This method well-known to those skilled in the art allows obtaining thin and (essentially) homogeneous layers.

Alternatively, the layers in the context of the present invention, including the light-emitting layer B, may be prepared by other methods based on liquid processing such as, e.g., casting (e.g., drop-casting) and rolling methods, and printing methods (e.g., inkjet printing, gravure printing, blade coating). This may optionally be carried out in an inert atmosphere (e.g., in a nitrogen atmosphere).

In another preferred embodiment, the layers in the context of the present invention may be prepared by any other method known in the art, including but not limited to vacuum processing methods well-known to those skilled in the art such as, e.g., thermal (co-)evaporation, organic vapor phase deposition (OVPD), and deposition by organic vapor jet printing (OVJP).

When preparing layers by means of liquid processing, the solutions including the components of the layers (i.e., with respect to the light-emitting layer B of the present invention, at least one host compound $H^B$ and, typically, at least one first TADF material $E^B$, at least one second TADF material $S^B$ and optionally one or more other host compounds $H^{B2}$) may further comprise a volatile organic solvent. Such volatile organic solvent may optionally be one selected from the group consisting of tetrahydrofuran, dioxane, chlorobenzene, diethylene glycol diethyl ether, 2-(2-ethoxyethoxy) ethanol, gamma-butyrolactone, N-methyl pyrrolidinon, ethoxyethanol, xylene, toluene, anisole, phenetol, acetonitrile, tetrahydrothiophene, benzonitrile, pyridine, trihydrofuran, triarylamine, cyclohexanone, acetone, propylene carbonate, ethyl acetate, benzene and PGMEA (propylen glycol monoethyl ether acetate). Also a combination of two or more solvents may be used. After applied in liquid state, the layer may subsequently be dried and/or hardened by any means of the art, exemplarily at ambient conditions, at increased temperature (e.g., about 50° C. or about 60° C.) or at diminished pressure.

Optionally, an organic electroluminescent device (e.g., an OLED) may exemplarily be an essentially white organic electroluminescent device or a blue organic electroluminescent device. Exemplarily such white organic electroluminescent device may comprise at least one (deep) blue emitter compound (e.g., TADF material $E^B$) and one or more emitter compounds emitting green and/or red light. Then, there may also optionally be energy transmittance between two or more compounds as described above.

The organic electroluminescent device as a whole may also form a thin layer of a thickness of not more than 5 mm, more than 2 mm, more than 1 mm, more than 0.5 mm, more than 0.25 mm, more than 100 μm, or more than 10 μm.

An organic electroluminescent device (e.g., an OLED) may be a small-sized (e.g., having a surface not larger than 5 $mm^2$, or even not larger than 1 $mm^2$), medium-sized (e.g., having a surface in the range of 0.5 to 20 $cm^2$), or a large-sized (e.g., having a surface larger than 20 $cm^2$). An organic electroluminescent device (e.g., an OLED) according to the present invention may optionally be used for generating screens, as large-area illuminating device, as luminescent wallpaper, luminescent window frame or glass, luminescent label, luminescent poser or flexible screen or display. Next to the common uses, an organic electroluminescent device (e.g., an OLED) may exemplarily also be used as luminescent films, "smart packaging" labels, or innovative design elements. Further they are usable for cell detection and examination (e.g., as bio labelling).

One of the main purposes of an organic electroluminescent device is the generation of light. Thus, the present invention further relates to a method for generating light of a desired wavelength range, comprising the step of providing an organic electroluminescent device according to any the present invention.

Accordingly, a further aspect of the present invention relates to a method for generating light of a desired wavelength range, comprising the steps of (i) providing an organic electroluminescent device according to the present invention; and
(ii) applying an electrical current to said organic electroluminescent device.

A further aspect of the present invention relates to a process of making the organic electroluminescent devices by assembling the elements described above. The present invention also relates to a method for generating blue, green, yellow, orange, red or white light, in particular blue or white light by using said organic electroluminescent device. The invention is illustrated by the examples and claims.

EXAMPLES

Cyclic Voltammetry

Cyclic voltammograms of solutions having concentration of 10-3 mol/l of the organic molecules in dichloromethane or a suitable solvent and a suitable supporting electrolyte (e.g. 0.1 mol/l of tetrabutylammonium hexafluorophosphate) are measured. The measurements are conducted at room temperature and under nitrogen atmosphere with a three-electrode assembly (Working and counter electrodes: Pt wire, reference electrode: Pt wire) and calibrated using $FeCp_2/FeCp_2^+$ as internal standard. HOMO data was corrected using ferrocene as internal standard against SCE.

Density Functional Theory Calculation

Molecular structures are optimized employing the BP86 functional and the resolution of identity approach (RI). Excitation energies are calculated using the (BP86) optimized structures employing Time-Dependent DFT (TD-DFT) methods. Orbital and excited state energies are calculated with the B3LYP functional. Def2-SVP basis sets (and a m4-grid for numerical integration were used. The Turbomole program package was used for all calculations.

Photophysical Measurements

Sample Preparation of host material and organic TADF emitters:

Stock solution 1: 10 mg of sample (organic TADF material or host material) is dissolved in 1 ml of solvent.

Stock solution 2: 10 mg of PMMA is dissolved in 1 ml solvent.

The solvent is typically selected from toluene, chlorobenzene, dichloromethane and chloroform.

An Eppendorf pipette is used to add 1 ml of stock solution 1 to 9 ml of stock solution 2 to achieve a 10% by weight of sample in PMMA.

Alternatively, the photophysical properties of host material can be characterized in neat films of host material.

Sample Preparation of fluorescence emitters and NRCT emitters:

Stock solution 1: 10 mg of sample (fluorescence emitters and NRCT emitters) is dissolved in 1 ml of solvent.

Stock solution 1a: 9 ml of solvent is added to 1 ml of stock solution 1.

Stock solution 2: 10 mg of PMMA is dissolved in 1 ml solvent.

The solvent is typically selected from toluene, chlorobenzene, dichloromethane and chloroform.

An Eppendorf pipette is used to add 1 ml of stock solution 1 to 9.9 ml of stock solution 2 to achieve a 1% by weight of sample in PMMA.

Alternatively, the photophysical properties of fluorescence emitters can be characterized in solution, wherein a concentration of 0.001 mg/ml of fluorescence emitter in solution is used.

Sample pretreatment: Spin-coating

Apparatus: Spin150, SPS euro.

Program: 1) 3 s at 400 U/min; 20 s at 1000 U/min at 1000 Upm/s. 3) 10 s at 4000 U/min at 1000 Upm/s. After coating, the films are dried at 70° C. for 1 min. Photoluminescence spectroscopy and TCSPC (Time-correlated single-photon counting)

Steady-state emission spectroscopy is recorded using a Horiba Scientific, Modell FluoroMax-4 equipped with a 150 W Xenon-Arc lamp, excitation- and emissions monochromators and a Hamamatsu R928 photomultiplier and a time-correlated single-photon counting option. Emissions and excitation spectra are corrected using standard correction fits.

Excited state lifetimes are determined employing the same system using the TCSPC method with FM-2013 equipment and a Horiba Yvon TCSPC hub.

Excitation Sources:

NanoLED 370 (wavelength: 371 nm, puls duration: 1.1 ns)

NanoLED 290 (wavelength: 294 nm, puls duration: <1 ns)

SpectraLED 310 (wavelength: 314 nm)

SpectraLED 355 (wavelength: 355 nm).

Data analysis (exponential fit) was done using the software suite DataStation and DAS6 analysis software. The fit is specified using the chi-squared-test.

Photoluminescence Quantum Yield Measurements

For photoluminescence quantum yield (PLQY) measurements an Absolute PL Quantum Yield Measurement C9920-03G system (Hamamatsu Photonics) is used. Quantum yields and CIE coordinates were determined using the software U6039-05 version 3.6.0.

Emission maxima are given in nm, quantum yields ϕ in % and CIE coordinates as x,y values.

PLQY was determined using the following protocol:

1) Quality assurance: Anthracene in ethanol (known concentration) is used as reference
2) Excitation wavelength: the absorption maximum of the organic molecule is determined and the molecule is excited using this wavelength
3) Measurement Quantum yields are measured for sample of solutions or films under nitrogen atmosphere. The yield is calculated using the equation:

$$\Phi_{PL} = \frac{n_{phocon},\text{ emited}}{n_{phocon},\text{ absorbed}} = \frac{\int \frac{\lambda}{hc}\left[Int_{emitted}^{sample}(\lambda) - Int_{absorbed}^{sample}(\lambda)\right]d\lambda}{\int \frac{\lambda}{hc}\left[Int_{emitted}^{reference}(\lambda) - Int_{absorbed}^{reference}(\lambda)\right]d\lambda}$$

wherein $n_{photon}$ denotes the photon count and Int. is the intensity.

Production and Characterization of Organic Electroluminescence Devices

Via vacuum-deposition methods OLED devices comprising organic molecules according to the invention can be produced. If a layer contains more than one compound, the weight-percentage of one or more compounds is given in %. The total weight-percentage values amount to 100%, thus if a value is not given, the fraction of this compound equals to the difference between the given values and 100%.

The not fully optimized OLEDs are characterized using standard methods and measuring electroluminescence spectra, the external quantum efficiency (in %) in dependency on the intensity, calculated using the light detected by the photodiode, and the current. The OLED device lifetime is extracted from the change of the luminance during operation at constant current density, which is given in $mA/cm^2$. The LT50 value corresponds to the time, where the measured luminance decreased to 50% of the initial luminance, analogously LT80 corresponds to the time point, at which the measured luminance decreased to 80% of the initial luminance, LT97 to the time point, at which the measured luminance decreased to 97% of the initial luminance etc.

Accelerated lifetime measurements are performed (e.g. applying increased current densities). Exemplarily LT80 values at 500 $cd/m^2$ are determined using the following equation:

$$LT80\left(500\frac{cd^2}{m^2}\right) = LT80(L_0)\left(\frac{L_0}{500\frac{cd^2}{m^2}}\right)^{1.6}$$

wherein $L_0$ denotes the initial luminance at the applied current density.
The values correspond to the average of several pixels (typically two to eight), the standard deviation between these pixels is given. Figures show the data series for one OLED pixel.
Examples D1 and D2 and Comparative Example C1
TADF1
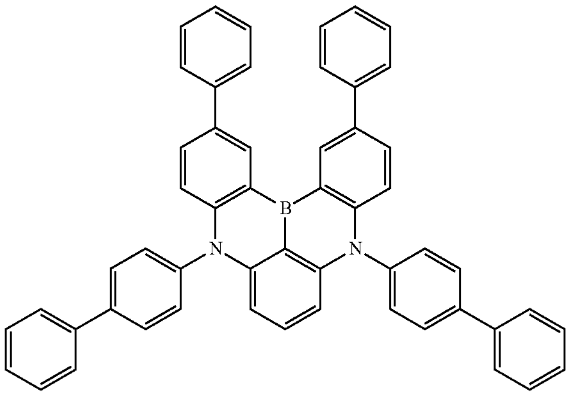
TADF2
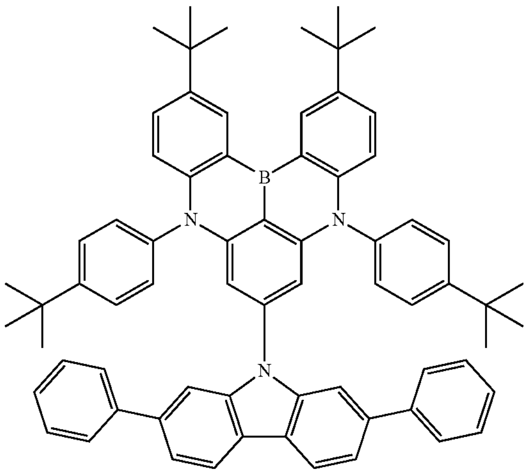
-continued
TADF3
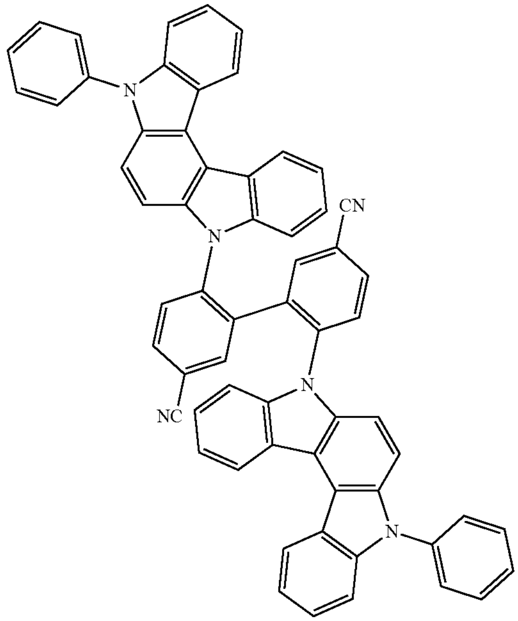
TADF4
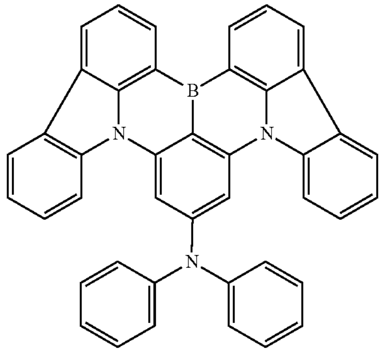
TADF5
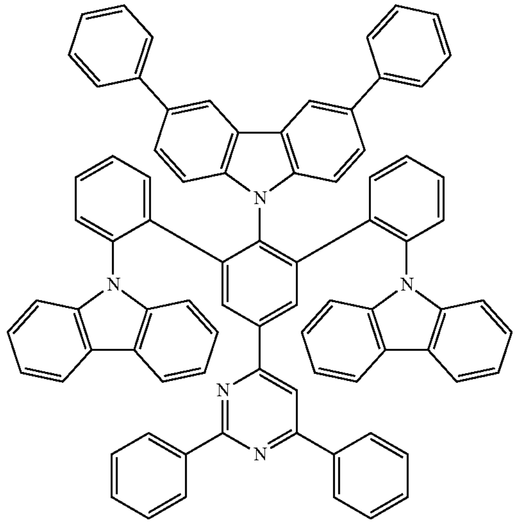

-continued

TADF6

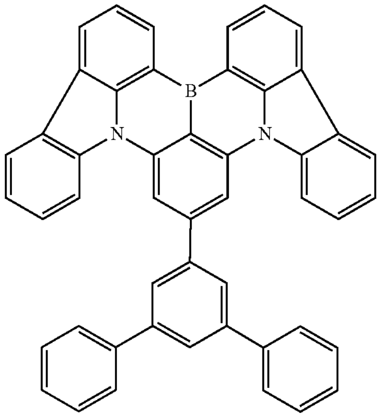

Emitter1

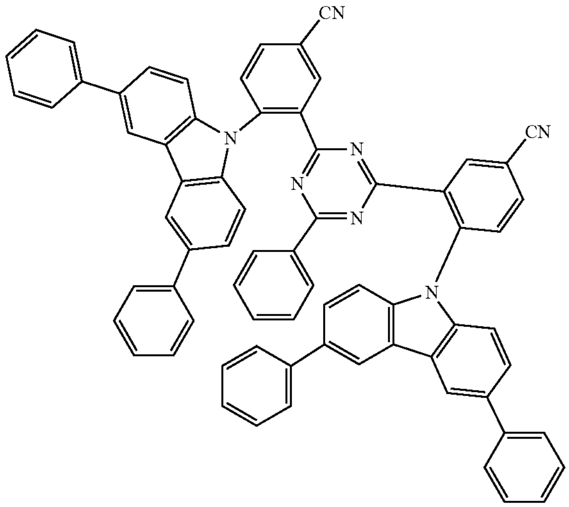

Emitter2

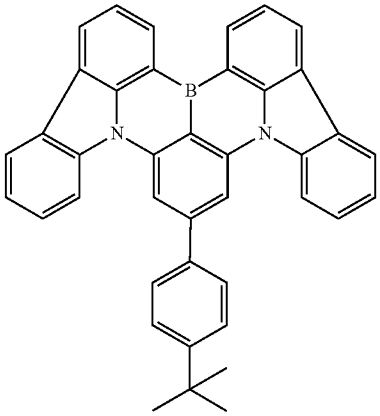

-continued

HBL1

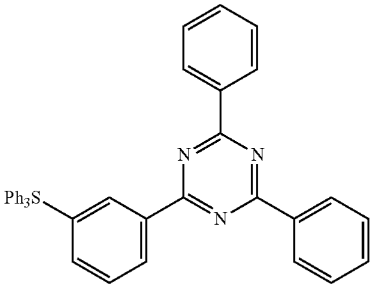

TABLE 1

| Physicochemical properties of the ingredients | | | | |
|---|---|---|---|---|
| | $E^{HOMO}$ [eV] | $E^{LUMO}$ [eV] | S1 [eV] | T1 [eV] |
| mCBP ($H^B$) | −6.02 | −2.42 | 3.60 | 2.82 |
| TADF1 ($E^B$) | −5.48 | −2.73 | 2.75 | 2.59 |
| TADF2 ($E^B$) | −5.45 | −2.63 | 2.82 | |
| TADF3 ($E^B$) | −5.55 | −2.69 | 2.86 | |
| TADF4 ($E^B$) | −5.72 | −2.95 | 2.77 | 2.60 |
| TADF5 ($E^B$) | −5.66 | −2.69 | 2.97 | |
| TADF6 ($E^B$) | −5.85 | −3.20 | 2.65 | 2.51 |
| Emitter1 ($S^B$) | −5.99 | −3.35 | 2.64 | |
| Emitter2 ($S^B$) | −5.79 | −3.12 | 2.67 | |

TABLE 2

| Examples of setups of devices | | | | |
|---|---|---|---|---|
| Layer | Thickness | D1 | D2 | C1 |
| 10 | 100 nm | Al | Al | Al |
| 9 | 2 nm | Liq | Liq | Liq |
| 8 | 20 nm | NBPhen | NBPhen | NBPhen |
| 7 | 10 nm | HBL1 | HBL1 | HBL1 |
| 6 | 50 nm | TADF1 (1%):Emitter1 (15%):mCBP (84%) | TADF2 (1%):Emitter1 (15%):mCBP (84%) | Emitter1 (15%):mCBP (85%) |
| 5 | 10 nm | mCBP | mCBP | mCBP |
| 4 | 10 nm | TCTA | TCTA | TCTA |
| 3 | 40 nm | NPB | NPB | NPB |
| 2 | 5 nm | HAT-CN | HAT-CN | HAT-CN |
| 1 | 50 nm | ITO | ITO | ITO |
| substrate | | glass | glass | glass |

Device D1 yielded an external quantum efficiency (EQE) at 1000 cd/m$^2$ of 16.7% LT80 value at 15 mA/cm$^2$ was determined to be 558 h. The emission maximum is at 519 nm at 10 mA/cm$^2$. The corresponding CIEx value is 0.314 and CIEy is 0.589.

Device D2 yielded an external quantum efficiency (EQE) at 1000 cd/m$^2$ of 15.1% LT80 value at 15 mA/cm$^2$ was determined to be 264 h. The emission maximum is at 518 nm at 10 mA/cm$^2$. The corresponding CIEx value is 0.301 and CIEy is 0.596.

Comparative device C1 comprises the same layer arrangement as device D1, except that the emitting layer contains only Emitter1 and mCBP. The EQE at 1000 cd/m$^2$ is 14.5% and the lifetime LT80 value at 15 mA/cm$^2$ was determined to be 111 h. The emission maximum is at 516 nm at 10 mA/cm$^2$. The corresponding CIEx value is 0.293 and CIEy is 0.596.

In a direct comparison of device D1 and Comparative device C1, an increased LT80 value at 15 mA/cm$^2$ by a factor 5.03 and an increased external quantum efficiency at 1000 cd/$m^2$ by a factor of 1.15 can be observed.

In a direct comparison of device D2 and Comparative device C1, an increased LT80 value at 15 mA/$cm^2$ by a factor 2.38 and an increased external quantum efficiency at 1000 cd/$m^2$ by a factor of 1.04 can be observed.

Additional Material Properties

TADF1

The emission maximum of TADF1 (1% by weight in PMMA) is at 469 nm, the full width at half maximum (FWHM) is 0.16 eV, the CIEy coordinate is 0.16 and the PLQY is 80%.

TADF2

The emission maximum of TADF2 (1% by weight in PMMA) is at 447 nm, the full width at half maximum (FWHM) is 0.14 eV, the CIEy coordinate is 0.04 and the PLQY is 93%.

TADF3

The emission maximum of TADF3 (10% by weight in PMMA) is at 482 nm, the full width at half maximum (FWHM) is 0.40 eV, the CIEy coordinate is 0.32 and the PLQY is 70%.

TADF4

The emission maximum of TADF4 (1% by weight in PMMA) is at 470 nm, the full width at half maximum (FWHM) is 0.20 eV, the CIEy coordinate is 0.18 and the PLQY is 83%.

TADF5

The emission maximum of TADF5 (10% by weight in PMMA) is at 464 nm, the full width at half maximum (FWHM) is 0.41 eV, the CIEy coordinate is 0.18 and the PLQY is 71%.

TADF6

The emission maximum of TADF6 (1% by weight in PMMA) is at 496 nm, the full width at half maximum (FWHM) is 0.24 eV, the CIEy coordinate is 0.52.

Emitter1

The emission maximum of Emitter1 (10% by weight in PMMA) is at 521 nm, the CIEy coordinate is 0.56 and the PLQY is 59%.

Emitter2

The emission maximum of Emitter1 (1% by weight in PMMA) is at 490 nm, the CIEy coordinate is 0.46 and the PLQY is 88%.

Example D3 and Comparative Example C2

TABLE 3

Examples of setups of devices

| Layer | Thickness | D3 | C2 |
|---|---|---|---|
| 10 | 100 nm | Al | Al |
| 9 | 2 nm | Liq | Liq |
| 8 | 20 nm | NBPhen | NBPhen |
| 7 | 10 nm | HBL1 | HBL1 |
| 6 | 50 nm | TADF1 (1%):Emitter2 (3%):mCBP (96%) | Emitter2 (3%):mCBP (97%) |
| 5 | 10 nm | mCBP | mCBP |
| 4 | 10 nm | TCTA | TCTA |
| 3 | 40 nm | NPB | NPB |
| 2 | 5 nm | HAT-CN | HAT-CN |
| 1 | 50 nm | ITO | ITO |
| substrate | | glass | glass |

Device Results

TABLE 4

Device Results for D3 and C2

| Device | EQE at 1000 cd/$m^2$ | Relative lifetime value LT80 at 15 mA/$cm^2$ | Emission maximum at 10 mA/$cm^2$ | CIEx, CIEy |
|---|---|---|---|---|
| D2 | 9.2% | 2.69 | 492 nm | 0.127, 0.483 |
| C2 | 8.4% | 1.00 | 490 nm | 0.121, 0.468 |

In a direct comparison of device D3 and Comparative device C2, an increased LT80 value at 15 mA/$cm^2$ by a factor 2.69 and an increased external quantum efficiency at 1000 cd/$m^2$ by a factor of 1.09 can be observed.

Examples D4 and D5 and Comparative Example C3

TABLE 3

Examples of setups of devices

| Layer | Thickness | D4 | D5 | C3 |
|---|---|---|---|---|
| 10 | 100 nm | Al | Al | Al |
| 9 | 2 nm | Liq | Liq | Liq |
| 8 | 20 nm | NBPhen | NBPhen | NBPhen |
| 7 | 10 nm | HBL1 | HBL1 | HBL1 |
| 6 | 50 nm | $E^B$ (1%):Emitter1 (20%):mCBP (79%) | $E^B$ (5%):Emitter1 (20%):mCBP (75%) | Emitter1 (20%):mCBP (80%) |
| 5 | 10 nm | mCBP | mCBP | mCBP |
| 4 | 10 nm | TCTA | TCTA | TCTA |
| 3 | 40 nm | NPB | NPB | NPB |
| 2 | 5 nm | HAT-CN | HAT-CN | HAT-CN |
| 1 | 50 nm | ITO | ITO | ITO |
| substrate | | glass | glass | glass |

wherein different TADF material $E^B$ were measured in D4 and D5 as described in the following:

for D4-1 and D5-1, $E^B$ is TADF1, for D4-4 and D5-4, $E^B$ is TADF4, for D4-5 and D5-5, $E^B$ is TADF5.

Device Results

TABLE 4

Device Results for D4, D5 and C3

| Device | Relative EQE at 1000 cd/$m^2$ | Relative lifetime value LT80 at 15 mA/$cm^2$ | Emission maximum at 10 mA/$cm^2$ | CIEx, CIEy |
|---|---|---|---|---|
| D4-1 | 1.13 | 3.66 | 524 nm | 0.324, 0.595 |
| D4-4 | 1.21 | 1.65 | 522 nm | 0.309, 0.602 |
| D4-5 | 1.21 | 1.12 | 522 nm | 0.319, 0.604 |
| D5-1 | 1.01 | 3.51 | 532 nm | 0.346, 0.585 |
| D5-4 | 1.01 | 1.05 | 522 nm | 0.316, 0.598 |
| D5-5 | 1.23 | 1.14 | 522 nm | 0.316, 0.604 |
| C3 | 1.00 | 1.00 | 520 nm | 0.317, 0.604 |

In a direct comparison of devices D4 (i.e., D4-1, D4-4, and D4-5) and D5 (i.e. D5-1, D5-4, and D5-5) to Comparative device C3, a distinct increase of the LT80 values at 15 mA/$cm^2$ for D4-1, D4-4, D4-5, D5-1, and D5-5 can be observed. Additionally, a distinct increase in external quantum efficiency at 1000 cd/$m^2$ can be observed for D4-1, D4-4, D4-5, and D5-5 compared to C3.

The invention claimed is:

1. An organic electroluminescent device comprising a light-emitting layer B comprising:

(i) a host material $H^B$, which has a lowermost excited singlet state energy level $S1^H$, a lowermost excited triplet state energy level $T1^H$, and a highest occupied molecular orbital $HOMO(H^B)$ having an energy $E^{HOMO}(H^B)$;

(ii) a first thermally activated delayed fluorescence (TADF) material $E^B$, which has a lowermost excited singlet state energy level $S1^E$, a lowermost excited triplet state energy level $T1^E$, and a highest occupied molecular orbital $HOMO(E^B)$ having an energy $E^{HOMO}(E^B)$; and (iii) an emitter material $S^B$, which has a lowermost excited singlet state energy level $S1^S$ and a highest occupied molecular orbital $HOMO(S^B)$ having an energy $E^{HOMO}(S^B)$;

wherein the relations expressed by the following formulas (1) to (5) apply:

$$S1^H > S1^E \quad (1)$$

$$S1^H > S1^S \quad (2)$$

$$S1^E > S1^S \quad (3)$$

$$E^{HOMO}(E^B) > E^{HOMO}(S^B) \quad (4)$$

$$E^{HOMO}(E^B) > E^{HOMO}(H^B) \quad (5), \text{ and}$$

wherein the TADF material $E^B$ comprises a structure according to Formula I-NRCT Formula I-NRCT

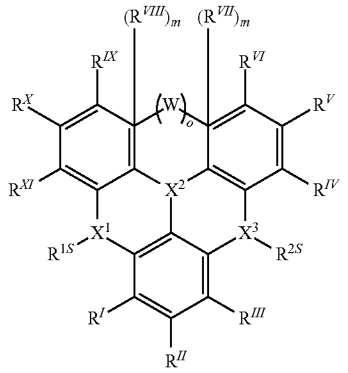

wherein:

o is 0 or 1;

m=1−o;

$X^1$ is N or B;

$X^2$ is N or B;

$X^3$ is N or B;

W is selected from the group consisting of $Si(R^{3S})_2$, $C(R^{3S})_2$, and $BR^{3S}$;

each of $R^{1S}$, $R^{2S}$, and $R^{3S}$ is independently from each other selected from the group consisting of:

$C_1$-$C_5$-alkyl,
which is optionally substituted with one or more substituents $R^{6S}$;

$C_6$-$C_{60}$-aryl,
which is optionally substituted with one or more substituents $R^{6S}$; and $C_3$-$C_{57}$-heteroaryl,
which is optionally substituted with one or more substituents $R^{6S}$;

each of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ is independently from each other selected from the group consisting of:

hydrogen, deuterium, $N(R^{5S})_2$, $OR^{5S}$, $Si(R^{5S})_3$, $B(OR^{5S})_2$, $OSO_2R^{5S}$, $CF_3$, CN, halogen, $C_1$-$C_{40}$-alkyl,
which is optionally substituted with one or more substituents $R^{5S}$, and
wherein one or more non-adjacent $CH_2$-groups are each optionally substituted by $R^{5S}C{=}CR^{5S}$, C≡C, $Si(R^{5S})_2$, $Ge(R^{5S})_2$, $Sn(R^{5S})_2$, C═O, C═S, C═Se, $C{=}NR^{5S}$, $P({=}O)(R^{5S})$, SO, $SO_2$, $NR^{5S}$, O, S, or $CONR^{5S}$;

$C_1$-$C_{40}$-alkoxy,
which is optionally substituted with one or more substituents $R^{5S}$, and
wherein one or more non-adjacent $CH_2$-groups are each optionally substituted by $R^{5S}C{=}CR^{5S}$, C≡C, $Si(R^{5S})_2$, $Ge(R^{5S})_2$, $Sn(R^{5S})_2$, C═O, C═S, C═Se, $C{=}NR^{5S}$ $P({=}O)(R^{5S})$, SO, $SO_2$, $NR^{5S}$, O, S, or $CONR^{5S}$;

$C_1$-$C_{40}$-thioalkoxy,
which is optionally substituted with one or more substituents $R^{5S}$, and
wherein one or more non-adjacent $CH_2$-groups are each optionally substituted by $R^{5S}C{=}CR^{5S}$, C≡C, $Si(R^{5S})_2$, $Ge(R^{5S})_2$, $Sn(R^{5S})_2$, C═O, C═S, C═Se, $C{=}NR^{5S}$, $P({=}O)(R^{5S})$, SO, $SO_2$, $NR^{5S}$, O, S, or $CONR^{5S}$;

$C_2$-$C_{40}$-alkenyl,
which is optionally substituted with one or more substituents $R^{5S}$, and
wherein one or more non-adjacent $CH_2$-groups are each optionally substituted by $R^{5S}C{=}CR^{5S}$, C≡C, $Si(R^{5S})_2$, $Ge(R^{5S})_2$, $Sn(R^{5S})_2$, C═O, C═S, C═Se, $C{=}NR^{5S}$, $P({=}O)(R^{5S})$, SO, $SO_2$, $NR^{5S}$, O, S, or $CONR^{5S}$;

$C_2$-$C_{40}$-alkynyl,
which is optionally substituted with one or more substituents $R^{5S}$, and
wherein one or more non-adjacent $CH_2$-groups are each optionally substituted by $R^{5S}C{=}CR^{5S}$, C≡C, $Si(R^{5S})_2$, $Ge(R^{5S})_2$, $Sn(R^{5S})_2$, C═O, C═S, C═Se, $C{=}NR^{5S}$, $P({=}O)(R^{5S})$, SO, $SO_2$, $NR^{5S}$, O, S, or $CONR^{5S}$;

$C_6$-$C_{60}$-aryl,
which is optionally substituted with one or more substituents $R^{5S}$; and $C_3$-$C_{57}$-heteroaryl,
which is optionally substituted with one or more substituents $R^{5S}$;

$R^{5S}$ is at each occurrence independently from each other selected from the group consisting of: hydrogen, deuterium, OPh, $CF_3$, CN, F, $C_1$-$C_5$-alkyl,
wherein optionally one or more hydrogen atoms are independently from each other substituted by deuterium, CN, $CF_3$, or F;

$C_1$-$C_5$-alkoxy,
wherein optionally one or more hydrogen atoms are independently from each other substituted by deuterium, CN, $CF_3$, or F;

$C_1$-$C_5$-thioalkoxy,
wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-aryl$)_2$;

$N(C_3$-$C_{17}$-heteroaryl$)_2$; and $N(C_3$-$C_{17}$-heteroaryl$)(C_6$-$C_{18}$-aryl):

$R^{6S}$ is at each occurrence independently from each other selected from the group consisting of hydrogen, deuterium, OPh, $CF_3$, CN, F, $C_1$-$C_5$-alkyl, wherein optionally one or more hydrogen atoms are independently from each other substituted by deuterium, CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-aryl$)_2$;

$N(C_3$-$C_{17}$-heteroaryl$)_2$; and $N(C_3$-$C_{17}$-heteroaryl$)(C_6$-$C_{18}$-aryl);

wherein two or more of the substituents selected from the group consisting of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ that are positioned adjacent to another may optionally each form a mono- or polycyclic, aliphatic, aromatic, and/or benzo-fused ring system with another; and wherein at least one of $X^1$, $X^2$, and $X^3$ is B and at least one of $X^1$, $X^2$, and $X^3$ is N.

2. The organic electroluminescent device according to claim 1, wherein at least one of the following formulas (6) and (7) applies:

$$0.2\ eV \leq E^{HOMO}(E^B) - E^{HOMO}(S^B) \leq 0.8\ eV \quad (6)$$

$$0.2\ eV \leq E^{HOMO}(E^B) - E^{HOMO}(H^B) \leq 0.8\ eV \quad (7).$$

3. The organic electroluminescent device according to claim 1, wherein the TADF material $E^B$ has a $\Delta E_{ST}$ value, which corresponds to the energy difference between $S1^E$ and $T1^E$, of less than 0.4 eV.

4. The organic electroluminescent device according to claim 1, wherein the relation expressed by formula (8) applies:

$$S1^S > T1^E \quad (8).$$

5. The organic electroluminescent device according to claim 1, wherein the mass ratio of the emitter material $S^B$ to TADF material $E^B(S^B:E^B)$ is >1.

6. The organic electroluminescent device according to claim 1, wherein the organic electroluminescent device is selected from the group consisting of an organic light emitting diode, a light emitting electrochemical cell, and a light-emitting transistor.

7. The organic electroluminescent device according to claim 1, wherein the emitter material $S^B$ is selected from the group consisting of a fluorescence emitter and an organic TADF emitter, wherein the organic TADF emitter has a $\Delta E_{ST}$ value, which corresponds to the energy difference between $S1^S$ and $T1^S$, of less than 0.4 eV.

8. The organic electroluminescent device according to claim 1, wherein the relation expressed by formula (10a), (10b), or (10c) applies:

$$E^{HOMO}(H^B) > E^{HOMO}(S^B) \quad (10a)$$

$$E^{HOMO}(S^B) > E^{HOMO}(H^B) \quad (10b)$$

$$-0.1\ eV \leq E^{HOMO}(H^B) - E^{HOMO}(S^B) \leq 0.1\ eV \quad (10c).$$

9. The organic electroluminescent device according to claim 1, wherein the relation between a lowest unoccupied molecular orbital LUMO($E^B$) having an energy $E^{LUMO}(E^B)$ and a lowest unoccupied molecular orbital LUMO($S^B$) having an energy $E^{LUMO}(S^B)$, expressed by formula (11), applies:

$$E^{LUMO}(E^B) > E^{LUMO}(S^B) \quad (11).$$

10. The organic electroluminescent device according to claim 1, wherein the light-emitting layer B comprises:

(i) 39.8-98% by weight of the host compound $H^B$;

(ii) 0.1-50% by weight of the TADF material $E^B$; and (iii) 0.1-50% by weight of the emitter material $S^B$; and optionally (iv) 0-60% by weight of one or more further host compounds $H^{B2}$ differing from $H^B$; and optionally (v) 0-60% by weight of one or more solvents.

11. The organic electroluminescent device according to claim 1, wherein the light-emitting layer B comprises 0.1-10% by weight of the TADF material $E^B$.

12. The organic electroluminescent device according to claim 1, wherein the device exhibits an emission maximum $\lambda_{max}$(D) of 440 to 560 nm.

13. A method for generating visible light comprising the steps of:

(i) providing an organic electroluminescent device according to claim 1; and (ii) applying an electrical current to the organic electroluminescent device.

14. A thermally activated delayed fluorescence (TADF) material $E^B$ in combination with at least one host material $H^B$ and at least one emitter material $S^B$ in a light-emitting layer for increasing the lifetime of the organic electroluminescent device, wherein the TADF material $E^B$ comprises a structure according to Formula I-NRCT Formula I-NRCT

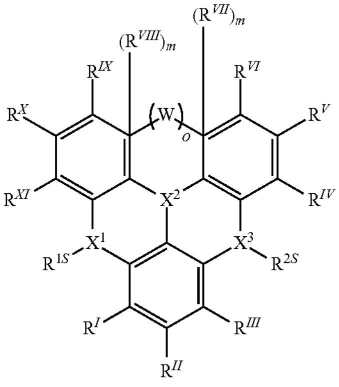

wherein:

o is 0 or 1;

m=1−o;

$X^1$ is N or B;

$X^2$ is N or B;

$X^3$ is N or B;

W is selected from the group consisting of $Si(R^{35})_2$, $C(R^{3S})_2$, and $BR^{3S}$;

each of $R^{1S}$, $R^{2S}$, and $R^{3S}$ is independently from each other selected from the group consisting of:

$C_1$-$C_5$-alkyl, which is optionally substituted with one or more substituents $R^{6S}$;

$C_6$-$C_{60}$-aryl, which is optionally substituted with one or more substituents $R^{6S}$; and $C_3$-$C_{57}$-heteroaryl, which is optionally substituted with one or more substituents $R^{6S}$, each of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ is independently from each other selected from the group consisting of:

hydrogen, deuterium, $N(R^{5S})_2$, $OR^{5S}$, $Si(R^{5S})_3$, $B(OR^{5S})_2$, $OSO_2R^{5S}$, $CF_3$, CN, halogen, $C_1$-$C_{40}$-alkyl, which is optionally substituted with one or more substituents $R^{5S}$, and wherein one or more non-adjacent $CH_2$-groups are each optionally substituted by $R^{5S}C{=}CR^{5S}$, C≡C, $Si(R^{5S})_2$, $Ge(R^{5S})_2$, $Sn(R^{5S})_2$, C═O, C═S, C═Se, C═$NR^{5S}$, P(═O)($R^{5S}$), SO, $SO_2$, $NR^{5S}$, O, S, or $CONR^{5S}$;

$C_1$-$C_{40}$-alkoxy, which is optionally substituted with one or more substituents $R^{5S}$, and wherein one or more non-adjacent $CH_2$-groups are each optionally substituted by $R^{5S}C{=}CR^{5S}$, C≡C, $Si(R^{5S})_2$, $Ge(R^{5S})_2$, $Sn(R^{5S})_2$, C═O, C═S, C═Se, C═$NR^{5S}$, P(═O)($R^{5S}$), SO, $SO_2$, $NR^{5S}$, O, S, or $CONR^{5S}$;

$C_1$-$C_{40}$-thioalkoxy, which is optionally substituted with one or more substituents $R^{5S}$, and wherein one or more non-adjacent $CH_2$-groups are each optionally substituted by $R^{5S}C{=}CR^{5S}$, C≡C, $Si(R^{5S})_2$, $Ge(R^{5S})_2$, $Sn(R^{5S})_2$, C═O, C═S, C═Se, C═$NR^{5S}$ P(═O)($R^{5S}$), SO, $SO_2$, $NR^{5S}$, O, S, or $CONR^{5S}$, $C_2$-$C_{40}$-alkenyl, which is optionally substituted with one or more substituents $R^{5S}$, and wherein one or more non-adjacent $CH_2$-groups are each optionally substituted by $R^{5S}C{=}CR^{5S}$, C≡C, $Si(R^{5S})_2$, $Ge(R^{5S})_2$, $Sn(R^{5S})_2$, C═O, C═S, C═Se, C═$NR^{5S}$ P(═O)($R^{5S}$), SO, $SO_2$, $NR^{5S}$, O, S, or $CONR^{5S}$;

$C_2$-$C_{40}$-alkynyl, which is optionally substituted with one or more substituents $R^{5S}$, and wherein one or more non-adjacent $CH_2$-groups are each optionally substituted by $R^{5S}C{=}CR^{5S}$, C≡C, $Si(R^{5S})_2$, $Ge(R^{5S})_2$, $Sn(R^{5S})_2$, C═O, C═S, C═Se, C═$NR^{5S}$, P(═O)($R^{5S}$), SO, $SO_2$, $NR^{5S}$, O, S, or $CONR^{5S}$;

$C_6$-$C_{60}$-aryl, which is optionally substituted with one or more substituents $R^{5S}$; and $C_3$-$C_{57}$-heteroaryl, which is optionally substituted with one or more substituents $R^{5S}$;

$R^{5S}$ is at each occurrence independently from each other selected from the group consisting of: hydrogen, deuterium, OPh, $CF_3$, CN, F, $C_1$-$C_5$-alkyl, wherein optionally one or more hydrogen atoms are independently from each other substituted by deuterium, CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F:

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents; $N(C_6$-$C_{18}$-aryl$)_2$;

$N(C_3$-$C_{17}$-heteroaryl$)_2$; and $N(C_3$-$C_{17}$-heteroaryl$)(C_6$-$C_{18}$-aryl$)$;

$R^{6S}$ is at each occurrence independently from each other selected from the group consisting of hydrogen, deuterium, OPh, $CF_3$, CN, F, $C_1$-$C_5$-alkyl, wherein optionally one or more hydrogen atoms are independently from each other substituted by deuterium, CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl,
wherein optionally one or more hydrogen atoms are independently from each other substituted by deuterium, CN, $CF_3$, or F;
$C_2$-$C_5$-alkynyl,
wherein optionally one or more hydrogen atoms are independently from each other substituted by deuterium, CN, $CF_3$, or F;
$C_6$-$C_{18}$-aryl,
which is optionally substituted with one or more $C_1$-$C_5$-alkyl substituents;
$C_3$-$C_{17}$-heteroaryl,
which is optionally substituted with one or more $C_1$-$C_5$-alkyl substituents;
$N(C_6$-$C_{18}$-aryl$)_2$;
$N(C_3$-$C_{17}$-heteroaryl$)_2$; and
$N(C_3$-$C_{17}$-heteroaryl$)(C_6$-$C_{18}$-aryl);
wherein two or more of the substituents selected from the group consisting of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ that are positioned adjacent to another may optionally each form a mono- or polycyclic, aliphatic, aromatic, and/or benzo-fused ring system with another; and
wherein at least one of $X^1$, $X^2$, and $X^3$ is B and at least one of $X^1$, $X^2$, and $X^3$ is N.

15. The TADF material $E^B$ in combination with at least one host material $H^B$ and at least one emitter material $S^B$ in a light-emitting layer of claim 14, wherein:

(i) the host material $H^B$ has a lowermost excited singlet state energy level $S1^H$, a lowermost excited triplet state energy level $T1^H$, and a highest occupied molecular orbital HOMO($H^B$) having an energy $E^{HOMO}(H^B)$;
(ii) a first thermally activated delayed fluorescence (TADF) material $E^B$, which has a lowermost excited singlet state energy level $S1^E$, a lowermost excited triplet state energy level $T1^E$, and a highest occupied molecular orbital HOMO($E^B$) having an energy $E^{HOMO}(E^B)$; and
(iii) the emitter material $S^B$ has a lowermost excited singlet state energy level $S1^S$ and a highest occupied molecular orbital HOMO($S^B$) having an energy $E^{HOMO}(S^B)$;

wherein the relations expressed by the following formulas (1) to (5) apply:

$$S1^H > S1^E \quad (1)$$

$$S1^H > S1^S \quad (2)$$

$$S1^E > S1^S \quad (3)$$

$$E^{HOMO}(E^B) > E^{HOMO}(S^B) \quad (4)$$

$$E^{HOMO}(E^B) > E^{HOMO}(H^B) \quad (5).$$

* * * * *